(12) United States Patent
Morisue et al.

(10) Patent No.: US 7,687,326 B2
(45) Date of Patent: Mar. 30, 2010

(54) SEMICONDUCTOR DEVICE AND MANUFACTURING METHOD THEREOF

(75) Inventors: Masafumi Morisue, Kanagawa (JP); Shinji Maekawa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/292,365

(22) Filed: Dec. 2, 2005

(65) Prior Publication Data

US 2006/0166411 A1 Jul. 27, 2006

(30) Foreign Application Priority Data

Dec. 17, 2004 (JP) .............................. 2004-366430

(51) Int. Cl.
*H01L 21/00* (2006.01)
*H01L 21/84* (2006.01)

(52) U.S. Cl. ..................................................... 438/149

(58) Field of Classification Search ................ 438/142, 438/149; 257/40, 59, 72
See application file for complete search history.

(56) References Cited

U.S. PATENT DOCUMENTS

| | | | |
|---|---|---|---|
| 4,618,552 A * | 10/1986 | Tanaka et al. ................... 430/60 |
| 6,043,145 A | 3/2000 | Suzuki et al. | |
| 6,218,257 B1 * | 4/2001 | Kita ............................. 438/396 |
| 6,309,957 B1 | 10/2001 | Tu et al. | |
| 6,376,353 B1 | 4/2002 | Zhou et al. | |
| 6,383,920 B1 | 5/2002 | Wang et al. | |
| 6,399,486 B1 | 6/2002 | Chen et al. | |
| 6,429,118 B1 | 8/2002 | Chen et al. | |
| 6,492,708 B2 | 12/2002 | Acosta et al. | |
| 6,514,855 B1 | 2/2003 | Suzuki et al. | |
| 6,720,230 B2 | 4/2004 | Acosta et al. | |
| 6,734,029 B2 | 5/2004 | Furusawa | |
| 6,753,249 B1 | 6/2004 | Chen et al. | |
| 6,897,433 B2 | 5/2005 | Itoh et al. | |
| 6,946,381 B2 | 9/2005 | Hwang | |

(Continued)

FOREIGN PATENT DOCUMENTS

JP 09-306988 11/1997

(Continued)

*Primary Examiner*—Kenneth A Parker
*Assistant Examiner*—Anthony Ho
(74) *Attorney, Agent, or Firm*—Nixon Peabody LLP; Jeffrey L. Costellia

(57) ABSTRACT

An object of the invention is to provide a semiconductor device and a display device which can be manufactured with improved material efficiency through a simplified manufacturing process, and a manufacturing method thereof. Another object is to provide a technique capable of forming a pattern such as a wiring included in the semiconductor device or display device in a desired shape with good controllability. One feature of a method for manufacturing a semiconductor device is to comprise the steps of forming a layer having a rough surface, forming a region having low wettability by a composition containing a conductive material and a region having high wettability by the composition over the rough surface, and forming a conductive material using the composition in the region having high wettability. Since regions having largely different wettability (regions having a large difference in wettability) can be formed, a liquid conductive or insulating material is attached only to a formation region with precision. Accordingly, a conductive or insulating layer can be precisely formed in a desired pattern.

12 Claims, 34 Drawing Sheets

U.S. PATENT DOCUMENTS

| | | |
|---|---|---|
| 7,064,060 B2 | 6/2006 | Misawa et al. |
| 2002/0130386 A1 | 9/2002 | Acosta et al. |
| 2003/0160235 A1* | 8/2003 | Hirai .......................... 257/40 |
| 2003/0174552 A1 | 9/2003 | Itoh et al. |
| 2004/0043334 A1* | 3/2004 | Kobayashi et al. .......... 430/315 |
| 2004/0196525 A1* | 10/2004 | Fujii et al. .................. 359/245 |
| 2005/0009327 A1* | 1/2005 | Yoshida et al. .............. 438/661 |
| 2006/0113671 A1 | 6/2006 | Isa et al. |
| 2006/0115982 A1 | 6/2006 | Morisue et al. |
| 2006/0115983 A1 | 6/2006 | Fujii et al. |
| 2006/0116000 A1 | 6/2006 | Yamamoto |

FOREIGN PATENT DOCUMENTS

| | | |
|---|---|---|
| JP | 11-251259 | 9/1999 |
| JP | 2001-179167 | 7/2001 |
| JP | 2001-332092 | 11/2001 |
| JP | 2002-164635 | 6/2002 |

* cited by examiner

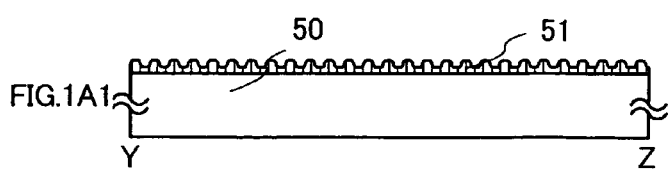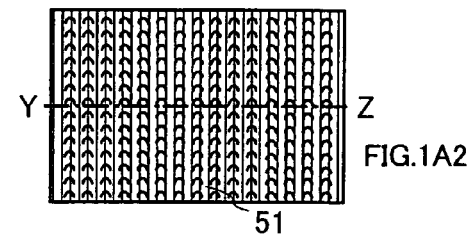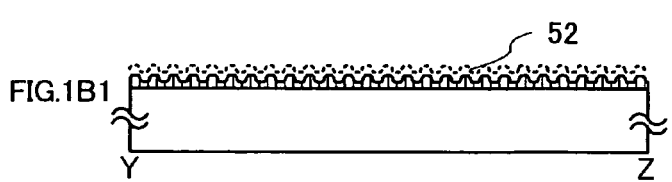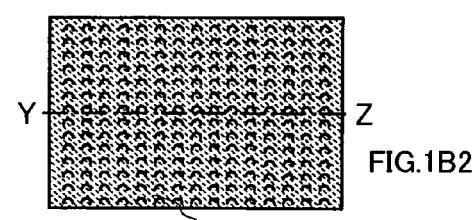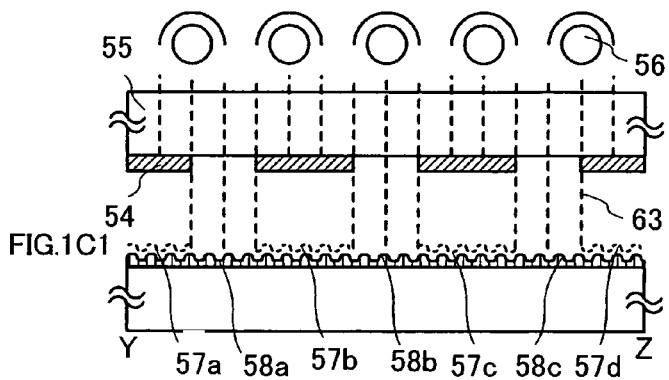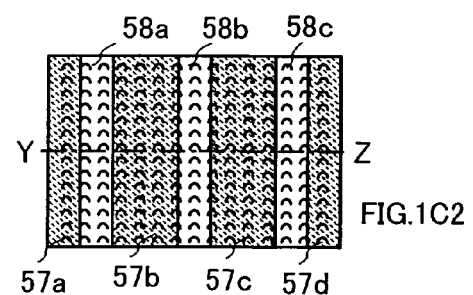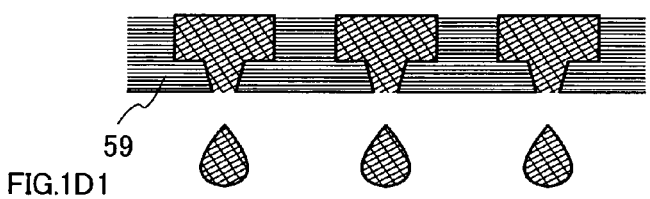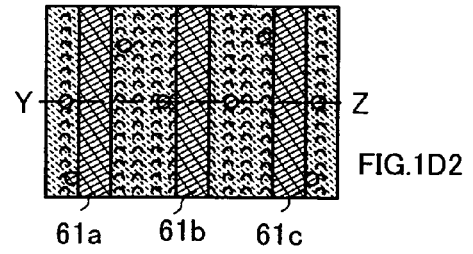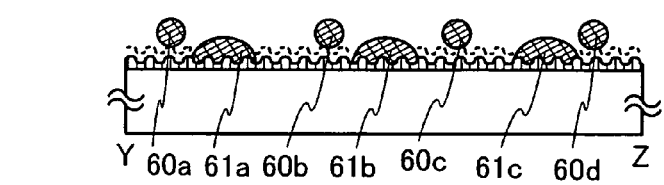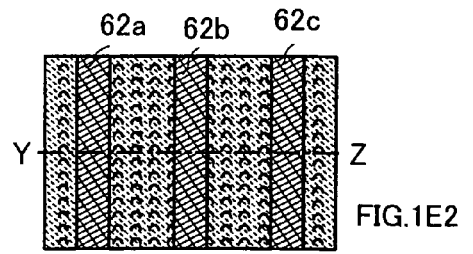

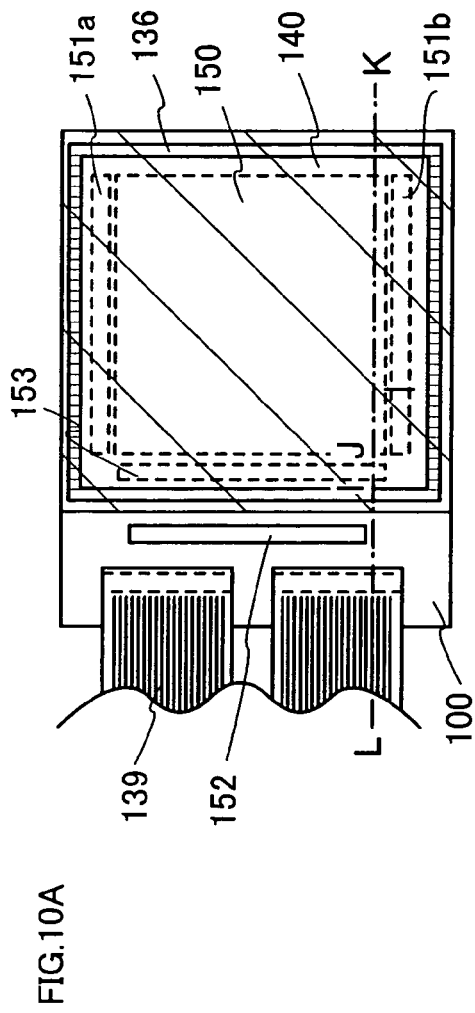
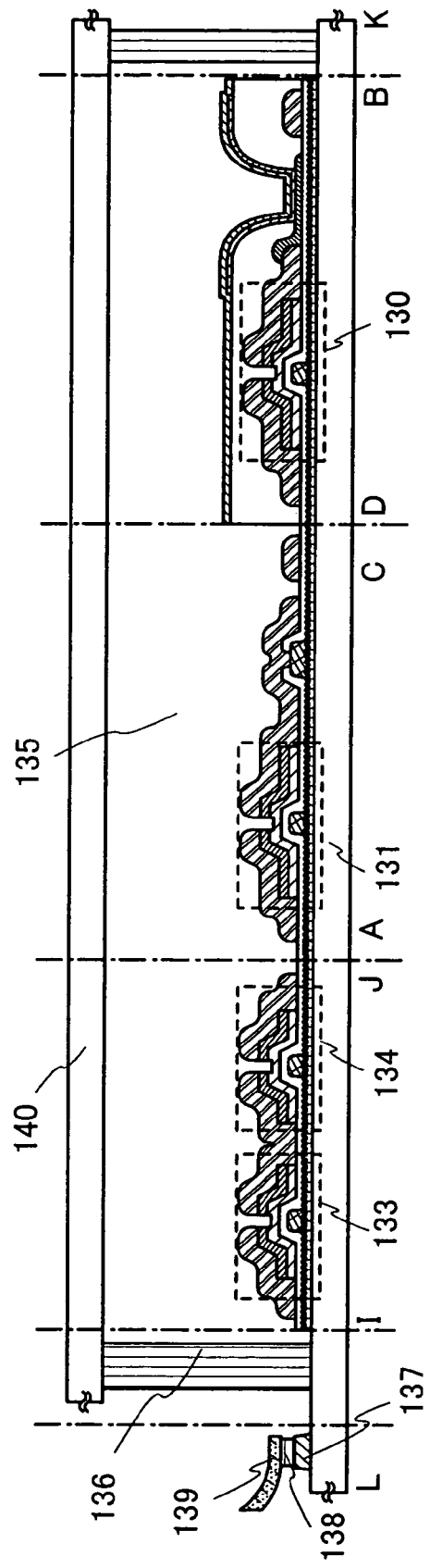
FIG.10A
FIG.10B

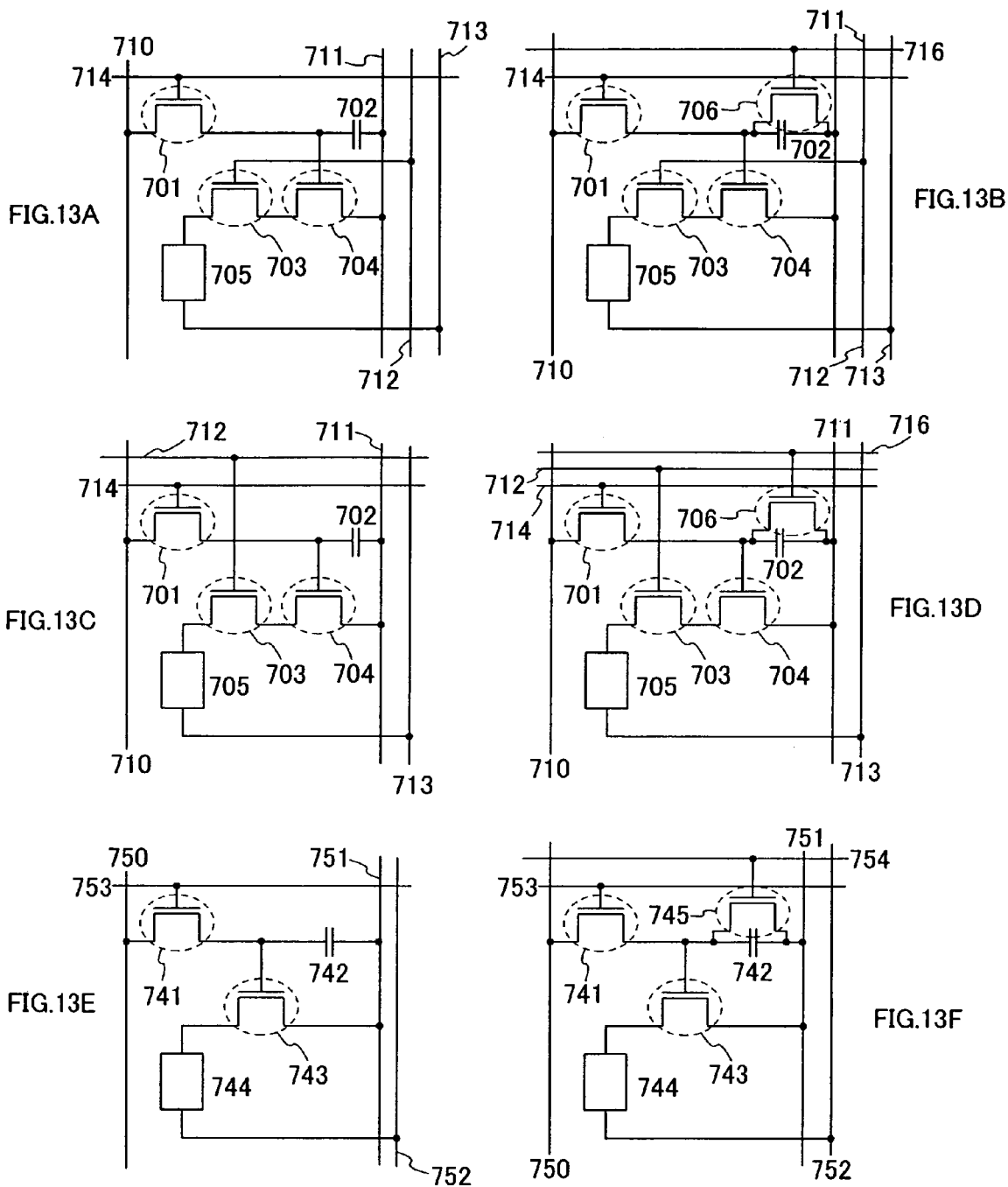

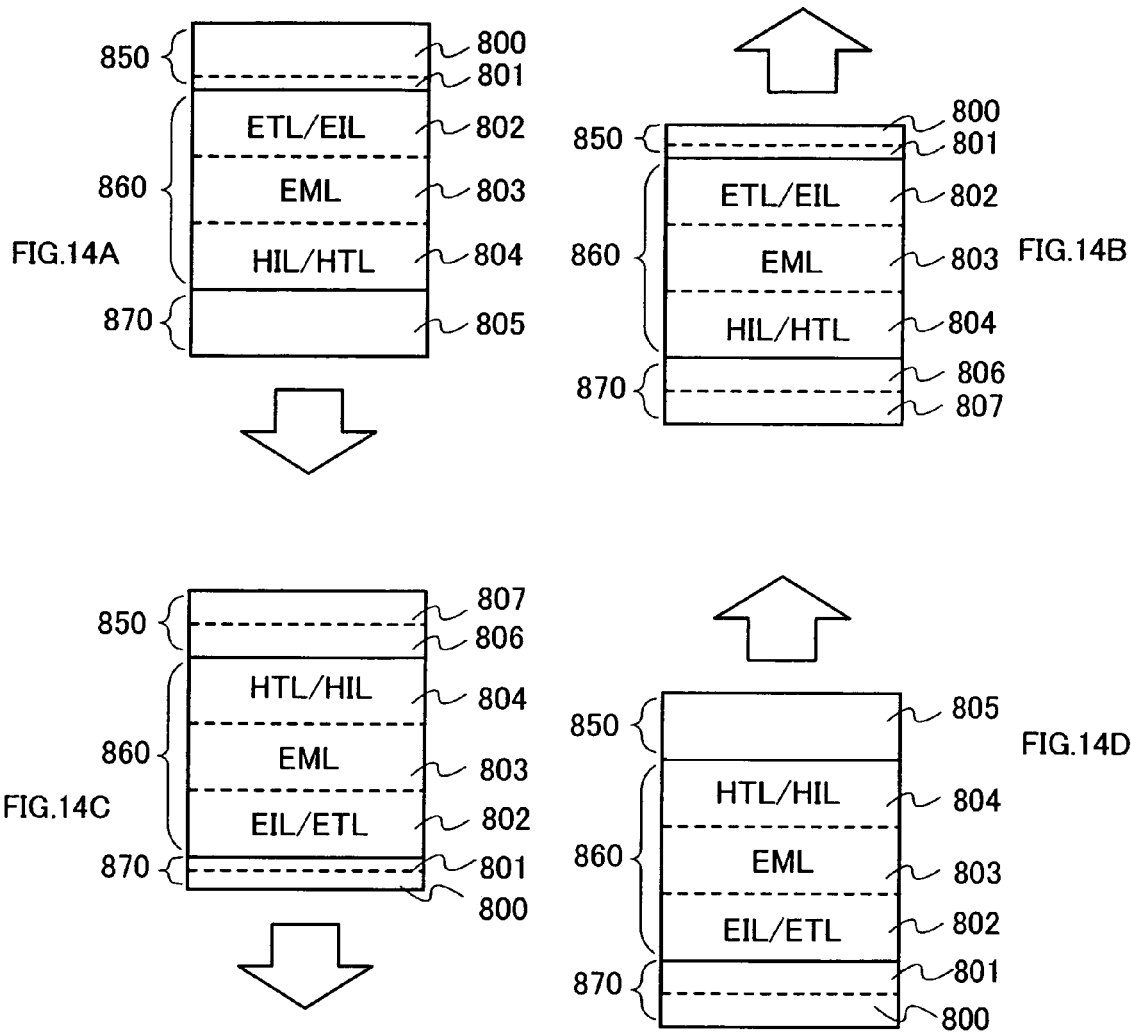

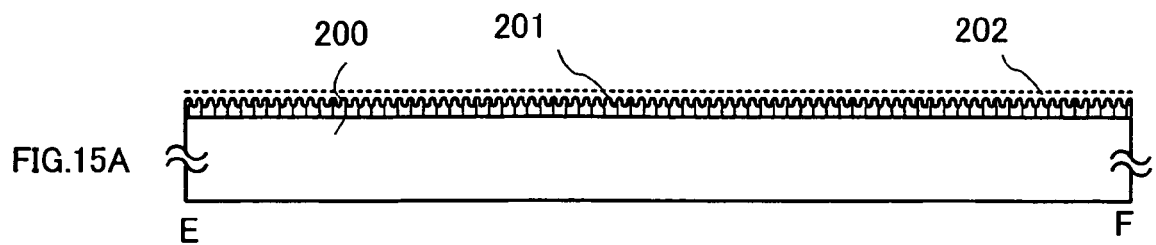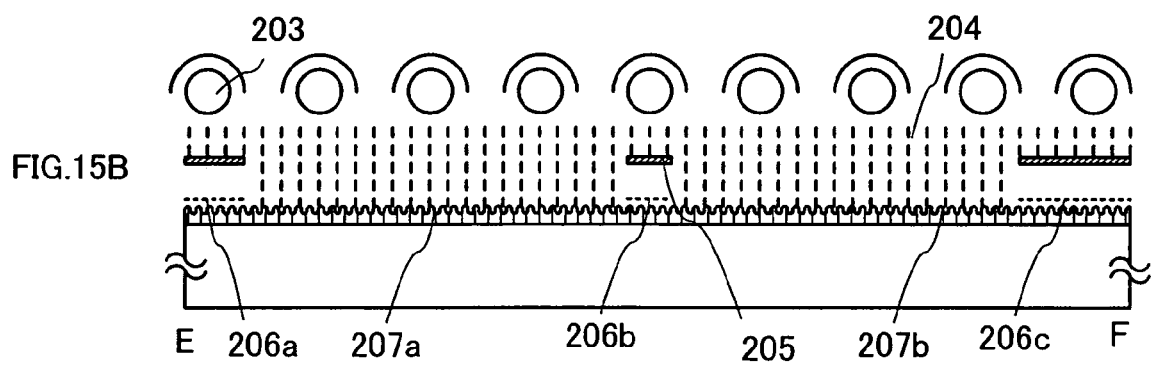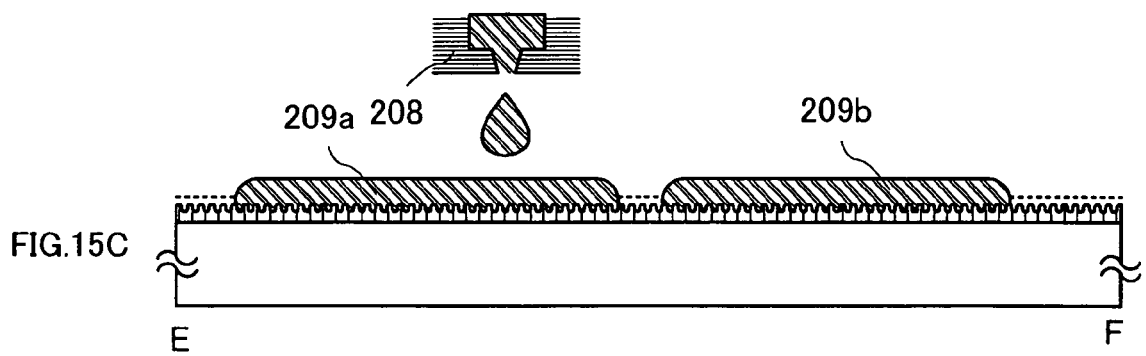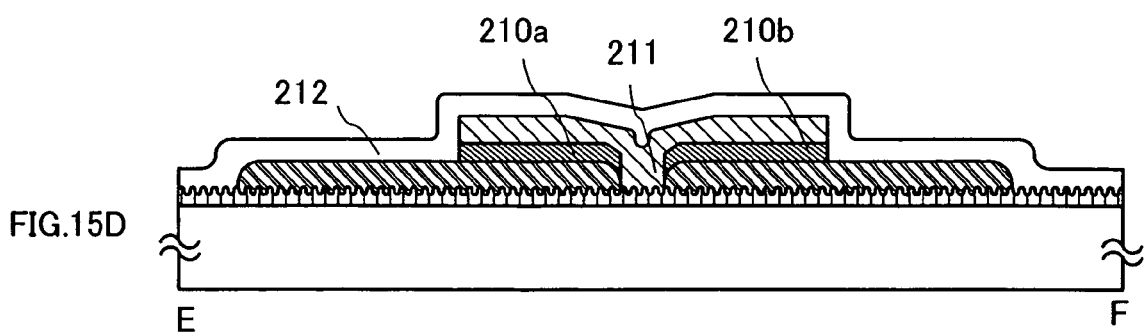

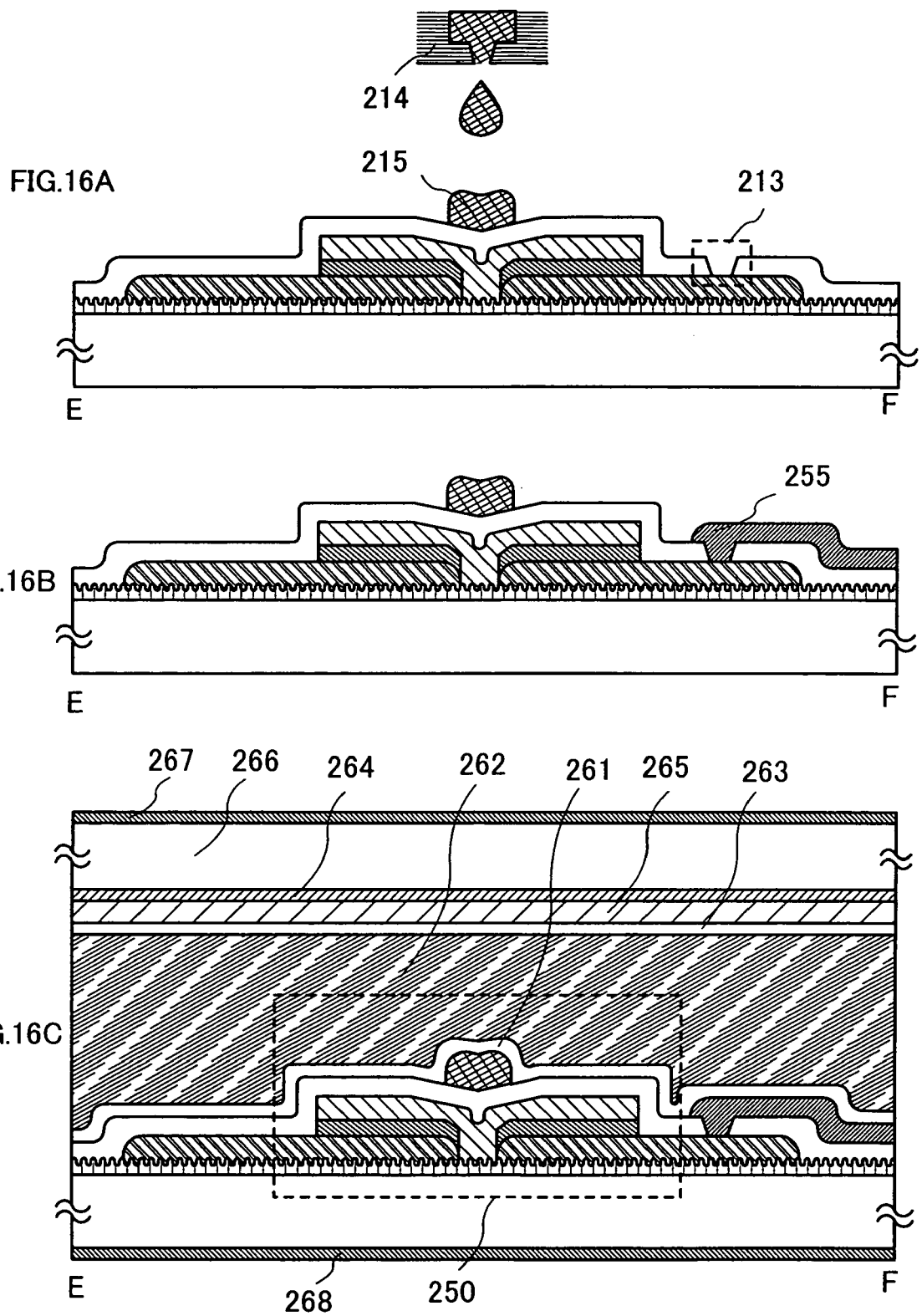

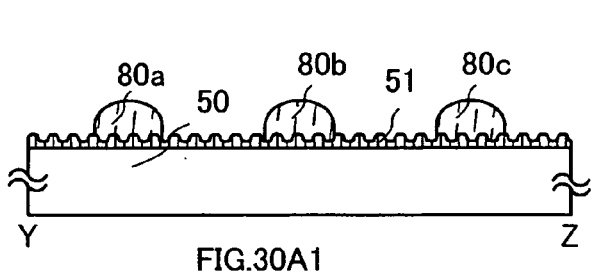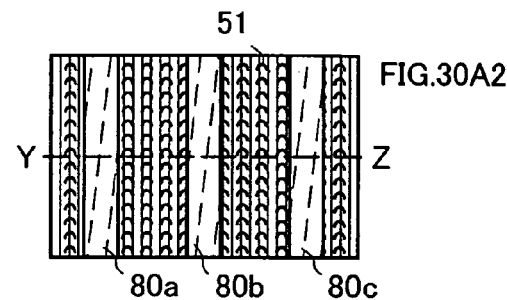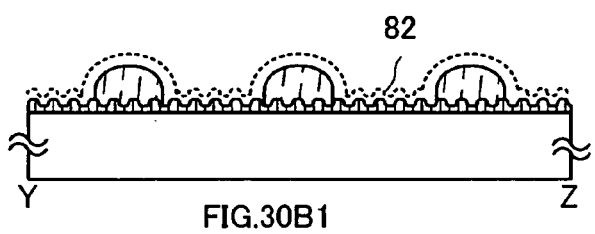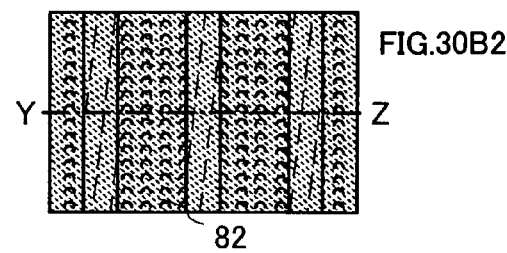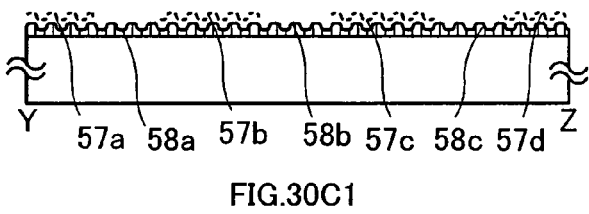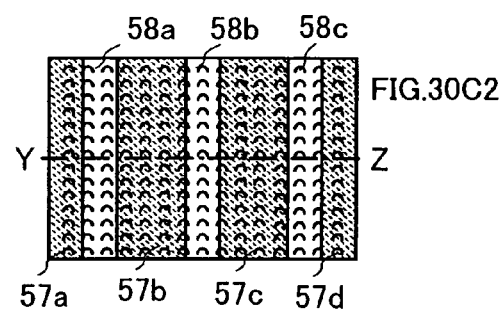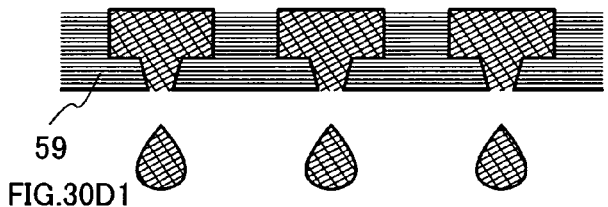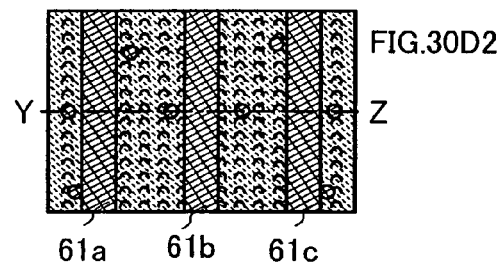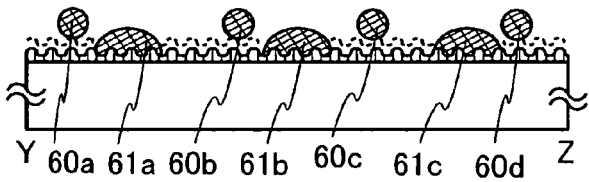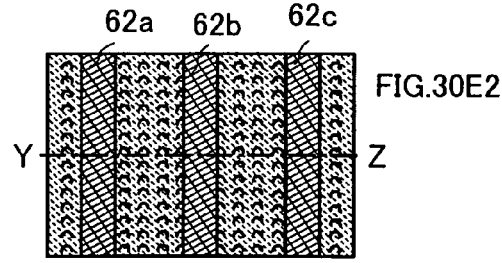

SEMICONDUCTOR DEVICE AND MANUFACTURING METHOD THEREOF

PRIORITY

The following application claims priority to Japanese Application No. 2004-366430, filed Dec. 17, 2004, herein incorporated by reference in its entirety.

BACKGROUND OF THE INVENTION

1. Field of the Invention

The present invention relates to a semiconductor device formed using a printing method and a manufacturing method thereof.

2. Description of the Related Art

A thin film transistor (hereinafter also referred to as a "TFT") and an electronic circuit using the thin film transistor are manufactured by laminating various kinds of thin films of a semiconductor, an insulating material, a conductive material, and the like over a substrate and then appropriately forming a predetermined pattern with a photolithography technique. The photolithography technique is a technique to transfer a pattern of a circuit or the like, which is formed over a transparent flat plane using a material which does not transmit light and is referred to as a photomask, to a targeted substrate by utilizing light, and the technique is widely used in a manufacturing process of a semiconductor integrated circuit or the like.

In a conventional manufacturing process employing the photolithography technique, a multi-stage step including exposure to light, development, baking, peeling, and the like is required to handle a mask pattern formed of a photosensitive organic resin material referred to as a photoresist. Therefore, as the number of photolithography steps is increased, manufacturing cost is inevitably increased. In order to solve such a problem as described above, it has been attempted to reduce the number of photolithography steps to manufacture the TFT (for example, Reference 1: Japanese Patent Laid-Open No. H11-251259).

SUMMARY OF THE INVENTION

It is an object of the present invention to provide a technique, with which the number of photolithography steps can be reduced in a manufacturing process of a TFT, an electronic circuit using the TFT, or a display device formed using the TFT to simplify the manufacturing process, and the TFT, the electronic circuit using the TFT, or the display device formed using the TFT can be manufactured with high yield at low cost also over a large-area substrate having a side of more than one meter.

It is another object of the invention to provide a technique, with which a component such as a wiring included in the semiconductor device or display device can be formed in a desired shape with good adhesiveness.

In the invention, a liquid composition is attached to a formation region and solidified by baking, drying, or the like to form a conductive layer or an insulating layer. In the case of such a method, the liquid composition needs to be attached to a formation region in a minute and precise pattern to improve precision of the shape or formation region of the conductive layer or the insulating layer. Particularly when a wiring layer for forming a circuit is formed, an error of the formation region of the wiring layer causes an adverse effect on electrical properties, for example, a short circuit. Since a liquid composition containing particles of a conductive material is in the form of a liquid, it is largely affected by a surface state of a formation region. In the invention, treatment for controlling wettability of an application region of the liquid composition is performed. In particular, a layer having a rough surface is formed in an attachment region of the liquid composition to enhance the effect of controlling wettability.

Wettability of a solid surface is affected by chemical properties of the surface. If a material having low wettability by a liquid composition is formed, a surface thereof is a region having low wettability by the liquid composition (hereinafter also referred to as a low wettability region). On the other hand, if a material having high wettability by a liquid composition is formed, a surface thereof is a region having high wettability by the liquid composition (hereinafter also referred to as a high wettability region). In the invention, treatment of controlling surface wettability means forming regions having different wettability by a liquid composition in an attachment region of the liquid composition.

The regions having different wettability have a difference in wettability by a liquid composition, on which contact angles of a composition containing a conductive material are different from each other. A region, on which a contact angle of the composition containing a conductive material is large, is a region having lower wettability (hereinafter also referred to as a low wettability region) and a region, on which a contact angle is small, is a region having higher wettability (hereinafter also referred to as a high wettability region). When a contact angle is large, a liquid composition having fluidity does not spread on a region surface, and the surface repels the composition and is not wetted thereby. When a contact angle is small, a composition having fluidity spreads on a surface, and the surface is wetted well thereby. Therefore, the regions having difference wettability have different surface energy. The region having low wettability has low surface energy, and the region having high wettability has high surface energy.

Wettability is also affected by a physical surface shape (surface roughness) in addition to chemical properties of the surface. Over a rough surface having a geometrically uneven shape, there is a larger difference in wettability than over a flat surface. In other words, a low wettability region obtained by forming a material having low wettability by a liquid composition over a surface having high surface roughness exhibits higher liquid repellency against a liquid composition than a low wettability region obtained by forming the same material having low wettability over a flat surface. In the same manner, a high wettability region over a rough surface has higher wettability by a liquid composition and exhibits higher lyophilic properties than that over a flat surface. Since regions having largely different wettability (regions having a large difference in wettability) can be formed over a layer having a rough surface, a liquid conductive or insulating material can be attached only to a formation region with precision.

In the invention, the layer having a rough surface is formed in a region to which a liquid composition used to form a conductive layer or an insulating layer is attached. The layer having a rough surface may be formed as a buffer layer between a substrate and a conductive layer, or a rough surface may be formed by processing a surface of a material serving as a support like a substrate. The layer having a rough surface may not have continuity as a film. For example, the rough surface may be formed by dispersing a particulate material over a substrate to have an uneven shape. A layer surface may be subjected to physical force or impact to have an uneven shape, or may be partially deformed (partially dissolved or the like) by chemical treatment (surface corrosion with a solution having a corrosive effect, or the like) or by heating to have an uneven shape. For the layer having a rough surface, an organic material or an inorganic material may be used, and an insulating material or a conductive material may also be used since the layer may have a function of effectively controlling surface wettability.

The uneven shape of the rough surface is sufficiently smaller than a droplet diameter of a liquid composition discharged to the rough surface, and a surface area of the rough surface is increased by the existence of the sufficiently small uneven shape. Thus, the rough surface can look flat on a droplet size scale. A droplet diameter of a liquid composition at the time of attaching to the surface is preferably 1000 or more times larger than the value of surface roughness that is a parameter defining roughness of the surface. In addition, a surface area ratio of a rough surface including the uneven shape to a rough surface region (area excluding an increase in surface area due to the uneven shape) is preferably 1.5 or more.

The difference in wettability is relative to the relationship of the regions. Two kinds of regions having different wettability can be formed by selectively forming a low wettability region over the layer having a rough surface. As a method for selectively forming the low wettability region, a method for selectively forming a low wettability material by forming and using a mask layer, a method for performing surface treatment to lower wettability by using a mask layer, or the like can be used. Alternatively, a method for selectively eliminating a low wettability effect (removal or decomposition of a material having low wettability) after forming a low wettability region, or the like can be used.

As a method for changing and controlling surface wettability, there is a method for changing wettability by decomposing a surface material and modifying a region surface with the use of light irradiation energy. As the material having low wettability, a material having a fluorocarbon group (or chain) or a material containing a silane coupling agent can be used. The silane coupling agent can form a monomolecular film; therefore, it can perform decomposition and modification efficiently and change wettability in a short time. In addition, not only a silane coupling agent having a fluorocarbon group but also that having an alkyl group can be used, because the silane coupling agent having an alkyl group exhibits low wettability when arranged over a substrate.

According to the present invention, regions having largely different wettability (regions having a large difference in wettability) can be formed. Thus, a liquid conductive or insulating material is attached only to a formation region with precision. Accordingly, a conductive or insulating layer can be precisely formed in a desired pattern.

Note that the term "semiconductor device" in this specification means a device which can be operated by utilizing semiconductor properties. A multilayer wiring layer, or a semiconductor device such as a chip having a processor circuit (hereinafter also referred to as a processor chip) can be manufactured using the invention.

The invention can also be used for a display device that is a device having a display function. The display device using the invention includes the following: a light emitting display device in which a TFT is connected to a light emitting element where a layer containing an organic material or a mixture of an organic material and an inorganic material that emits light called electroluminescence (hereinafter also referred to as "EL") is interposed between electrodes; a liquid crystal display device using a liquid crystal element having a liquid crystal material as a display element; and the like.

One feature of a method for manufacturing a semiconductor device of the invention is to comprise the steps of: forming a layer having a rough surface; forming a region having low wettability by a composition containing a conductive material and a region having high wettability by the composition over the rough surface; and forming a conductive layer using the composition in the region having high wettability.

Another feature of a method for manufacturing a semiconductor device of the invention is to comprise the steps of: forming a layer having a rough surface; forming a region having low wettability by a composition containing an insulating material and a region having high wettability by the composition over the rough surface; and forming an insulating layer using the composition in the region having high wettability.

Another feature of a method for manufacturing a semiconductor device of the invention is to comprise the steps of: forming a layer having a rough surface; forming a material having a fluorocarbon group over the layer having a rough surface; selectively irradiating the material having a fluorocarbon group with light to form a first region and a second region which has higher wettability by a composition containing a conductive material than the first region; and forming a conductive layer using the composition in the second region.

Another feature of a method for manufacturing a semiconductor device of the invention is to comprise the steps of: forming a layer having a rough surface; selectively forming a mask layer over the layer having a rough surface; forming a material having a fluorocarbon group over the layer having a rough surface and the mask layer; removing the mask layer and the material having a fluorocarbon group over the mask layer to form a first region and a second region which has higher wettability by a composition containing a conductive material than the first region; and forming a conductive layer using the composition in the second region.

Another feature of a method for manufacturing a semiconductor device of the invention is to comprise the steps of: forming a layer having a rough surface; forming a material containing a silane coupling agent over the layer having a rough surface; selectively irradiating the material containing a silane coupling agent with light to form a first region and a second region which has higher wettability by a composition containing a conductive material than the first region; and forming a conductive layer using the composition in the second region.

Another feature of a method for manufacturing a semiconductor device of the invention is to comprise the steps of: forming a layer having a rough surface; selectively forming a mask layer over the layer having a rough surface; forming a material containing a silane coupling agent over the layer having a rough surface and the mask layer; removing the mask layer and the material containing a silane coupling agent over the mask layer to form a first region and a second region which has higher wettability by a composition containing a conductive material than the first region; and forming a conductive layer using the composition in the second region.

One feature of a semiconductor device of the invention is to comprise: a layer having a rough surface; and a conductive layer provided over the layer having a rough surface, wherein a surface area ratio of the layer having a rough surface is 1.5 or more.

Another feature of a semiconductor device of the invention is to comprise: a layer having a rough surface; a gate electrode layer provided over the layer having a rough surface; a gate insulating layer; a semiconductor layer; a source electrode layer; and a drain electrode layer, wherein a surface area ratio of the layer having a rough surface is 1.5 or more.

Another feature of a semiconductor device of the invention is to comprise: a layer having a rough surface; a source electrode layer and a drain electrode layer provided over the layer having a rough surface; a semiconductor layer; a gate insulating layer; and a gate electrode layer, wherein a surface area ratio of the layer having a rough surface is 1.5 or more.

According to the present invention, a component such as a wiring included in a semiconductor device, a display device, or the like can be formed in a desired shape with good adhesiveness. In addition, there is less material loss, and cost reduction can be achieved. Thus, a high-performance and high-reliability semiconductor device or display device can be manufactured with high yield.

BRIEF DESCRIPTION OF DRAWINGS

FIGS. 1A1 to 1E2 are conceptual diagrams of the present invention.

FIGS. 10A and 10B show a display device of the present invention.

FIGS. 13A to 13F are circuit diagrams showing a pixel structure which can be applied to an EL display panel of the present invention.

FIGS. 14A to 14D show a structure of a light emitting element which can be applied to the present invention.

FIGS. 15A to 15D show a method for manufacturing a display device of the present invention.

FIGS. 16A to 16C show a method for manufacturing a display device of the present invention.

FIGS. 30A1 to 30E2 are conceptual diagrams of the present invention.

DETAILED DESCRIPTION OF THE INVENTION

Figure 2A:
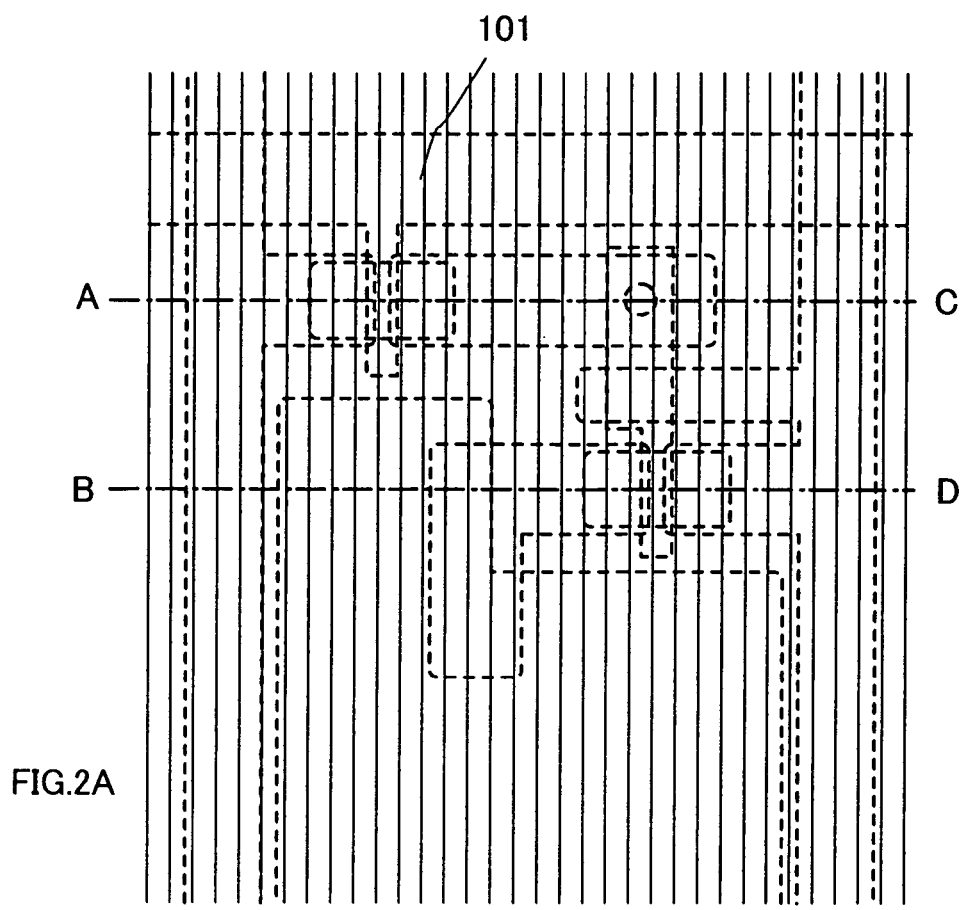
FIGS. 2A to 2C show a method for manufacturing a display device of the present invention.

Embodiments and Examples of the present invention are explained in detail with reference to drawings. However, the present invention is not limited to the following description. As is easily known to a person skilled in the art, the mode and the detail of the invention can be variously changed without departing from the spirit and the scope of the present invention. Thus, the present invention is not interpreted while limiting to the following description of Embodiments and Examples. Note that the same reference numeral is used to denote the same portion or a portion having a similar function among different diagrams in a structure of the present invention to be described hereinafter, and repetitive description is omitted.

Embodiment 1

Embodiment 1 of the present invention is explained with reference to FIGS. 1A1 to 1E2 and FIGS. 2A to 2C.

One feature of the present invention is to manufacture a semiconductor device or a display device by forming at least one or more of components required to manufacture a semiconductor device, display device, or the like, such as a conductive layer for forming a wiring layer or an electrode, or a mask layer for forming a predetermined pattern, with a method capable of selective formation in a desired shape. In the present invention, the component (also referred to as a pattern) means a conductive layer such as a wiring layer, a gate electrode layer, a source electrode layer, or a drain electrode layer, a semiconductor layer, a mask layer, an insulating layer, or the like, which is included in a thin film transistor or a display device, and includes all components that are formed in a predetermined shape. A droplet discharge (ejection) method (also referred to as an ink-jet method, depending on its mode), which can form a conductive layer, an insulating layer, or the like in a predetermined pattern by selectively discharging (ejecting) a droplet of a composition mixed for a particular purpose, is employed as the method capable of selective formation in a desired pattern. In addition, a method capable of transferring or drawing a component in a desired pattern, for example, various kinds of printing methods (a method of forming in a desired pattern, such as screen (mimeograph) printing, offset (lithography) printing, relief printing, gravure (intaglio) printing, or the like), a dispenser method, a selective coating method, or the like can also be employed.

This embodiment employs a method for discharging (ejecting) a composition containing a component-forming material, which is a fluid, as a droplet to form a component in a desired pattern. A droplet containing the component-forming material is discharged to a component formation region, and the composition is fixed by baking, drying, or the like to form a component in a desired pattern.

Figure 25:
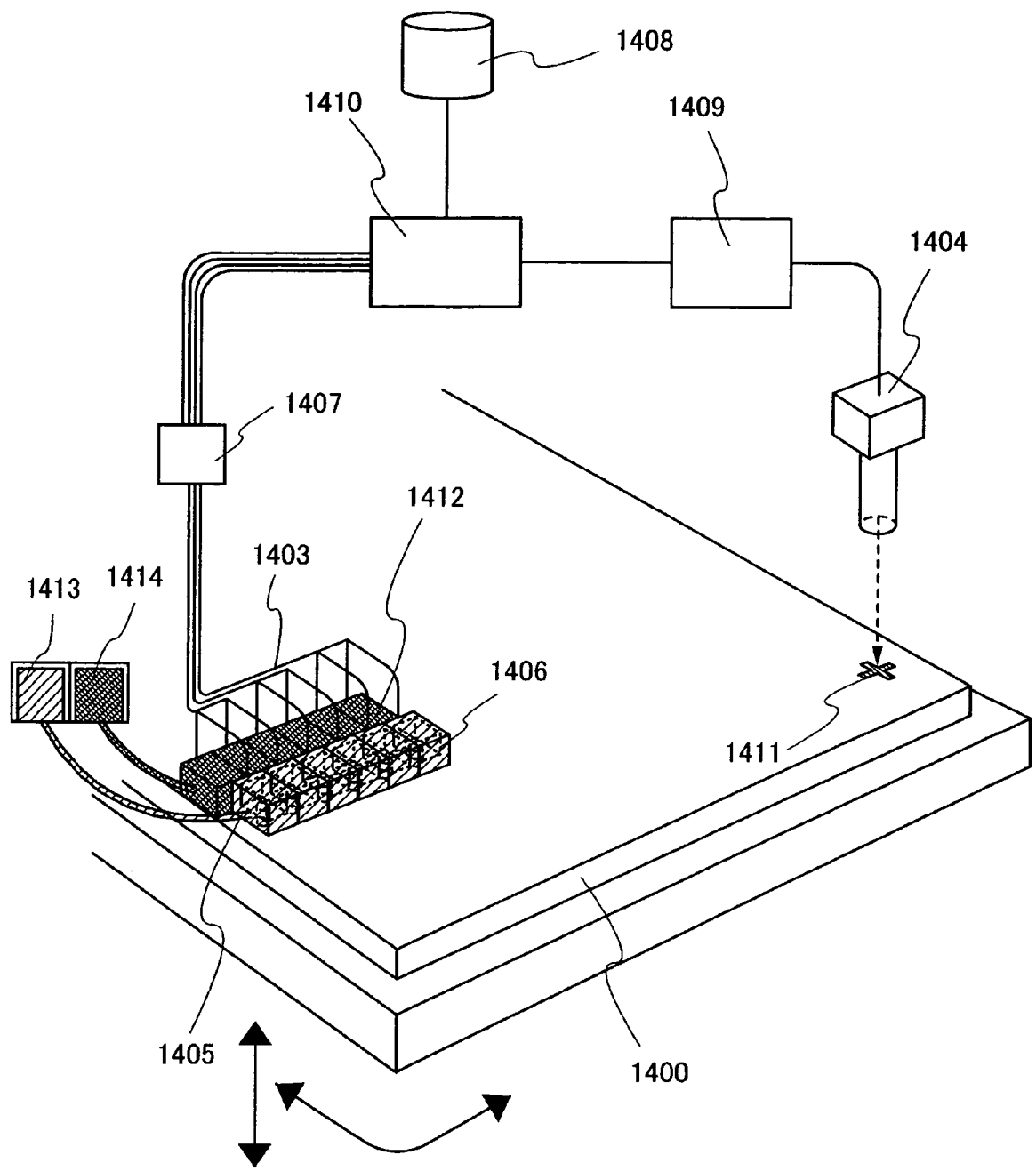
FIG. 25 shows a structure of a droplet discharge apparatus which can be applied to the present invention.

One mode of a droplet discharge apparatus used for a droplet discharge method is shown in FIG. 25. Each of heads 1405 and 1412 of a droplet discharge means 1403 is connected to a control means 1407, and this control means 1407 is controlled by a computer 1410, so that a preprogrammed pattern can be formed. The formation position may be determined, for example, based on a marker 1411 that is formed over a substrate 1400. Alternatively, a reference point may be fixed based on an edge of the substrate 1400. The reference point is detected by an imaging means 1404, and converted into a digital signal by an image processing means 1409. Then, the digital signal is recognized by the computer 1410 to generate a control signal, and the control signal is transmitted to the control means 1407. An image sensor or the like using a charge coupled device (CCD) or a complementary metal oxide semiconductor can be used as the imaging means 1404. Naturally, information about a pattern to be formed over the substrate 1400 is stored in a storage medium 1408, and the control signal is transmitted to the control means 1407 based on the information, so that each of the heads 1405 and 1412 of the droplet discharge means 1403 can be individually controlled. The heads 1405 and 1412 are supplied with a material to be discharged, from material supply sources 1413 and 1414 through pipes, respectively.

The head 1405 has an inside structure which has a space filled with a liquid material as indicated by dotted lines 1406 and a nozzle which is a discharge opening. Although not shown, an inside structure of the head 1412 is similar to the head 1405. When the nozzle sizes of the heads 1405 and 1412 are different from each other, different materials with different widths can be discharged simultaneously. Also, a conductive material, an organic material, an inorganic material, or the like can each be discharged from one head. In the case of drawing over a large area such as an interlayer film, one material can be simultaneously discharged from a plurality of nozzles to improve throughput, and thus, drawing can be performed. When a large-sized substrate is used, the heads 1405 and 1412 can freely move over the substrate in a direction indicated by arrows in FIG. 25, and a drawing region can be freely set. Thus, a plurality of the same pattern can be drawn over one substrate.

In the case of forming a conductive layer by a droplet discharge method, a conductive layer is formed as follows: a composition containing a conductive material which is processed into a particle form is discharged, and fused or welded by baking to solidify the composition. Whereas many of conductive layers (or insulating layers) formed by a sputtering method or the like have a columnar structure, many of conductive layers (or insulating layers) formed by discharging and baking the composition containing a conductive material have a polycrystalline structure having a large number of grain boundaries.

In this embodiment, light irradiation treatment is performed as pretreatment on a formation region of an object to be formed and the vicinity thereof to selectively perform surface modification treatment. By this modification treatment, at least two or more kinds of regions having different wettability by a liquid composition can be formed in a discharge region of a composition containing a formation material. A liquid composition containing a conductive material or an insulating material is attached to the modified surface to form a conductive layer or an insulating layer.

Light used for the modification treatment is not especially limited; one of infrared light, visible light, or ultraviolet light or a combination thereof can be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. In that case, a lamp light source may be lighted for a necessary period or several times for irradiation.

Alternatively, laser light may be used as light used for the modification treatment, and a laser oscillator which can oscillate ultraviolet light, visible light, or infrared light can be used as a laser oscillator. As the laser oscillator, an excimer laser oscillator of KrF, ArF, XeCl, Xe, or the like, a gas laser oscillator of He, He—Cd, Ar, He—Ne, HF, or the like, a solid-state laser oscillator using crystal such as YAG, GdVO$_4$, YVO$_4$, YLF, or YAlO$_3$ doped with Cr, Nd, Er, Ho, Ce, Co, Ti, or Tm, a semiconductor laser oscillator of GaN, GaAs, GaAlAs, InGaAsP, or the like can be used. Note that first to fifth harmonics of a fundamental wave are preferably used in the solid-state laser oscillator. A shutter, a reflector such as a mirror or a half mirror, an optical system including a cylindrical lens, a convex lens, or the like may be provided to adjust the shape or path of laser light emitted from the laser oscillator.

Note that light irradiation may be selectively performed by moving a substrate, or light irradiation may be performed by moving light in the X- and Y-axis directions. In that case, a polygon mirror or a galvanometer mirror is preferably used for the optical system.

In addition, a combination of light from a lamp light source and laser light can be used as light. A relatively large process region may be irradiated using a lamp, and only a region which needs to be highly minutely processed may be irradiated with laser light. By performing light irradiation treatment in such a manner, throughput can be improved and a highly minutely processed wiring board, semiconductor device, display device, or the like can be obtained.

A concept of this embodiment of the invention is explained using a method for forming a conductive layer with reference to FIGS. 1A1 to 1E2 and FIGS. 30A1 to 30E2. FIGS. 1A2 to 1E2 are top views of a conductive layer, and FIGS. 1A1 to 1E1 are cross-sectional views taken along line Y-Z in FIGS. 1A2 to 1E2.

As shown in FIGS. 1A1 and 1A2, a layer 51 having a rough surface is formed over a substrate 50. The layer 51 having a rough surface has a rough surface with an uneven shape. The layer having a rough surface may be formed over the substrate as a buffer layer. The rough surface may be formed by processing a surface of a material serving as a support like a substrate. The layer having a rough surface may not have continuity as a film. For example, a rough surface may be formed by dispersing a particulate material over a substrate to have an uneven shape. A layer surface may be subjected to physical force or impact to have an uneven shape, or may be partially deformed (partially dissolved or the like) by chemical treatment (surface corrosion with a solution having a corrosive effect, or the like) or by heating to have an uneven shape.

The uneven shape of the rough surface is sufficiently smaller than a droplet diameter of a liquid composition discharged to the rough surface, and a surface area of the rough surface is increased by the existence of the sufficiently small uneven shape. Thus, the rough surface can look flat on a droplet size scale. A droplet diameter of a liquid composition at the time of attaching to the surface is preferably 1000 or more times larger than the value of surface roughness that is a parameter defining roughness of the surface. Surface roughness may be measured with an atomic force microscope (AFM). In addition, a surface area ratio of a rough surface including the uneven shape to a rough surface region (area excluding an increase in surface area due to the uneven shape) is preferably 1.5 or more. FIGS. 1A1 to 1E2 show the uneven shape only schematically. The size or shape thereof is not limited to that shown in FIGS. 1A1 to 1E2.

For the layer having a rough surface, an organic material or an inorganic material may be used, and an insulating material or a conductive material may also be used since the layer may have a function of effectively controlling surface wettability. However, in the case of using a conductive material, after forming a conductive layer, an unnecessary portion needs to be removed using the conductive layer as a mask or insulated by performing oxidation treatment or the like on the unnecessary portion in consideration of its conductivity. For example, in this embodiment, after forming conductive layers 62a to 62c in FIG. 1E1, the layer 51 having a rough surface except in formation regions of the conductive layers 62a to 62c may be removed by etching or insulated.

The insulating material may be silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant high molecular weight material such as polyimide, aromatic polyamide, or polybenzimidazole; an inorganic siloxane-based material which is formed from the siloxane-based material as a starting material and contains a Si—O—Si bond among compounds including silicon, oxygen, and hydrogen; or an organic siloxane-based insulating material in which an organic group such as methyl or phenyl is substituted for hydrogen bonded with silicon. Alternatively, a resin material such as a vinyl resin of polyvinyl alcohol, polyvinylbutyral, or the like, an epoxy resin, a phenol resin, a novolac resin, an acrylic resin, a melamine resin, or a urethane resin is used. Further, an organic material such as benzocyclobutene, parylene, flare, or polyimide; a compound material made by the polymerization of a siloxane-based polymer or the like; a composition material containing a water-soluble homopolymer and a water-soluble copolymer; or the like may be used. Further alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator may be used. The conductive material may be metal such as Ag, Au, Cu, Ni, Pt, Pd, Ir, Rh, W, or Al, metal sulfide of Cd, Zn, or the like, oxide of Fe, Ti, Si, Ge, Zr, Ba, or the like, or a mixture of the above conductive materials.

A material 52 having low wettability is formed over the layer 51 having a rough surface (see FIGS. 1B1 and 1B2). In this embodiment, a method for changing wettability by decomposing a surface material and modifying a region surface with light irradiation energy is used as another method for changing and controlling surface wettability.

As the material having low wettability, a material containing a fluorocarbon group or a silane coupling agent can be used. The silane coupling agent is expressed by the chemical formula: Rn—Si—X (4−n) (n=1, 2, 3). In this chemical formula, R represents a material containing a relatively inactive group such as an alkyl group. X represents a hydrolytic group such as halogen, a methoxy group, an ethoxy group, or an acetoxy group that is bondable by a condensation of a hydroxyl group or adsorbed water on a base material surface.

By using a silane coupling agent containing fluorine (such as fluoroalkylsilane (FAS)), which has a fluoroalkyl group for R, as the silane coupling agent, the wettability can be further lowered. R in FAS has a structure expressed by $(CF_3)(CF_2)_x(CH_2)_y$ (x is an integer in the range of 0 to 10, and y is an integer in the range of 0 to 4). When a plurality of Rs or Xs are bonded with Si, the Rs or Xs may be all the same or different from one another. Typically, the following can be given as typical FAS: heptadecafluoro tetrahydrodecyl triethoxysilane, heptadecafluoro tetrahydrodecyl trichlorosilane, tridecafluoro tetrahydrooctyl trichlorosilane, or trifluoropropyl trimethoxysilane.

A material comprising an alkyl group without fluorocarbon group being provided in R of a silane coupling agent can be used as the material having low wettability. Octadecyl trimethoxysilane can be used as, for example, organosilane.

As a solvent of a solution for forming a low wettability region, a solvent containing hydrocarbon such as n-pentane, n-hexane, n-heptane, n-octane, n-decane, dicyclopentane, benzene, toluene, xylene, durene, indene, tetrahydronaphthalene, decahydronaphthalene, or squalane; tetrahydrofuran; or the like is used.

As an example of a composition of a solution for forming a low wettability region, a material having fluorocarbon group (e.g., fluorine-based resin) can be used. As the fluorine-based resin, the following can be used: polytetrafluoroethylene (PTFE); perfluoroalkoxyalkane (PFA) or a tetrafluoroethylene perfluoroalkylvinylether copolymer resin; perfluoroethylene propene copolymer (PFEP) or a tetrafluoroethylene-hexafluoropropylene copolymer resin; ethylene-tetrafluoroethylene copolymer (ETFE) or a tetrafluoroethylene-ethylene copolymer resin; a polyvinylidene fluoride (PVDF) resin; polychlorotrifluoro ethylene (PCTFE) or a polytrifluorochloroethylene resin; ethylene-chlorotrifluoroethylene copolymer (ECTFE) or a polytrifluorochloroethylene-ethylene copolymer resin; polytetrafluoroethylene-perfluorodioxole copolymer (TFE/PDD); polyvinyl fluoride (PVF) or a vinyl fluoride resin; or the like.

Further, the low wettability region may be formed using an organic material which does not exhibit low wettability (in other words, which exhibits high wettability) and later performing treatment with $CF_4$ plasma or the like. As the organic material, for instance, a material of a solvent such as $H_2O$ mixed with a water-soluble resin such as polyvinyl alcohol (PVA) can be used. In addition, a combination of PVA and another water-soluble resin may be used. An organic material (organic resin material) (e.g., polyimide or acrylic) or a siloxane material may be used. Note that the siloxane material corresponds to a resin including a Si—O—Si bond. Siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Even when a material having a low-wettability surface is used, wettability can be further lowered by performing plasma treatment or the like.

In this embodiment, FAS is used as the material 52 having low wettability and formed over a large area (entire coating or the like) by a spin-coating method. This wettability is that by a liquid composition containing a conductive material included in a conductive layer to be formed in the following step.

The material 52 having low wettability is irradiated with light 63 from a light source 56 using a mask 54 provided for a substrate 55. The substrate 55 may be formed of any material that transmits the light 63, and the mask 54 is formed of a material which blocks the light 63. In this embodiment, an ultraviolet lamp is used as the light source; a quartz substrate, as the substrate 55; and a metal mask formed of metal, as the mask 54. The light 63 decomposes the material 52 having low wettability with its energy and heightens wettability. Thus, the concentration of the material having low wettability in the low wettability region (the concentration, amount, or the like of a fluorocarbon group having an effect of lowering wettability) becomes lower than that in a high wettability region. By the irradiation with the light 63, high wettability regions 58a to 58c which have relatively high wettability and low wettability regions 57a to 57d which have relatively low wettability are formed over the surface of the layer 51 having a rough surface (see FIGS. 1C1 and 1C2).

Subsequently, the liquid composition containing a conductive material is discharged from a droplet discharge apparatus 59 to the layer having a rough surface in which wettability is controlled. Since the liquid composition containing a conductive material is in the form of a liquid, it is largely affected by a surface state of a formation region. In this embodiment, treatment for controlling wettability of an application region of the liquid composition is performed. Further, the layer 51 having a rough surface is formed in an attachment region of the liquid composition to enhance the effect of controlling wettability.

Wettability is also affected by a physical surface shape (surface roughness) in addition to chemical properties of the surface. Over a rough surface having a geometrically uneven shape, there is a larger difference in wettability than over a flat surface. In other words, a low wettability region obtained by forming a material having low wettability by a liquid composition over a surface having high surface roughness exhibits higher liquid repellency against a liquid composition than a low wettability region obtained by forming the same material having low wettability over a flat surface. In the same manner, a high wettability region over a rough surface has higher wettability by a liquid composition and exhibits higher lyophilic properties than that over a flat surface. Wettability, by a composition containing a conductive material, of the high wettability regions 58a to 58c which have relatively high wettability is heightened since the regions are formed over the rough surface. In the same manner, wettability, by a composition containing a conductive material, of the low wettability regions 57a to 57d which have relatively low wettability is lowered since the regions are formed over the rough surface. Therefore, the high wettability regions 58a to 58c and the low wettability regions 57a to 57d have a large difference in wettability by the composition containing a conductive material. Contact angles of the liquid composition containing a conductive material on the high wettability regions 58a to 58c are preferably 40° or less. Contact angles of the liquid composition containing a conductive material on the low wettability regions 57a to 57d are preferably 150° or more.

As shown in FIGS. 1D1 and 1D2, compositions 61a to 61c containing a conductive material stay with good adhesiveness in the high wettability regions 58a to 58c which have high wettability by the composition containing a conductive material. On the other hand, compositions 60a to 60d containing a conductive material, which are discharged to the low wettability regions 57a to 57d having extremely high liquid-repellency against the composition containing a conductive material, are repelled and cannot stay in the regions. Therefore, the compositions flow into and stay in the high wettability regions 58a to 58c which have extremely high lyophilic properties. The compositions are solidified by baking, drying, or the like to stably form conductive layers 62a to 62c (see FIGS. 1E1 and 1E2).

In this embodiment, the conductive layers 62a to 62c are formed using a droplet discharge means. The droplet discharge means is a general term for a means with an instrument that discharges a droplet, such as a nozzle having a discharge opening of a composition, or a head equipped with a single or plurality of nozzles. The diameter of the nozzle included in the droplet discharge means is set in the range of 0.02 μm to 100 μm (preferably, 30 μm or less), and the amount of the composition to be discharged from the nozzle is set in the range of 0.001 pl to 100 pl (preferably, 0.1 pl to 40 pl, more preferably, 10 pl or less). The amount of the composition to be discharged increases in proportion to the size of the nozzle diameter. Further, it is preferable that the distance between an object to be treated and the discharge opening of the nozzle is as short as possible in order to drop a droplet on a desired position. Preferably, the distance is set approximately within the range of 0.1 mm to 3 mm (more preferably, 1 mm or less).

For the composition to be discharged from the discharge opening, a conductive material dissolved or dispersed in a solvent is used. The conductive material corresponds to a fine particle or a dispersed nanoparticle of metal such as Ag, Au, Cu, Ni, Pt, Pd, Ir, Rh, W, or Al, sulfide of metal such as Cd or Zn, oxide of Fe, Ti, Si, Ge, Zr, Ba, or the like, silver halide, or the like. Also, the conductive material corresponds to indium tin oxide (ITO), indium tin oxide containing silicon oxide (ITSO), organic indium, or organotin, zinc oxide, titanium nitride, or the like, which is used for a transparent conductive film. A single element, or a mixture of particles of plural kinds of elements can be used as the conductive material. However, as for the composition to be discharged from the discharge opening, it is preferable to use one of the materials of gold, silver, or copper dissolved or dispersed in a solvent, taking into consideration a specific resistance value. It is more preferable to use silver or copper having a low resistance value. However, when silver or copper is used, a barrier film may be additionally provided as a countermeasure against impurities. A silicon nitride film or nickel boron (NiB) can be used for the barrier film.

In addition, a particle with a plurality of layers, in which a conductive material is coated with another conductive material, may be used. For example, a three-layer structure particle in which copper is coated with nickel boron (NiB), which is further coated with silver, may be used. As for the solvent, ester such as butyl acetate or ethyl acetate, alcohol such as isopropyl alcohol or ethyl alcohol, an organic solvent such as methyl ethyl ketone or acetone, water, or the like is used. The viscosity of the composition is preferably 20 mPa·s or less. This prevents the composition from drying, and enables the composition to be discharged smoothly from the discharge opening. The surface tension of the composition is preferably 40 mN/m or less. However, the viscosity of the composition and the like may be appropriately controlled depending on a solvent to be used and an intended purpose. For example, the viscosity of a composition in which ITO, organic indium, or organotin is dissolved or dispersed in a solvent may be set from 5 mPa·s to 20 mPa·s, the viscosity of a composition in which silver is dissolved or dispersed in a solvent may be set from 5 mPa·s to 20 mPa·s, and the viscosity of a composition in which gold is dissolved or dispersed in a solvent may be set from 5 mPa·s to 20 mPa·s.

The conductive layer may be formed by laminating a plurality of conductive materials. In addition, the conductive layer may be formed first by a droplet discharge method using silver as a conductive material, and may then be plated with copper or the like. The plating may be performed by an electroplating or chemical (electroless) plating method. The plating may be performed by soaking a substrate surface into a container filled with a solution containing a plating material; alternatively, the solution containing a plating material may be applied by placing the substrate in an oblique (or vertical) position, and pouring the solution over the substrate surface. When the plating is performed by applying a solution with the substrate placed obliquely or vertically, there is an advantage that an apparatus used for the process can be downsized even with a large-sized substrate.

Although it depends on the diameter of each nozzle, a desired shape of a pattern, and the like, the diameter of a particle of the conductive material is preferably as small as possible, for the purpose of preventing nozzles from being clogged and for manufacturing a minute pattern. Preferably, the diameter of the particle of the conductive material is 0.1 µm or less. The composition is formed by a known method such as an electrolyzing method, an atomizing method, a wet reduction method, and the particle size to be obtained is typically about 0.01 µm to 10 µm. However, when a gas evaporation method is employed, nanoparticles protected by a dispersant are minute, about 7 nm, and when the surface of each particle is covered with a coating, the nanoparticles do not aggregate in the solvent and are uniformly dispersed in the solvent at room temperature, and behaves similarly to a liquid. Accordingly, it is preferable to use a coating.

Since a desired pattern is formed in the invention using a difference in wettability by a composition having fluidity between a formation region and the vicinity thereof, the composition needs to have fluidity even when the composition is attached to the object to be processed. However, as long as the fluidity is not lost, the step of discharging the composition may be performed under reduced pressure. In addition, when the step is performed under reduced pressure, an oxide film or the like is not formed over the surface of the conductive material, which is preferable. After discharging the composition, either or both steps of drying and baking is/are performed. Both the drying and baking steps are heat treatment. For example, drying is performed for three minutes at 100° C. and baking is performed for 15 minutes to 60 minutes at a temperature of 200° C. to 550° C., each having a different purpose, temperature, and time period. The steps of drying and baking are performed under normal pressure or under reduced pressure, by laser light irradiation, rapid thermal annealing, heating using a heating furnace, or the like. Note that the timing of the heat treatment and the number of times of the heat treatment are not particularly limited. The substrate may be heated in advance to perform the steps of drying and baking well, and although the temperature of the substrate at the time depends on the material of the substrate or the like, it is typically 100° C. to 800° C. (preferably, 200° C. to 550° C.). Through these steps, nanoparticles are made in contact with each other and fusion and welding are accelerated by hardening and shrinking of a peripheral resin, while the solvent in the composition is volatilized or the dispersant is chemically removed.

A continuous wave or pulsed gas laser or a solid-state laser may be used for laser light irradiation. An excimer laser, a YAG laser, or the like can be used as the former gas laser. A laser or the like using a crystal of YAG, YVO$_4$, GdVO$_4$, or the like which is doped with Cr, Nd, or the like can be used as the latter solid-state laser. Note that it is preferable to use a continuous wave laser in consideration of the absorption rate of laser light. Moreover, a laser irradiation method in which pulsed and continuous wave lasers are combined may be used. However, it is preferable that the heat treatment by laser light irradiation is instantaneously performed within several microseconds to several tens of seconds so as not to damage the substrate, depending on heat resistance of the substrate. Rapid thermal annealing (RTA) is carried out by raising the temperature rapidly and heating instantaneously for several microseconds to several minutes using an infrared lamp or a halogen lamp which emits light of ultraviolet to infrared light in an inert gas atmosphere. Since this treatment is performed instantaneously, only an outermost thin film can be substantially heated and the lower layer of the film is not affected. In other words, even a substrate having low heat resistance such as a plastic substrate is not affected.

After forming a conductive layer, an insulating layer, or the like by discharging a composition by a droplet discharge method, the surface thereof may be planarized by pressing with pressure to improve planarity. As a pressing method, unevenness of the surface may be planarized and reduced by moving a roller-shaped object over the surface, or the surface may be perpendicularly pressed with a flat plate-shaped object. A heating step may be performed at the time of pressing. Alternatively, the unevenness of the surface may be eliminated with an air knife after softening or melting the surface with a solvent or the like. A CMP method may be also used for polishing the surface. This step may be employed in planarizing a surface when unevenness is generated by a droplet discharge method.

In FIGS. 1A1 to 1E2, regions having different wettability are selectively formed by light irradiation. However, the regions having different wettability can be selectively formed using a mask layer as shown in FIGS. 30A1 to 30E2. FIGS. 30A2 to 30E2 are top views of a conductive layer, and FIGS. 30A1 to 30E1 are cross-sectional views taken along line Y-Z in FIGS. 30A2 to 30E2. Therefore, the same reference numeral as that used in FIGS. 1A1 to 1E2 is used to denote the same portion or a portion having a similar function, and repetitive explanation is omitted.

A layer 51 having a rough surface is formed over a substrate 50, and mask layers 80a to 80c are selectively formed over the layer 51 having a rough surface. For the mask layers 80a to 80c, an organic material or an inorganic material may be used, and an insulating material or a conductive material may be used as long as the mask layer serves as a mask for physically preventing a material having low wettability from attaching to the layer 51 having a rough surface. Since the mask layers 80a to 80c are removed in the following step, the mask layers 80a to 80c can preferably be removed by treatment such as etching for removing the mask layers without damaging a formation region.

The insulating material may be silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant high molecular weight material such as polyimide, aromatic polyamide, or polybenzimidazole; an inorganic siloxane-based material which is formed from the siloxane-based material as a starting material and contains a Si—O—Si bond among compounds including silicon, oxygen, and hydrogen; or an organic siloxane-based insulating material in which an organic group such as methyl or phenyl is substituted for hydrogen bonded with silicon. Alternatively, a resin material such as a vinyl resin of polyvinyl alcohol, polyvinylbutyral, or the like, an epoxy resin, a phenol resin, a novolac resin, an acrylic resin, a melamine resin, or a urethane resin is used. Further, an organic material such as benzocyclobutene, parylene, flare, or polyimide; a compound material made by the polymerization of a siloxane-based polymer or the like; a composition material containing a water-soluble homopolymer and a water-soluble copolymer; or the like may be used. Further alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator may be used. The conductive material may be one or more kinds of metal such as Ag, Au, Cu, Ni, Pt, Pd, Ir, Rh, W, and Al, or a mixture of sulfide of metal such as Cd, Zn, or the like, oxide of Fe, Ti, Ge, Si, Zr, Ba, or the like.

The mask layers 80a to 80c can be formed by a CVD method, a plasma CVD method, a sputtering method, a printing method, a dispenser method, a spray method, a spin-coating method, a droplet discharge method, or the like. In this embodiment, the mask layers 80a to 80c are formed by a droplet discharge method using polyvinyl alcohol (hereinafter also referred to as PVA).

A material 82 having low wettability is formed over the layer 51 having a rough surface and the mask layers 80a to 80c (see FIGS. 30B1 and 30B2). If the mask layers 80a to 80c are removed thereafter, the material 82 having low wettability is not formed over the layer 51 having a rough surface below the mask layers 80a to 80c. Thus, a region having high wettability and a region having low wettability can be selectively formed. As in FIGS. 1C1 and 1C2, high wettability regions 58a to 58c and low wettability regions 57a to 57d are formed over the layer 51 having a rough surface (see FIGS. 30C1 and 30C2).

As in FIGS. 1D1, 1D2, 1E1, and 1E2, conductive layers 62a to 62c can be stably formed with good controllability by discharging a liquid composition containing a conductive material to a region where wettability is controlled (FIGS. 30D1, 30D2, 30E1, and 30E2).

In addition, treatment for heightening wettability means providing the region with stronger force of keeping a discharged droplet in the region (also referred to as adhesive force or fixing force) than that of a peripheral region, and also means increasing adhesiveness with a droplet by modifying the region by light irradiation. In addition, since only a surface which is in contact with and keeps a droplet may have the wettability, it is not necessary that the region have the same property in the entire thickness direction.

In accordance with the invention, even when a wiring or the like is designed to be arranged densely and complexly for miniaturization and thinning, the wiring or the like can be stably formed into a desired pattern of a favorable shape, and reliability and productivity can be improved.

In accordance with the invention, a component can be formed into a desired pattern with good adhesiveness. In addition, there is less material loss, and cost reduction can be achieved. Consequently, a high-performance and high-reliability semiconductor device or display device can be manufactured with high yield.

Embodiment 2

Figure 26A:
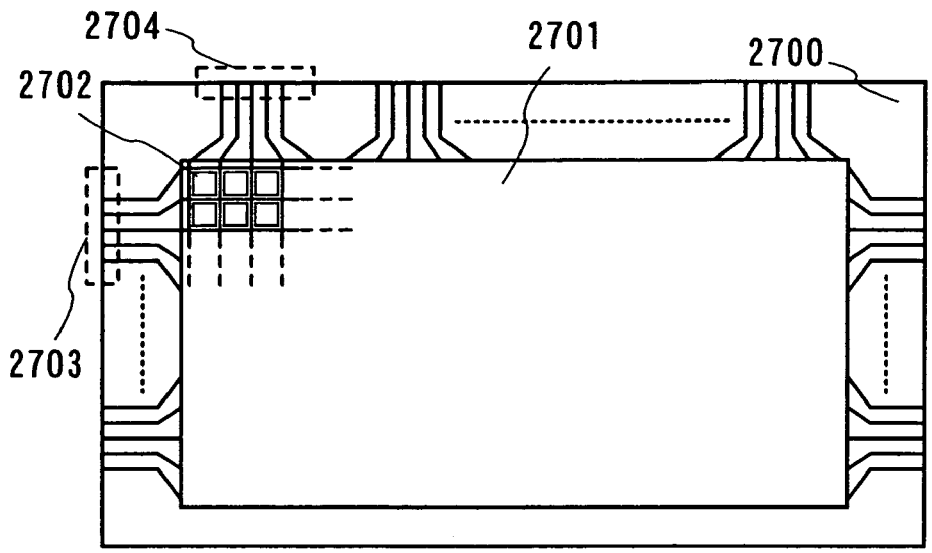
FIGS. 26A to 26C are top views of a display device of the present invention.

FIG. 26A is a top view showing a structure of a display panel according to the present invention. A pixel portion 2701 in which pixels 2702 are arranged in matrix, a scanning line input terminal 2703, and a signal line input terminal 2704 are formed over a substrate 2700 having an insulating surface. The number of pixels may be determined in accordance with various standards. In the case of an XGA full color display using RGB, the number of pixels may be 1024×768×3 (RGB). In the case of a UXGA full color display using RGB, the number of pixels may be 1600×1200×3 (RGB), and in the case of a full-spec high-definition full color display using RGB, it may be 1920×1080×3 (RGB).

The pixels 2702 are formed in matrix by an intersection of a scanning line extended from the scanning line input terminal 2703 and a signal line extended from the signal line input terminal 2704. Each pixel 2702 is provided with a switching element and a pixel electrode connected thereto. A typical example of the switching element is a TFT. The gate electrode of the TFT is connected to the scanning line, and a source or drain of the TFT is connected to the signal line, which enables each pixel to be independently controlled by a signal inputted from outside.

Figure 27A:
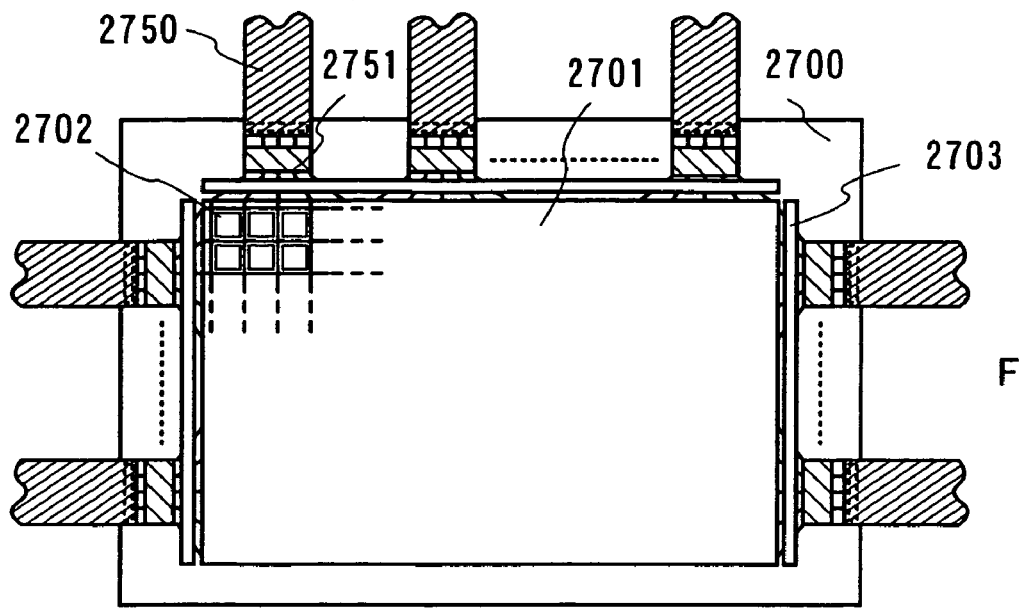
FIGS. 27A and 27B are top views of a display device of the present invention.
Figure 27B:
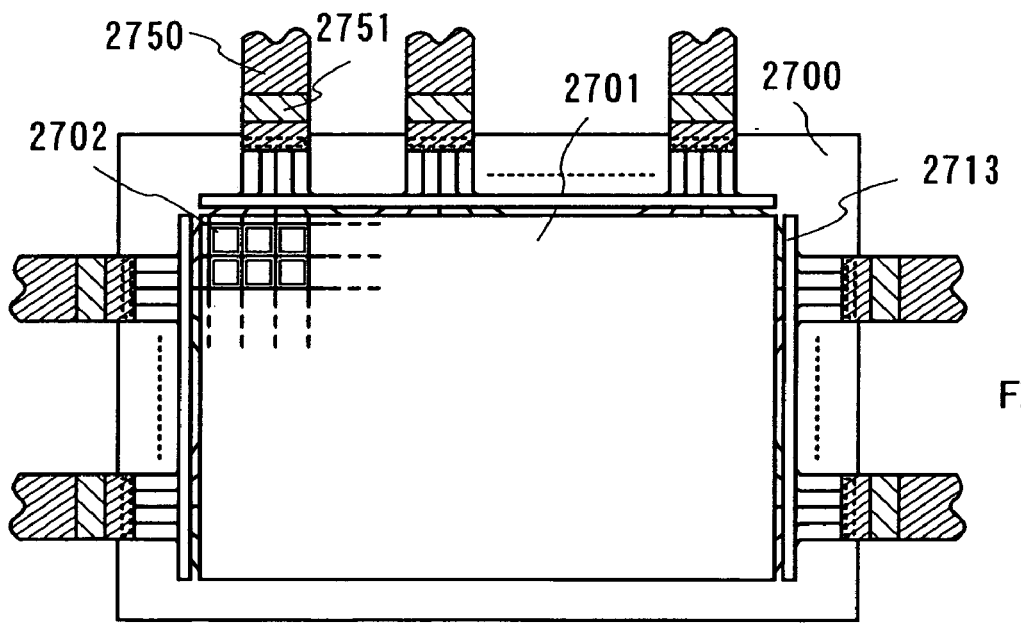

FIG. 26A shows a structure of a display panel in which a signal to be inputted to a scanning line and a signal line is controlled by an external driver circuit. Alternatively, a driver IC 2751 may be mounted on a substrate 2700 by a COG (Chip on Glass) method as shown in FIG. 27A. As another mounting mode, a TAB (Tape Automated Bonding) method may also be used as shown in FIG. 27B. The driver IC may be formed over a single crystal semiconductor substrate or may be formed of a TFT over a glass substrate. In FIGS. 27A and 27B, the driver IC 2751 is connected to an FPC 2750.

Figure 26B:
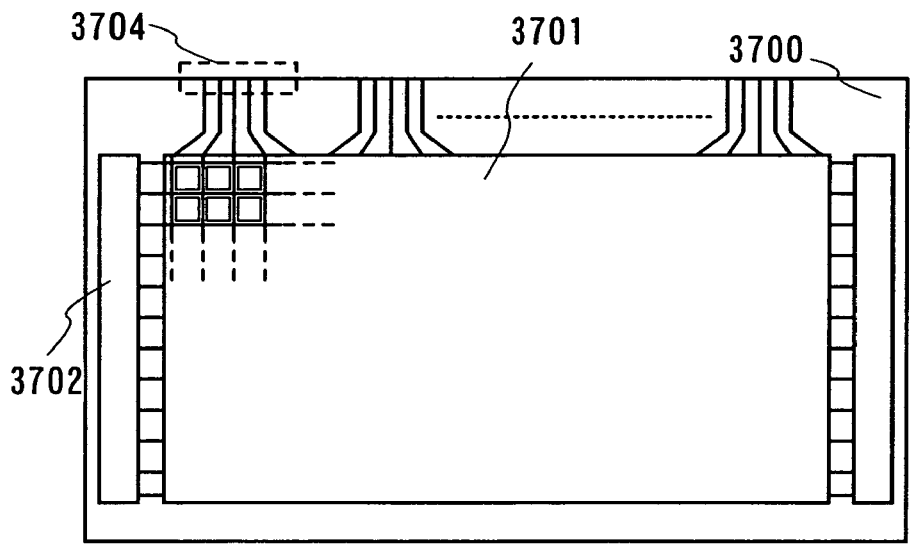
Figure 26C:
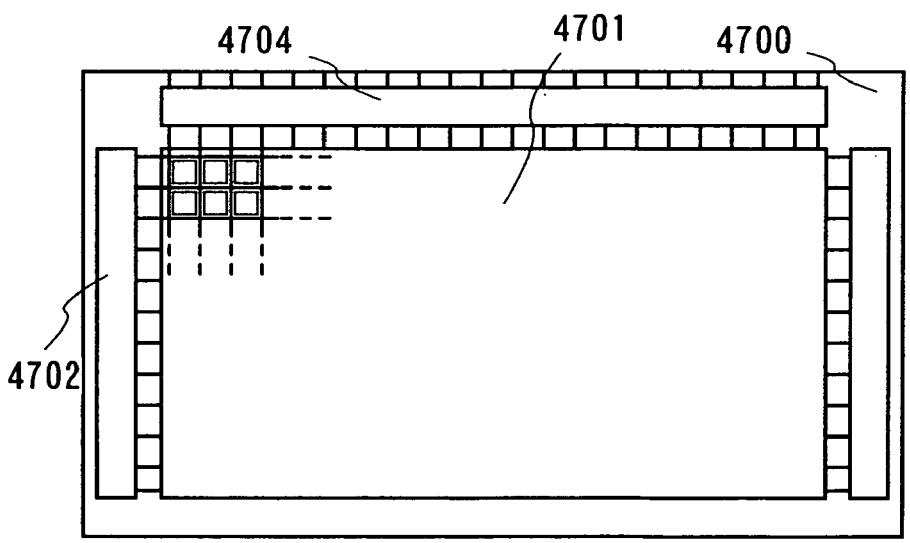

When a TFT provided in a pixel is formed of a polycrystalline (microcrystalline) semiconductor having a high crystallinity, a scanning line driver circuit 3702 can be formed over a substrate 3700 as shown in FIG. 26B. In FIG. 27B, reference numeral 2701 denotes a pixel portion, and a signal line driver circuit is controlled by an external driver circuit in the same manner as in FIG. 26A. As the TFT formed in the present invention, when the TFT provided in a pixel is formed of a polycrystalline (microcrystalline) semiconductor, a single crystal semiconductor, or the like having high mobility, a scanning line driver circuit 4702 and a signal line driver circuit 4704 can be integrated with a glass substance 4700 as shown in FIG. 26C.

When a TFT provided in a pixel is formed of a polycrystalline (microcrystalline) semiconductor having high crystallinity, a scanning line driver circuit 3702 can be formed over a substrate 3700 as shown in FIG. 26B. In FIG. 27B, reference numeral 2701 denotes a pixel portion, and a signal line driver circuit is controlled by an external driver circuit in the same manner as in FIG. 26A. As the TFT formed in the present invention, when the TFT provided in a pixel is formed of a polycrystalline (microcrystalline) semiconductor, a single crystal semiconductor, or the like having high mobility, a scanning line driver circuit 4702 and a signal line driver circuit 4704 can be integrated with a glass substrate 4700 as shown in FIG. 26C.

Figure 9A:
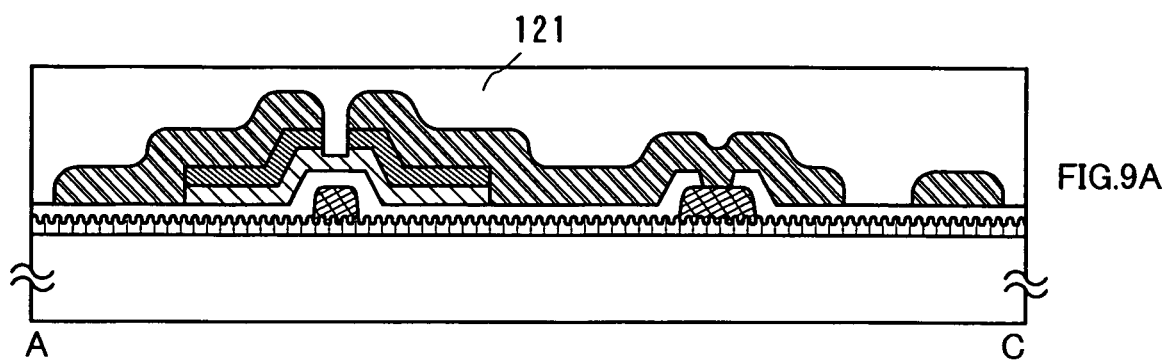
FIGS. 9A and 9B show a method for manufacturing a display device of the present invention.
Figure 9B:
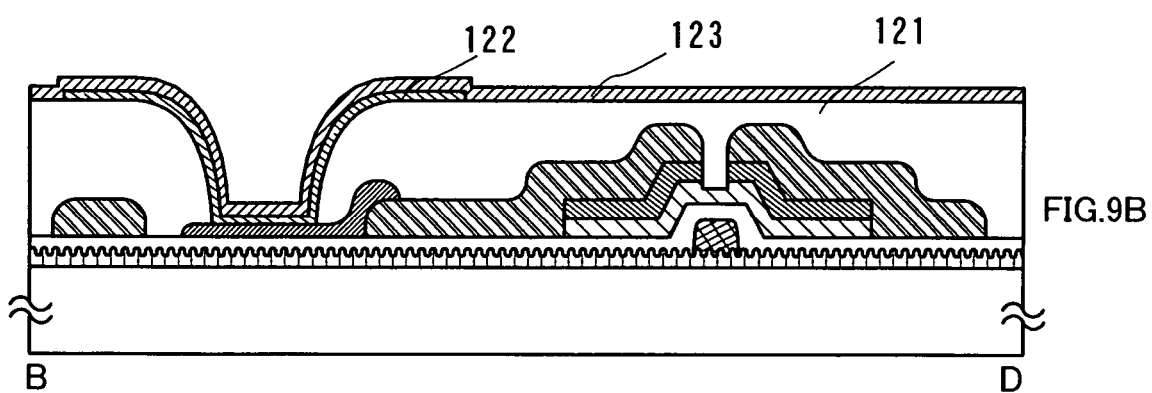

This embodiment of the invention is explained with reference to FIGS. 2A to 10B. In more detail, a method for manufacturing a display device including an inversely staggered thin film transistor, to which the invention is applied, is explained. FIGS. 2A to 8A are top views of a pixel portion of a display device. FIGS. 2B to 8B are cross-sectional views taken along line A-C in FIGS. 2A to 8A and FIGS. 2C to 8C are cross-sectional views taken along line B-D. FIGS. 9A and 9B are cross-sectional views of a display device, and FIG. 10A is a top view. FIG. 10B is a cross-sectional view taken along line L-K (including I-J) in FIG. 10A.

A glass substrate made of barium borosilicate glass, alumino borosilicate glass, or the like; a quartz substrate; a metal substrate; or a plastic substrate which can withstand the process temperature of the manufacturing process is used as a substrate 100. A surface of the substrate 100 may be polished by a CMP method or the like so as to be planarized. Note that an insulating layer may be formed over the substrate 100. The insulating layer is formed using a single layer or a lamination layer of an oxide or nitride material containing silicon by a known method such as a CVD method, a plasma CVD method, a sputtering method, or a spin coating method. Although the insulating layer may not be formed, it has an effect of blocking contaminants or the like from the substrate 100.

Figure 2B:
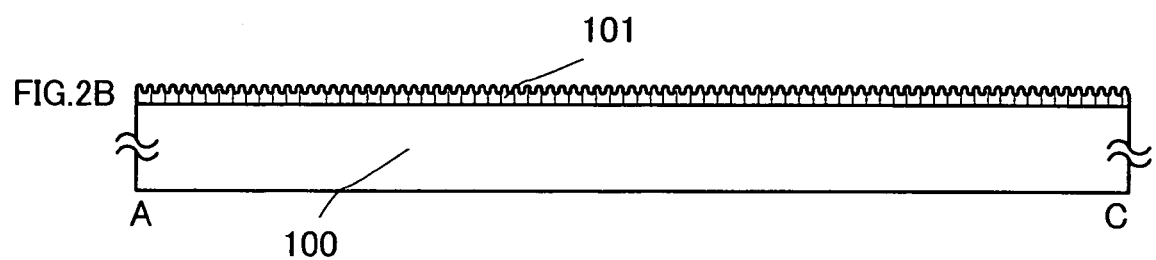
Figure 2C:
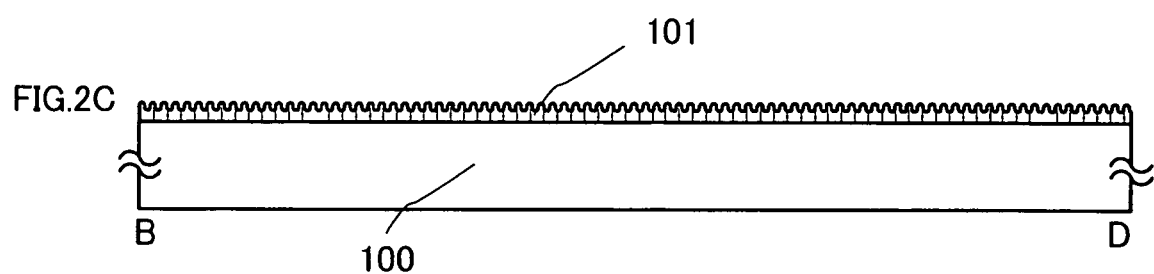

A layer 101 having a rough surface is formed over the substrate 100 (see FIGS. 2A to 2C). The layer 101 having a rough surface has a rough surface with an uneven shape. The layer having a rough surface may be formed as a buffer layer over the substrate. A rough surface may be formed by processing a surface of a material serving as a support like a substrate. The layer having a rough surface may not have continuity as a film. For example, a rough surface may be formed by dispersing a particulate material over a substrate to have an uneven shape. A layer surface may be subjected to physical force or impact to have an uneven shape, or may be partially deformed (partially dissolved or the like) by chemical treatment (surface corrosion with a solution having a corrosive effect, or the like) or by heating to have an uneven shape.

The uneven shape of the rough surface is sufficiently smaller than a droplet diameter of a liquid composition discharged to the rough surface, and a surface area of the rough surface is increased by the existence of the sufficiently small unevenness shape. Thus, the rough surface can look flat on a droplet size scale. A droplet diameter of a liquid composition at the time of attaching to the surface is preferably 1000 or more times larger than the value of surface roughness that is a parameter defining roughness of the surface. In addition, a surface area ratio of the rough surface including the uneven shape to a rough surface region (area excluding an increase in surface area due to the uneven shape) is preferably 1.5 or more. FIGS. 2A to 2C show the uneven shape only schematically. The size or shape thereof is not limited to that shown in FIGS. 2A to 2C.

For the layer having a rough surface, an organic material or an inorganic material may be used, and an insulating material or a conductive material may also be used since the layer may have a function of effectively controlling surface wettability. However, in the case of using a conductive material, after forming a conductive layer, an unnecessary portion needs to be removed using the conductive layer as a mask or insulated by performing oxidation treatment or the like on the unnecessary portion in consideration of its conductivity. For example, in this embodiment, the layer 101 having a rough surface except in formation regions of gate electrode layers 107 and 108 in FIGS. 5A to 5C may be removed by etching or insulated.

The insulating material may be silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant high molecular weight material such as polyimide, aromatic polyamide, or polybenzimidazole; inorganic siloxane-based insulating material which is formed from a siloxane-based material as a starting material and contains a Si—O—Si bond among compounds including silicon, oxygen, and hydrogen; or an organic siloxane-based insulating material in which an organic group such as methyl or phenyl is substituted for hydrogen bonded with silicon. Alternatively, a resin material such as a vinyl resin of polyvinyl alcohol, polyvinylbutyral, or the like, an epoxy resin, a phenol resin, a novolac resin, an acrylic resin, a melamine resin, or a urethane resin is used. Further, an organic material such as benzocyclobutene, parylene, flare, or polyimide, a compound material made by the polymerization of a siloxane-based polymer or the like, a composition material containing a water-soluble homopolymer and a water-soluble copolymer, or the like may be used. Further alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator may be used. The conductive material may be metal such as Ag, Au, Cu, Ni, Pt, Pd, Ir, Rh, W, or Al, sulfide of metal such as Cd or Zn, oxide of Fe, Ti, Si, Ge, Zr, Ba, or the like, or a mixture of the above conductive materials.

Figure 3A:
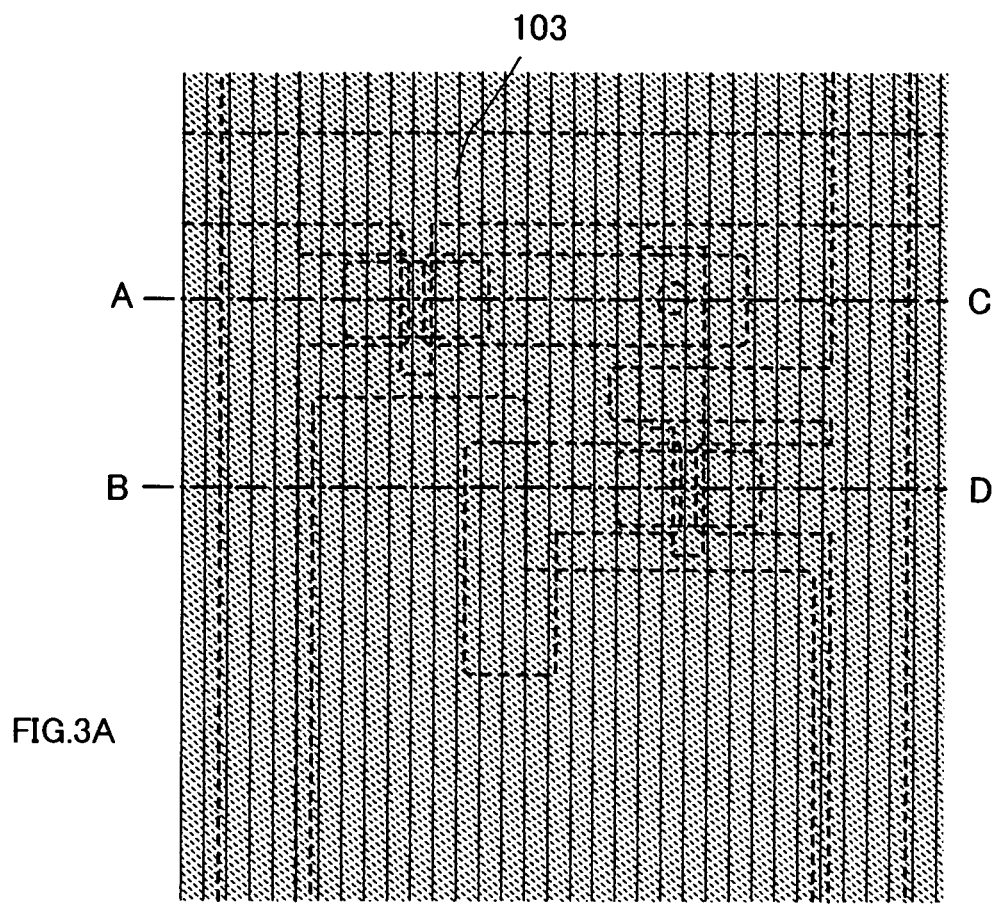
FIGS. 3A to 3C show a method for manufacturing a display device of the present invention.
Figure 3B:
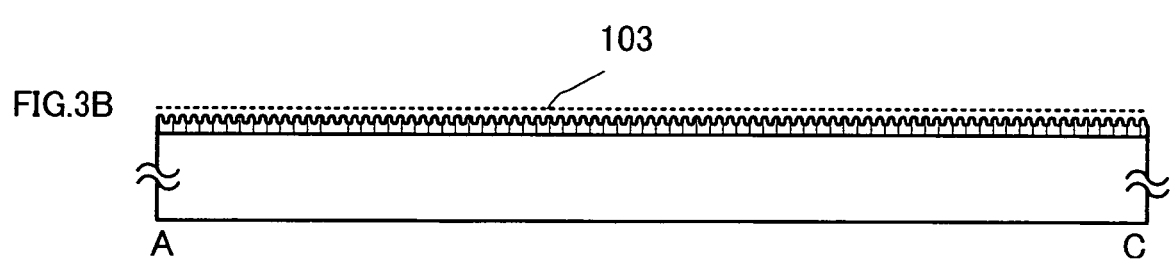
Figure 3C:
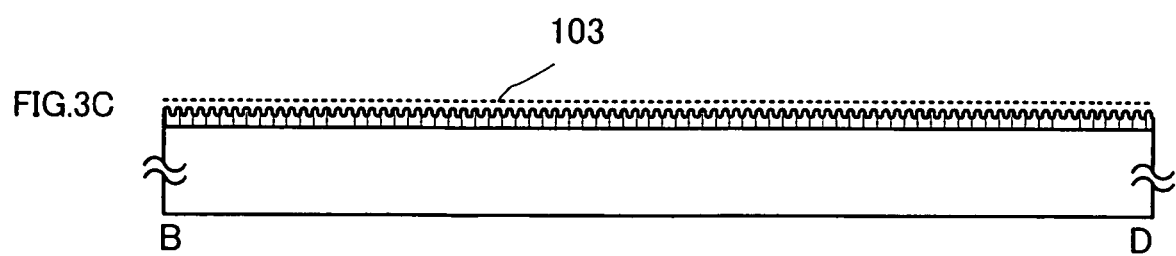
Figure 4A:
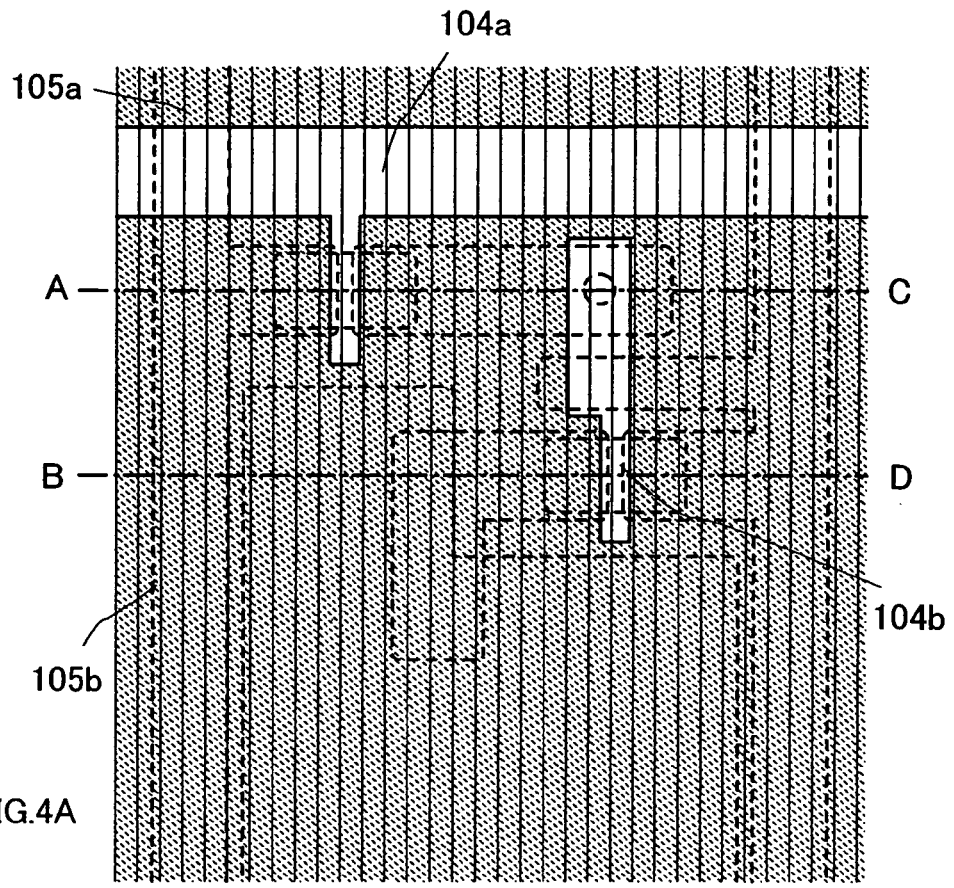
FIGS. 4A to 4C show a method for manufacturing a display device of the present invention.
Figure 4B:
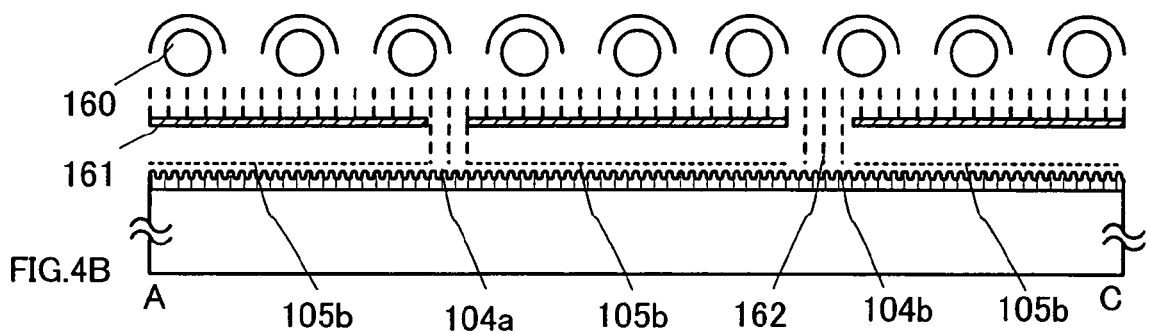
Figure 4C:
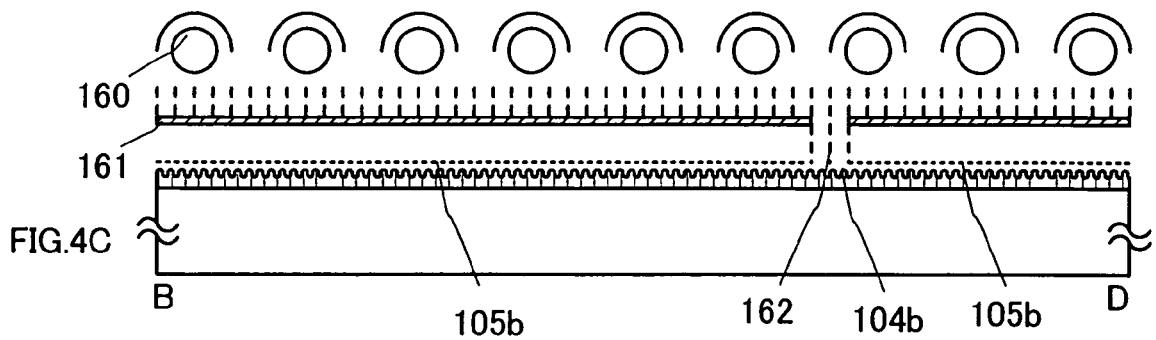
Figure 5A:
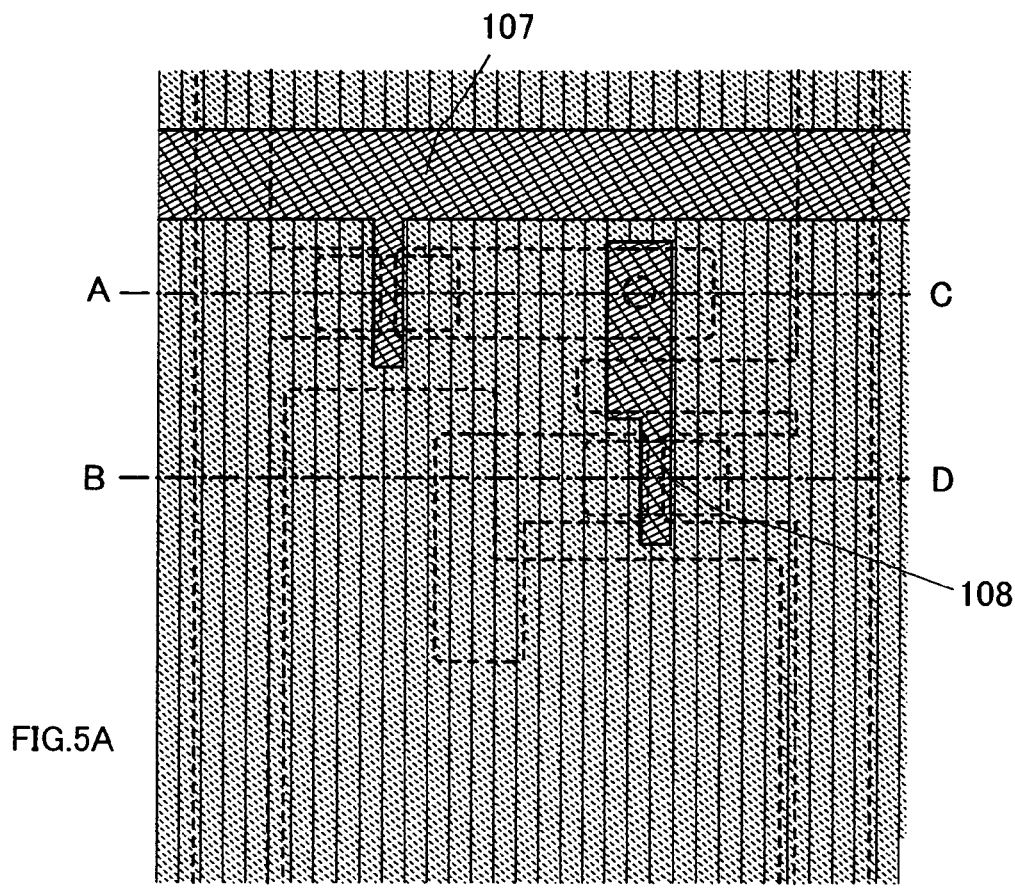
FIGS. 5A to 5C show a method for manufacturing a display device of the present invention.
Figure 5B:
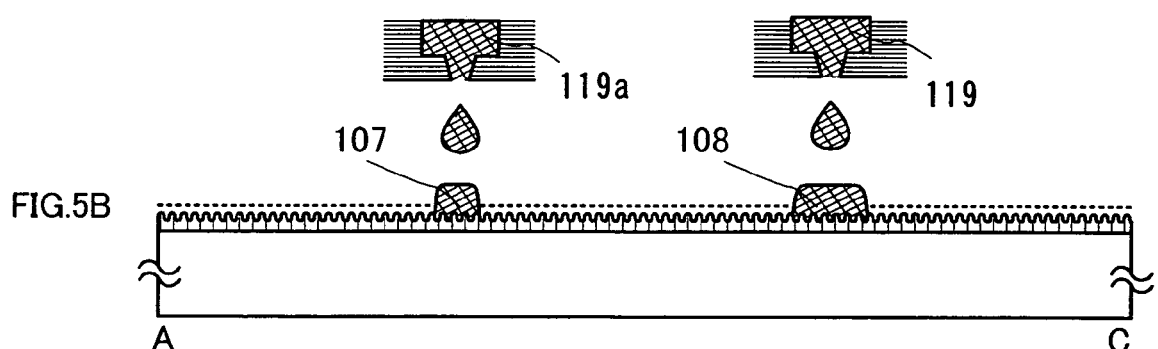
Figure 5C:
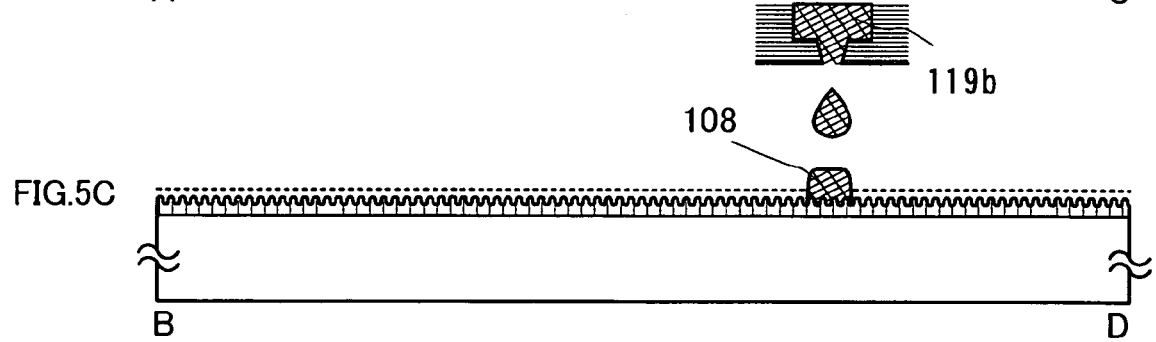
Figure 6A:
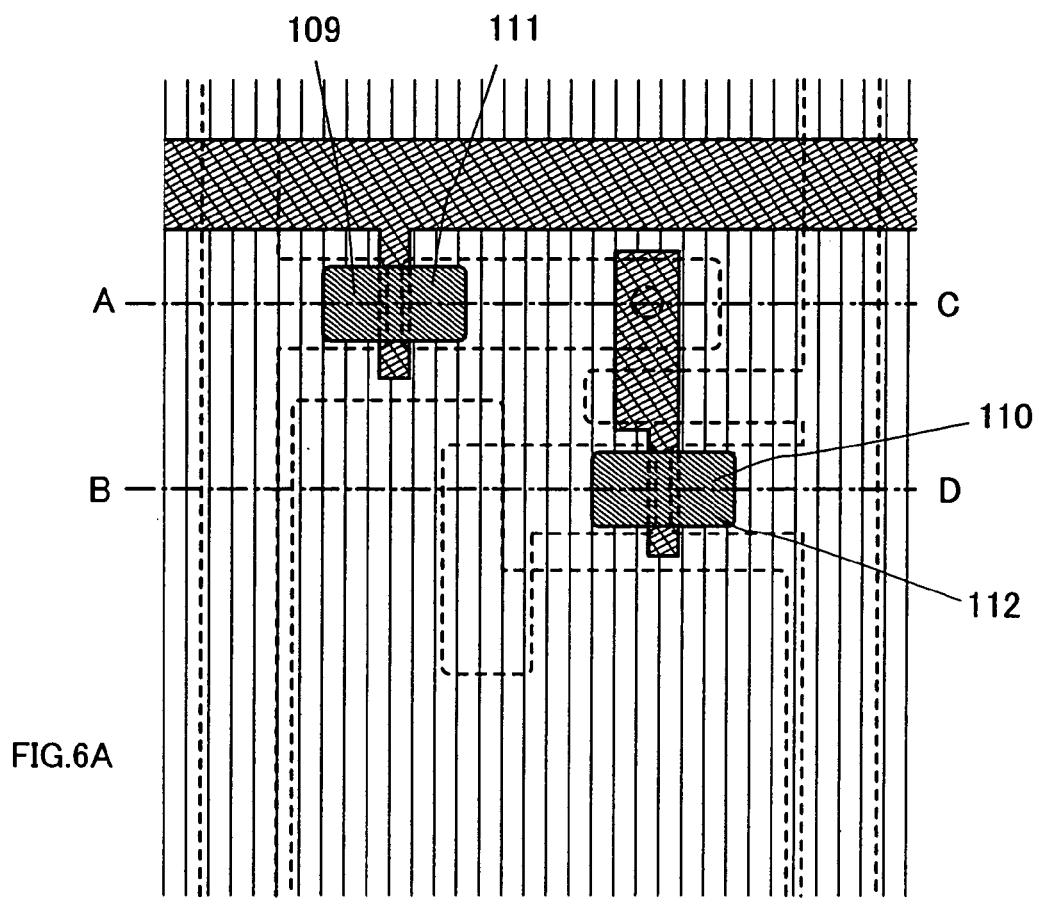
FIGS. 6A to 6C show a method for manufacturing a display device of the present invention.
Figure 6B:
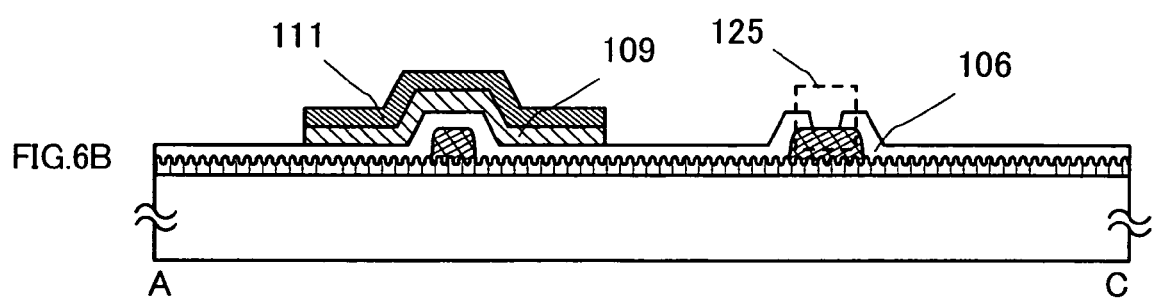
Figure 6C:
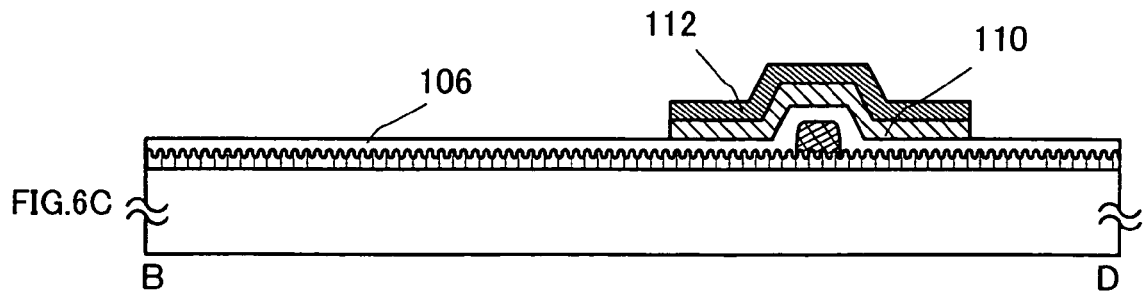
Figure 7A:
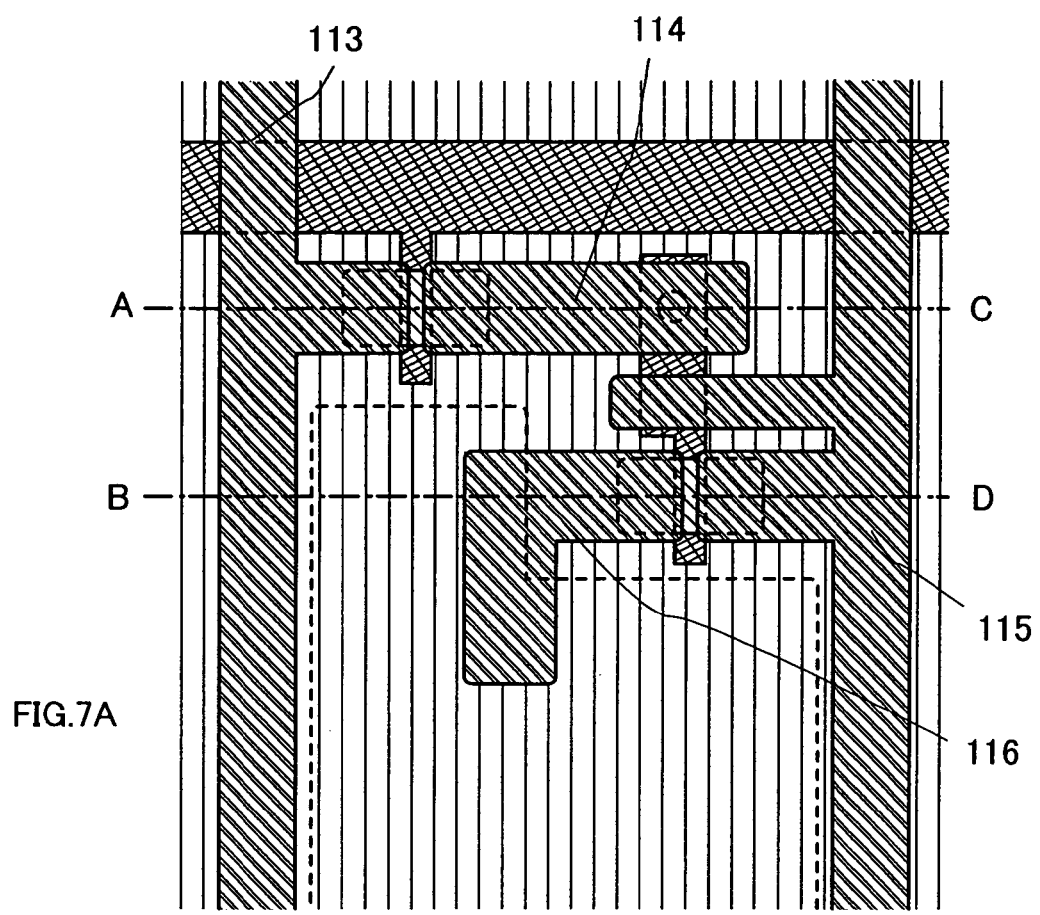
FIGS. 7A to 7C show a method for manufacturing a display device of the present invention.
Figure 7B:
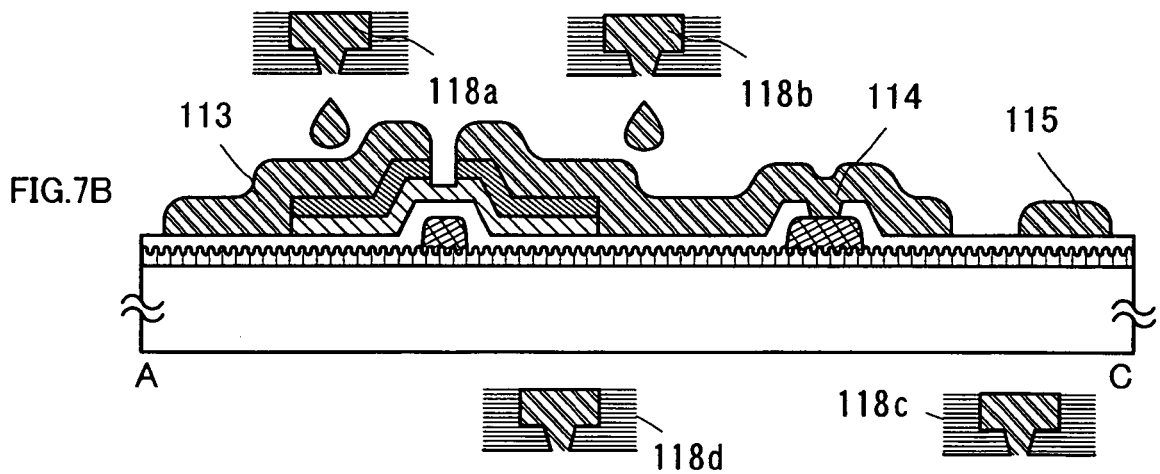
Figure 7C:
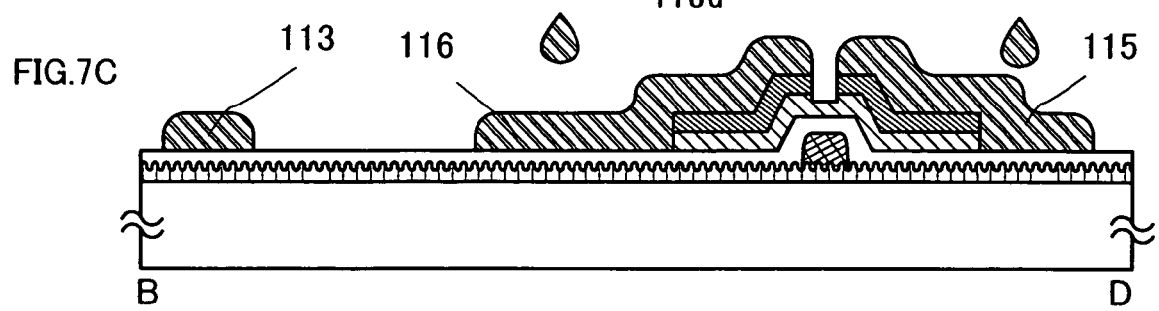
Figure 8A:
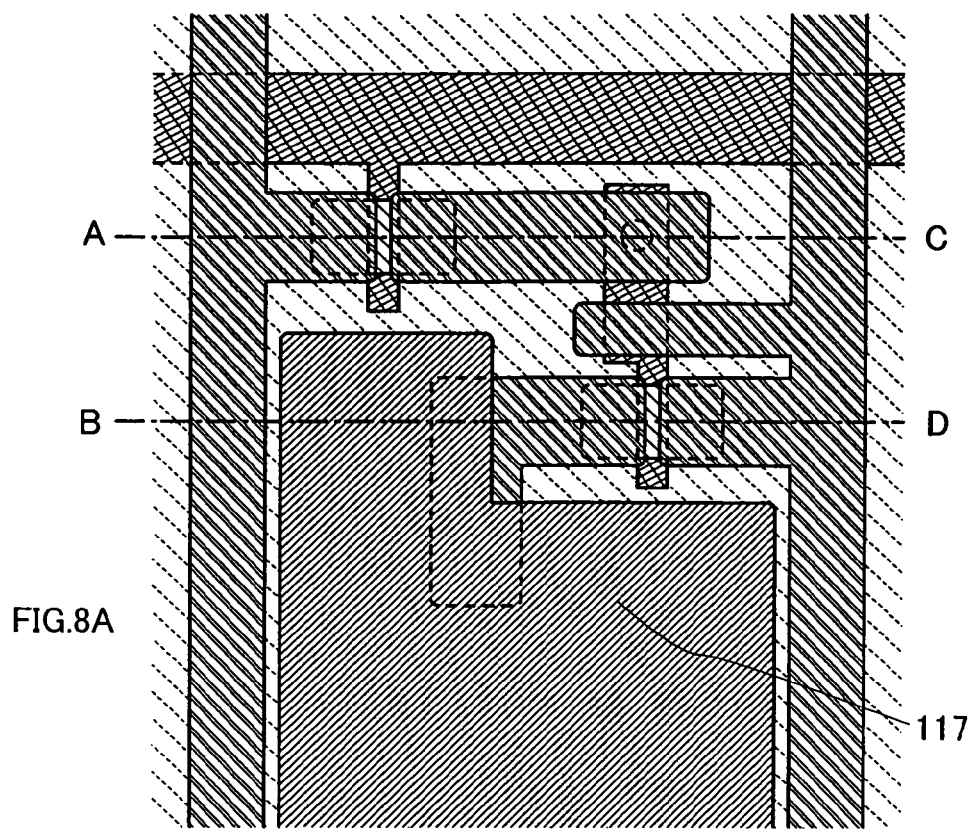
FIGS. 8A to 8C show a method for manufacturing a display device of the present invention.
Figure 8B:
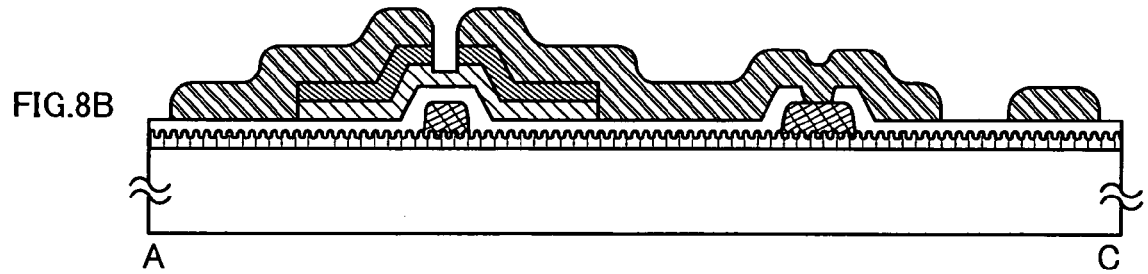
Figure 8C:
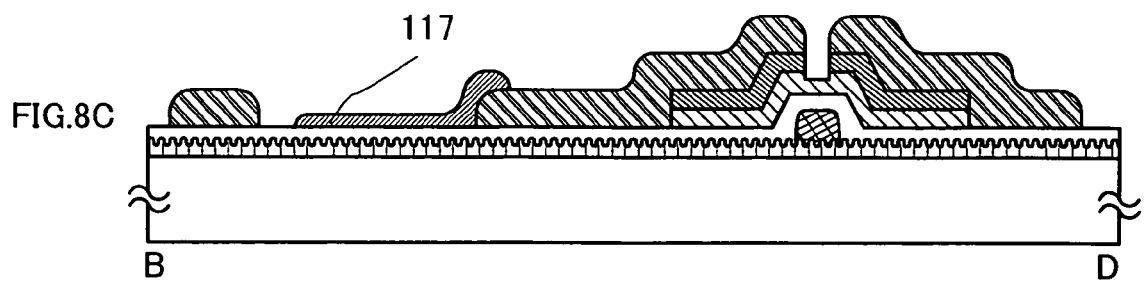

A material 103 having low wettability is formed over the layer 101 having a rough surface (see FIGS. 3A to 3C). In this embodiment, a method for changing wettability by decomposing a surface material and modifying a region surface with light irradiation energy is used as another method for changing and controlling surface wettability.

As the substance having low wettability, a substance containing a fluorocarbon group or a silane coupling agent can be used. In this embodiment, FAS is used as the material 103 having low wettability and an FAS film is formed by a coating method. This wettability is that by a liquid composition containing a conductive material included in a gate electrode layer to be formed in the following step.

The material 103 having low wettability is irradiated with light 162 from a light source 160 using a mask 161. In this embodiment, an ultraviolet lamp is used as the light source 160, and a photomask, which is a quartz substrate provided with a metal film patterned into a desired shape, is used as the mask 161. The light 162 decomposes the material 103 having low wettability with its energy and heightens wettability. By the irradiation with the light 162, high wettability regions 104a and 104b which have relatively high wettability and low wettability regions 105a and 105b which have relatively low wettability are formed over the surface of the layer 101 having a rough surface (see FIGS. 4A to 4C).

Subsequently, the liquid composition containing a conductive material is discharged from droplet discharge apparatuses 119a and 119b to the layer having a rough surface in which wettability is controlled. Since the liquid composition containing a conductive material is in the form of a liquid, it is largely affected by a surface state of a formation region. In this embodiment, treatment for controlling wettability of an application region of the liquid composition containing a conductive material is performed. The layer 101 having a rough surface is formed in an attachment region of the liquid composition to enhance the effect of controlling wettability.

Wettability is also affected by a physical surface shape (surface roughness) in addition to chemical properties of the surface. Over a rough surface having a geometrically uneven shape, there is a larger difference in wettability than over a flat surface. In other words, a low wettability region obtained by forming a material having low wettability by a liquid composition over a surface having high surface roughness exhibits higher liquid repellency against a liquid composition than a low wettability region obtained by forming the same material having low wettability over a flat surface. In the same manner, a high wettability region over a rough surface has higher wettability by a liquid composition and exhibits stronger lyophilic properties than that over a flat surface. Wettability, by a composition containing a conductive material, of the high wettability regions 104a and 104b which have relatively high wettability is heightened since the regions are formed over the rough surface. In the same manner, wettability, by a composition containing a conductive material, of the low wettability regions 105a and 105b which have relatively low wettability is lowered since the regions are formed over the rough surface. Therefore, the high wettability regions 104a and 104b and the low wettability regions 105a and 105b have a large difference in wettability by the composition containing a conductive material. Contact angles of the liquid composition containing a conductive material on the high wettability regions 104a and 104b are preferably 40° or less. Contact angles of the liquid composition containing a conductive material on the low wettability regions 105a and 105b are preferably 150° or more.

Compositions containing a conductive material stay with good adhesiveness in the high wettability regions 104a and 104b which have high wettability by the composition containing a conductive material. On the other hand, compositions containing a conductive material, which are discharged to the low wettability regions 105a and 105b having extremely high liquid-repellency against the composition containing a conductive material, are repelled and cannot stay in the regions. Therefore, the compositions flow into and stay in the high wettability regions 104a and 104b which have extremely high lyophilic properties. The compositions are solidified by baking, drying, or the like to stably form gate electrode layers 107 and 108 (see FIGS. 5A to 5C). In this embodiment, extremely effective wettability control is performed on a region to which the composition containing a conductive material is discharged. Therefore, the composition containing a conductive material can be formed in a self-aligned manner only in a formation region even in the case of using a discharging nozzle having a discharge outlet whose diameter is relatively large and discharging a droplet having a relatively large diameter. Accordingly, a semiconductor device or a display device even having a minute circuit design can be manufactured with high yield. In addition, since a large area can be treated, productivity of a large-sized display device or the like can also be improved.

The gate electrode layers 107 and 108 may be formed using an element of Ag, Au, Ni, Pt, Pd, Ir, Rh, Ta, W, Ti, Mo, Al, and Cu or an alloy material or a compound material containing the element as its main component. Alternatively, a mixture of the element may be used. The gate electrode layers may have not only a single-layer structure but also a laminated structure of two or more layers.

In the case where the gate electrode layers 107 and 108 need to be processed into certain shapes, they may be processed into desired shapes by dry etching or wet etching after forming a mask. The electrode layers can be etched to a tapered shape by using an ICP (Inductively Coupled Plasma) etching method and appropriately controlling the etching condition (the amount of electric power applied to a coiled electrode, the amount of electric power applied to an electrode of a substrate side, the temperature of the electrode of the substrate side, or the like). Note that a chlorine-based gas typified by $Cl_2$, $BCl_3$, $SiCl_4$, $CCl_4$ or the like; a fluorine-based gas typified by $CF_4$, $SF_6$, $NF_3$, or the like; or $O_2$ can be appropriately used for the etching gas.

After forming the gate electrode layers 107 and 108 into a desired pattern, the material having low wettability remaining over the layer having a rough surface may be left or an unnecessary portion may be removed. The removal may be performed by ashing with oxygen or the like, etching, or the like. The gate electrode layers can be used as a mask. In this embodiment, after forming the gate electrode layers 107 and 108, ultraviolet light irradiation is performed to decompose and remove the remaining material having low wettability.

Subsequently, a gate insulating layer 106 is formed over the gate electrode layers 107 and 108. The gate insulating layer 106 may be formed of a known material such as an oxide or nitride material of silicon, and may have a laminated structure or a single-layer structure. In this embodiment, a laminated structure of two layers, a silicon nitride film and a silicon oxide film, is used. Alternatively, a single layer of a silicon oxynitride film or a laminated layer of three or more layers may be used. Preferably, a dense silicon nitride film is used. In the case of using a conductive layer made from silver, copper or the like by a droplet discharge method, diffusion of an impurity is prevented and a surface of the conductive layer is planarized by forming a silicon nitride film or a NiB film thereover as a barrier film. In order to form a dense insulating film with less gate leakage current at a low temperature, a reactive gas containing a rare gas element such as argon may be mixed into the insulating film to be formed.

Subsequently, a semiconductor layer is formed. A semiconductor layer having one conductivity type may be formed as necessary. An NMOS structure having an n-channel TFT provided with an n-type semiconductor layer, a PMOS structure having a p-channel TFT provided with a p-type semiconductor layer, and a CMOS structure having an n-channel TFT and a p-channel TFT can be manufactured. An n-channel TFT or a p-channel TFT can be formed by forming an impurity region in a semiconductor layer by adding an element which imparts conductivity by doping to impart conductivity. The conductivity may be imparted to a semiconductor layer by plasma treatment using a $PH_3$ gas instead of forming the n-type semiconductor layer.

An amorphous semiconductor (hereinafter also referred to as an "AS") manufactured by a vapor phase growth method or a sputtering method using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer. The semiconductor layer can be formed by a known method (a sputtering method, an LPCVD method, a plasma CVD method, or the like).

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region of 0.5 nm to 20 nm can be observed in at least a part of the film. When silicon is contained as the main component, a Raman spectrum is shifted to a lower wavenumber than 520 $cm^{-1}$. A diffraction peak of (111) or (220) to be caused by a silicon crystal lattice is observed in X-ray diffraction. Hydrogen or halogen of at least 1 atomic % or more is contained to terminate a dangling bond. The SAS is formed by glow discharge decomposition (plasma CVD) of a silicide gas. $SiH_4$ is used as a typical silicide gas. Alternatively, $Si_2H_6$, $SiH_2Cl_2$, $SiHCl_3$, $SiCl_4$, $SiF_4$, or the like can also be used as the silicide gas. Further, $F_2$ or $GeF_4$ may be mixed. This silicide gas may be diluted with $H_2$, or $H_2$ and one or more rare gas elements of He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature is preferably 300° C. or less, and the film can still be formed at a temperature from 100° C. to 200° C. It is desirable that an atmospheric constituent impurity such as oxygen, nitrogen, or carbon has a concentration of $1 \times 10^{20}$ $cm^{-3}$ or less as an impurity element taken in the film forming step; specifically, the oxygen concentration is $5\times10^{19}$ cm$^{-3}$ or less, preferably $1\times10^{19}$ cm$^{-3}$ or less. A preferable SAS can be obtained by further promoting lattice distortion by adding a rare gas element such as helium, argon, krypton, or neon to enhance stability. Additionally, as a semiconductor layer, a SAS layer formed using a hydrogen-based gas may be formed over a SAS layer formed using a fluorine-based gas.

The amorphous semiconductor is typified by hydrogenated amorphous silicon, and the crystalline semiconductor is typified by polysilicon. Polysilicon (polycrystalline silicon) includes high-temperature polysilicon which contains polysilicon that is formed under a process temperature of 800° C. or more as the main component, low-temperature polysilicon which contains polysilicon that is formed under a process temperature of 600° C. or less as the main component, and polysilicon which is crystallized by adding an element which promotes crystallization or the like. Naturally, as described above, a semiamorphous semiconductor layer or a semiconductor which includes a crystalline phase in a portion of a semiconductor layer can be used.

In the case where a crystalline semiconductor layer is used as the semiconductor layer, a known method (a laser crystallization method, a thermal crystallization method, a thermal crystallization method using an element promoting crystallization such as nickel, or the like) may be employed as a method for manufacturing the crystalline semiconductor layer. A microcrystalline semiconductor, which is a SAS, can be crystallized by being irradiated with laser light to improve the crystallinity. In the case where an element promoting crystallization is not introduced, hydrogen is released until a concentration of hydrogen contained in an amorphous silicon film becomes $1\times10^{20}$ atoms/cm$^3$ or less by heating the amorphous silicon film at a temperature of 500° C. for one hour in a nitrogen atmosphere before irradiating the amorphous silicon film with laser light. This is because the amorphous silicon film containing much hydrogen is damaged when the film is irradiated with laser light.

Any method can be used for introducing a metal element into the amorphous semiconductor layer as long as the method is capable of making the metal element exist on the surface of or inside the amorphous semiconductor layer. For example, a sputtering method, a CVD method, a plasma treatment method (including a plasma CVD method), an adsorption method, or a method for applying a metal salt solution can be employed. Among them, the method using a solution is simple, easy, and advantageous in terms of easy concentration control of the metal element. It is preferable to form an oxide film by UV light irradiation in an oxygen atmosphere, a thermal oxidation method, a treatment with ozone water or hydrogen peroxide including a hydroxyl radical, or the like in order to improve wettability of the surface of the amorphous semiconductor layer and to spread the aqueous solution over the entire surface of the amorphous semiconductor layer.

Heat treatment and laser light irradiation may be combined to crystallize the amorphous semiconductor layer. Alternatively, one of the heat treatment and the laser light irradiation may be performed plural times.

In addition, a crystalline semiconductor layer may be directly formed over the substrate by a plasma method. Alternatively, a crystalline semiconductor layer may be selectively formed over the substrate by using a linear plasma method.

The semiconductor layer can be formed by a printing method, a dispenser method, a spray method, a spin coating method, a droplet discharge method, or the like using an organic semiconductor material. In this case, since the above etching step is not required, the number of steps can be reduced. A low molecular weight material, a high molecular weight material, or the like is used as the organic semiconductor material, and in addition, a material such as an organic pigment or a conductive high molecular weight material can be used. A π-electron conjugated high molecular weight material having a skeleton including conjugated double bonds is preferably used as the organic semiconductor material used in the present invention. Typically, a soluble high molecular weight material such as polythiophene, polyfluoren, poly(3-alkylthiophene), a polythiophene derivative, or pentacene can be used.

There is a material, which can be treated after the deposition of a soluble precursor to form the semiconductor layer, as the organic semiconductor material applicable to the present invention. Note that polythienylenevinylene, poly(2,5-thienylenevinylene), polyacetyrene, a polyacetyrene derivative, polyallylenevinylene, or the like can be used as such an organic semiconductor material formed by using a precursor.

In converting the precursor into an organic semiconductor, a reaction catalyst such as a hydrogen chloride gas is added in addition to heat treatment. The following can be employed as a typical solvent which dissolves the soluble organic semiconductor material: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

Semiconductor layers 109 and 110 are formed over the gate insulating layer 106. In this embodiment, amorphous semiconductor layers are crystallized to form crystalline semiconductor layers as the semiconductor layers 109 and 110. The crystallization is performed by adding an element which promotes crystallization (also referred to as a catalytic element or a metal element) to the amorphous semiconductor layers and performing heat treatment (at 550° C. to 750° C. for 3 minutes to 24 hours) in a crystallization step. As the element which promotes crystallization, one or more elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In this embodiment, nickel is used.

In order to remove the element which promotes crystallization from the crystalline semiconductor layer or reduce the element, a semiconductor layer containing an impurity element is formed in contact with the crystalline semiconductor layer and used as a gettering sink. The impurity element may be an impurity element imparting n-type conductivity, an impurity element imparting p-type conductivity, or a rare gas element. For example, one or more elements of phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment, a semiconductor layer containing argon is formed as the semiconductor layer containing the impurity element which functions as a gettering sink. The semiconductor layer containing argon is formed over the crystalline semiconductor layer containing the element which promotes crystallization, and heat treatment (at 550° C. to 750° C. for 3 minutes to 24 hours) is performed. The element which promotes crystallization in the crystalline semiconductor layer moves into the semiconductor layer containing argon, and the element which promotes crystallization in the crystalline semiconductor layer is removed or reduced. Thereafter, the semiconductor layer containing argon, which serves as a gettering sink, is removed. An n-type semiconductor layer containing phosphorus (P) which is an impurity element imparting n-type conductivity is formed over the semiconductor layer. The n-type semiconductor layer serves as source and drain regions. In this embodiment, the n-type semiconductor layer is formed using a semi-amorphous semiconductor. The semiconductor layer and the n-type semiconductor layer formed in the above steps are processed into a desired shape to form semiconductor layers 109 and 110 and n-type semiconductor layers 111 and 112 (see FIGS. 6A to 6C).

A mask is formed using an insulating material such as a resist or polyimide by a droplet discharge method. A through hole 125 is formed in a part of the gate insulating layer 106 by an etching process using the mask to partially expose the gate electrode layer 108 formed therebelow (see FIGS. 6A to 6C). The etching process may be performed by either plasma etching (dry etching) or wet etching; however, plasma etching is suitable for treating a large-sized substrate. As an etching gas, a fluorine-based or chlorine-based gas such as $CF_4$, $NF_3$, $Cl_2$, or $BCl_3$ is used, to which an inert gas such as He or Ar may be appropriately added. Alternatively, electric discharge machining may be performed locally when the etching process is performed using atmospheric pressure discharge, in which case a mask layer is not required to be formed over the entire surface.

A mask for processing into a desired shape can be formed by selectively discharging a composition. When the mask is selectively formed in such a way, it becomes possible to simplify the processing step. A resin material such as an epoxy resin, a phenol resin, a novolac resin, an acrylic resin, a melamine resin, or a urethane resin is used for the mask. In addition, the mask may be formed by a droplet discharge method using an organic material such as benzocyclobutene, parylene, flare, or permeable polyimide; a compound material made by the polymerization of a siloxane-based polymer or the like; a composition material containing a water-soluble homopolymer and a water-soluble copolymer; or the like. Alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator may be used. In using whichever material, the surface tension and the viscosity are appropriately controlled by adjusting the concentration of a solvent or adding a surfactant or the like.

In the case of forming the mask for processing in a desired shape by a droplet discharge method in the embodiment, treatment of forming regions having different wettability may be performed on a formation region and the vicinity thereof as pretreatment. In the present invention, when a component such as a conductive layer, an insulating layer, or a mask layer is formed by discharging a droplet with a droplet discharge method, the shape of the component can be controlled by forming a region having low wettability and a region having high wettability by a formation material in a formation region of the component. By performing this treatment on the formation region, a difference of wettability is generated in the formation region, a droplet stays only in a high wettability formation region, and the material can be formed in a desired pattern with good controllability. In the case of using a liquid material, this step is applicable as pretreatment of forming various components (an insulating layer, a conductive layer, a mask layer, a wiring layer, or the like).

Liquid compositions containing conductive material are discharged from droplet discharge apparatuses 118a to 118d to the n-type semiconductor layers 111 and 112. The compositions are solidified through a drying or baking step to form source or drain electrode layers 113 to 116 (see FIGS. 7A to 7C).

The source or drain electrode layer 113 serves also as a source wiring layer, and the source or drain electrode layer 115 serves also as a power supply line. After forming the source or drain electrode layers 113 to 116, the semiconductor layers 109 and 110 and the n-type semiconductor layers 111 and 112 are processed into a desired shape. In this embodiment, a mask is formed by a droplet discharge method, and processing is performed. However, the semiconductor layers and the n-type semiconductor layers may be processed by etching using the source or drain electrode layers as a mask.

The source or drain electrode layers 113 to 116 can be formed similarly as in the case of forming the above-described gate electrode layers 107 and 108. For example, after forming the gate insluting layer 106, a surface of the gate insulating layer 106 can be processed to be a rough surface, and a step of controlling wettability may be performed on the surface. Since wettability can be controlled more effectively by processing the surface of the gate insulating layer 106 to be a rough surface, source or drain electrode layers can be stably formed in a desired shape. In this case, after forming the source or drain electrode layers, an exposed rough surface of the gate insulating layer 106 may be planarized again. The planarization may be performed after forming a first electrode layer 117 in the following step.

As the conductive material for forming the source or drain electrode layers 113 to 116, a composition containing a metal particle of Ag (silver), Au (gold), Cu (copper), W (tungsten), Al (aluminum), or the like as a main component can be used. Further, indium tin oxide (ITO), indium tin oxide containing silicon oxide (ITSO), organic indium, organotin, zinc oxide, titanium nitride, or the like which has a light-transmitting property may be combined.

In the through hole 125 formed in the gate insulating layer 106, the source or drain electrode layer 114 is electrically connected to the gate insulating layer 108. A portion of the source or drain electrode layers form a capacitor element.

By combining with a droplet discharge method, material loss can be prevented and cost can be reduced as compared to the case of entire surface coating by a spin coating method. According to the invention, even when a wiring or the like is designed to be arranged densely and complexly for miniaturization and thinning, the wiring or the like can be stably formed with good adhesiveness.

In addition, an organic material serving as an adhesive may be formed to improve adhesiveness to a conductive layer or an insulating layer by a droplet discharge method as pretreatment. In this case, treatment of forming regions having different wettability may be performed on this material. An organic material (organic resin material) (polyimide, acrylic) or a siloxane material may be used.

Then, the first electrode layer 117 is formed by selectively discharging a composition containing a conductive material over the gate insulating layer 106. When the first electrode layer 117 is formed by discharging a liquid composition containing a conductive material, the surface of the gate insulating layer 106 may be naturally formed to be a rough surface and wettability control may be performed in forming this first electrode layer 117. When light is emitted from a substrate 100 side, the first electrode layer 117 may be formed by forming a predetermined pattern using a composition containing indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), or the like, and by baking the pattern.

Preferably, the first electrode layer 117 is formed of indium tin oxide (ITO), indium tin oxide containing silicon oxide (ITSO), zinc oxide (ZnO), or the like by a sputtering method. It is more preferable to use indium tin oxide containing silicon oxide formed by a sputtering method using a target in which ITO contains silicon oxide of 2% to 10 wt %. In addition, a conductive material in which ZnO is doped with gallium (Ga), or indium zinc oxide (IZO) which is an oxide conductive material containing silicon oxide and being formed using a target in which indium oxide is mixed with zinc oxide (ZnO) of 2 wt % to 20 wt % may be used. After the first electrode layer 117 is formed by a sputtering method, a mask layer may be formed by a droplet discharge method, and may be etched to form a desired pattern. In this embodiment, the first electrode layer 117 is formed of a light-transmitting conductive material by a droplet discharge method. Specifically, it is formed using indium tin oxide or indium tin oxide containing silicon oxide (ITSO).

The first electrode layer 117 can be selectively formed over the gate insulating layer 106 before forming the source or drain electrode layer 116. In this case, the source or drain electrode layer 116 is laminated over the first electrode layer 117 so as to be connected to each other in this embodiment. When the first electrode layer 117 is formed before the source or drain electrode layer 116, the first electrode layer 117 can be formed over a flat formation region. Therefore, the first electrode layer 117 can be formed with good coverage and high planarity since polishing treatment such as CMP can be performed sufficiently.

In addition, an insulating layer to be an interlayer insulating layer may be formed over the source or drain electrode layer 116, and the first electrode layer 117 may be electrically connected to the source or drain electrode layer 116 with a wiring layer. In this case, instead of forming an opening (contact hole) by removing the insulating layer, a material having low wettability by a composition containing an insulating material can be formed over the source or drain electrode layer 116. When the composition containing an insulating material is thereafter applied by a coating method, an insulating layer is formed in a region except a region where the material having low wettability is formed.

After solidifying the composition by heating, drying, or the like to form the insulating layer, the material having low wettability is removed to form an opening. The wiring layer is formed to fill this opening, and the first electrode layer 117 is formed to be in contact with the wiring layer. This method has an effect of simplifying steps since it does not require formation of the opening by etching.

In the case of having a structure in which generated light is emitted to a side opposite to the substrate 100 side or in the case of manufacturing a top emission type EL display panel, a composition which mainly contains metal particles of Ag (silver), Au (gold), Cu (copper), W (tungsten), Al (aluminum), or the like as a main component can be used. Alternatively, the first electrode layer 117 may be formed by forming a transparent conductive film or a light-reflective conductive film by a sputtering method, forming a mask pattern by a droplet discharge method, and then combining with etching processing.

The first electrode layer 117 may be polished by a CMP method or by cleaning with a polyvinyl alcohol-based porous body so that a surface of the first electrode layer 117 is planarized. In addition, after polishing by a CMP method, ultraviolet irradiation, oxygen plasma treatment, or the like may be performed on the surface of the first electrode layer 117.

By the above steps, a TFT substrate for a display panel, in which a bottom gate type TFT is connected to the first electrode layer over the substrate 100, is completed. The TFT in this embodiment is an inverted staggered type.

Subsequently, an insulating layer 121 (also referred to as a partition wall) is selectively formed. The insulating layer 121 is formed to have an opening portion over the first electrode layer 117. In this embodiment, the insulating layer 121 is formed over the entire surface, and etched and processed using a mask of a resist or the like. When the insulating layer 121 is formed by a droplet discharge method, a printing method, a dispenser method, or the like, by which the insulating layer 121 can be formed directly and selectively, processing by etching is not necessarily required. The insulating layer 121 can also be formed to have a desired shape by pretreatment of the present invention.

The insulating layer 121 can be formed of silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant high molecular weight material such as polyimide, aromatic polyamide, or polybenzimidazole; an inorganic siloxane-based insulating material which is formed from a siloxane-based material as a starting material and contains a Si—O—Si bond among compounds including silicon, oxygen, and hydrogen; or an organic siloxane-based insulating material in which an organic group such as methyl or phenyl is substituted for hydrogen bonded with silicon. The insulating layer 121 may also be formed by using a photosensitive or non-photosensitive material such as acrylic or polyimide. The insulating layer 121 preferably has a shape in which a curvature radius changes continuously. Accordingly, coverage of an electroluminescent layer 122 and a second electrode layer 123 to be formed over the insulating layer 121 is improved.

After forming the insulating layer 121 by discharging a composition with a droplet discharge method, a surface of the insulating layer 121 may be planarized by pressing with pressure to improve its planarity. As a pressing method, unevenness may be smoothed by moving a roller-shaped object over the surface, or the surface may be perpendicularly pressed with a flat plate-shaped object. Alternatively, an uneven portion on the surface may be eliminated with an air knife after softening or melting the surface with a solvent or the like. A CMP method may also be used for polishing the surface. This step may be employed in planarizing a surface when unevenness is generated by a droplet discharge method. When the planarity is improved through this step, display unevenness or the like of the display panel can be prevented; therefore, a high-definition image can be displayed.

A light emitting element is formed over the substrate 100 that is a TFT substrate for a display panel (see FIGS. 9A and 9B).

Before forming the electroluminescent layer 122, heat treatment is performed at 200° C. under atmospheric pressure to remove moisture in the first electrode layer 117 and the insulating layer 121 or adsorbing to the surface thereof. It is preferable to perform heat treatment at 200° C. to 400° C., preferably, 250° C. to 350° C. under reduced pressure and to form the electroluminescent layer 122 by a vacuum evaporation method or a droplet discharge method under reduced pressure without exposing to air.

As the electroluminescent layer 122, materials exhibiting light emission of red (R), green (G), and blue (B) are selectively formed by an evaporation method using respective evaporation masks, or the like. The materials exhibiting light emission of red (R), green (G), and blue (B) (low molecular weight materials, high molecular weight materials, or the like) can be formed by a droplet discharge method as in the case of a color filter. The droplet discharge method is preferable since the materials exhibiting R, G, and B light can be separately applied without using a mask. The second electrode layer 123 is laminated over the electroluminescent layer 122, thereby completing a display device having a display function using a light emitting element.

Although not shown, it is effective to provide a passivation film so as to cover the second electrode layer 123. The passivation film which is provided at the time of forming a display device may have a single layer structure or a multi-layer structure. As the passivation film, a single layer of an insulating film containing silicon nitride (SiN), silicon oxide (SiO$_2$), silicon oxynitride (SiON), silicon nitride oxide (SiNO), aluminum nitride (AlN), aluminum oxynitride (AlON), aluminum nitride oxide (AlNO) which contains more nitrogen than oxygen, aluminum oxide, diamond like carbon (DLC), or a nitrogen-containing carbon film (CN$_x$), or a laminated layer of the insulating films can be used. For example, a laminated layer of a nitrogen-containing carbon film (CN$_x$) and silicon nitride (SiN) can be used. Alternatively, an organic material can be used, for example, a laminated layer of a high molecular weight material such as a styrene polymer. In addition, a siloxane material may be used.

At this time, it is preferable to use a film having good coverage as the passivation film. A carbon film, especially a DLC film is effective. The DLC film can be formed at a temperature ranging from room temperature to 100° C.; therefore, the DLC film can be easily formed over an electroluminescent layer having low heat resistance. The DLC film can be formed by a plasma CVD method (typically, an RF plasma CVD method, a microwave CVD method, an electron cyclotron resonance (ECR) CVD method, a heat filament CVD method, or the like), a combustion flame method, a sputtering method, an ion beam deposition method, a laser evaporation method, or the like. A hydrogen gas and a hydrocarbon-based gas (for example, CH$_4$, C$_2$H$_2$, C$_6$H$_6$, or the like) are used as a reaction gas which is used for forming the passivation film. The reaction gas is ionized by glow discharge, and the ions are accelerated to collide with a cathode with negative self bias; accordingly, the passivation film is formed. A CN film may be formed using a C$_2$H$_4$ gas and an N$_2$ gas as the reaction gas. The DLC film has a high blocking effect on oxygen and can suppress oxidation of the electroluminescent layer. Accordingly, the electroluminescent layer can be prevented from oxidizing during the subsequent sealing step.

As shown in FIG. 10B, a sealant 136 is formed and sealing is performed using a sealing substrate 140. Thereafter, a gate wiring layer formed to electrically connect to the gate electrode layer 107 may be connected to a flexible wiring board for external electrical connection. This applies to a source wiring layer formed to electrically connect to the source or drain electrode layer 113 which also serves as a source wiring layer.

Sealing is performed by filling a space between the substrate 100 having the element and the sealing substrate 140 with a filler 135. The space can be filled with the filler by a dropping method as is the case with a liquid crystal material. Instead of the filler 135, the space may be filled with an inert gas such as nitrogen. In addition, by providing a drying agent within the display device, deterioration of the light emitting element due to moisture can be prevented. The position of the drying agent may be either on the sealing substrate 140 side or on the substrate 100 side over which the element is formed. Alternatively, the drying agent may be provided in a depression formed in the substrate, which is also the region provided with the sealant 136. When the drying agent is provided in an area which does not contribute to displaying such as a driver circuit region of the sealing substrate 140 or a wiring region, the aperture ratio is not decreased even when the drying agent is opaque. Alternatively, the filler 135 may be formed to contain an absorbent material to have a function as a drying agent. Accordingly, the display device having a display function using the light emitting element is completed (see FIGS. 10A and 10B).

An FPC 139 is attached to a terminal electrode layer 137 for electrically connecting the inside of the display device to the outside thereof with an anisotropic conductive film 138 so as to be electrically connected to the terminal electrode layer 137.

FIG. 10A is a top view of the display device. As shown in FIG. 10A, a pixel region 150, scanning line driver regions 151a and 151b, and a connecting region 153 are sealed between the substrate 100 and the sealing substrate 140 with the sealant 136, and a signal line driver circuit 152 formed with a driver IC is provided over the substrate 100. The driver circuit region is provided with thin film transistors 133 and 134, and the pixel region is provided with thin film transistors 130 and 131.

In this embodiment, the case where the light emitting element is sealed with a glass substrate is shown. Sealing is treatment for protecting the light emitting element from moisture. Therefore, any of a method in which a light emitting element is mechanically sealed with a cover material, a method in which a light emitting element is sealed with a thermosetting resin or an ultraviolet curable resin, and a method in which a light emitting element is sealed with a thin film of metal oxide, metal nitride, or the like having high barrier capabilities, can be used. As for the cover material, glass, ceramics, plastics, or metal can be used. However, when light is emitted to the cover material side, the cover material needs to have a light-transmitting property. The cover material is attached to the substrate over which the above-mentioned light emitting element is formed with a sealant such as a thermosetting resin or an ultraviolet curable resin, and a sealed space is formed by curing the resin with heat treatment or ultraviolet irradiation treatment. It is also effective to provide an absorbent material typified by barium oxide in the sealed space. The absorbent material may be provided on the sealant or over a partition wall or a peripheral part so as not to block light emitted from the light emitting element. Further, it is also possible to fill a space between the cover material and the substrate over which the light emitting element is formed with a thermosetting resin or an ultraviolet curable resin. In this case, it is effective to add an absorbent material typified by barium oxide in the thermosetting resin or the ultraviolet curable resin.

In this embodiment, although a single gate structure of a switching TFT is shown, a multi-gate structure such as a double gate structure may also be employed. In the case where a semiconductor is manufactured using a SAS or a crystalline semiconductor, an impurity region can be formed by adding an impurity which imparts one conductivity type. In this case, a semiconductor layer may have impurity regions having different concentrations. For example, the semiconductor layer may have a low concentration impurity region in the vicinity of a channel formation region and a region which is overlapped with a gate electrode layer, and may have a high concentration impurity region outside thereof.

As described above, in this embodiment, by forming various patterns directly over a substrate using a droplet discharge method, a display panel can be easily manufactured even using a glass substrate of the fifth generation or later having a side of 1000 mm or more.

In accordance with the invention, a desired pattern can be formed with good adhesiveness. In addition, there is less material loss, and cost reduction can be achieved. Consequently, a high-performance and high-reliability display device can be manufactured with high yield.

Embodiment 3

Figure 17:
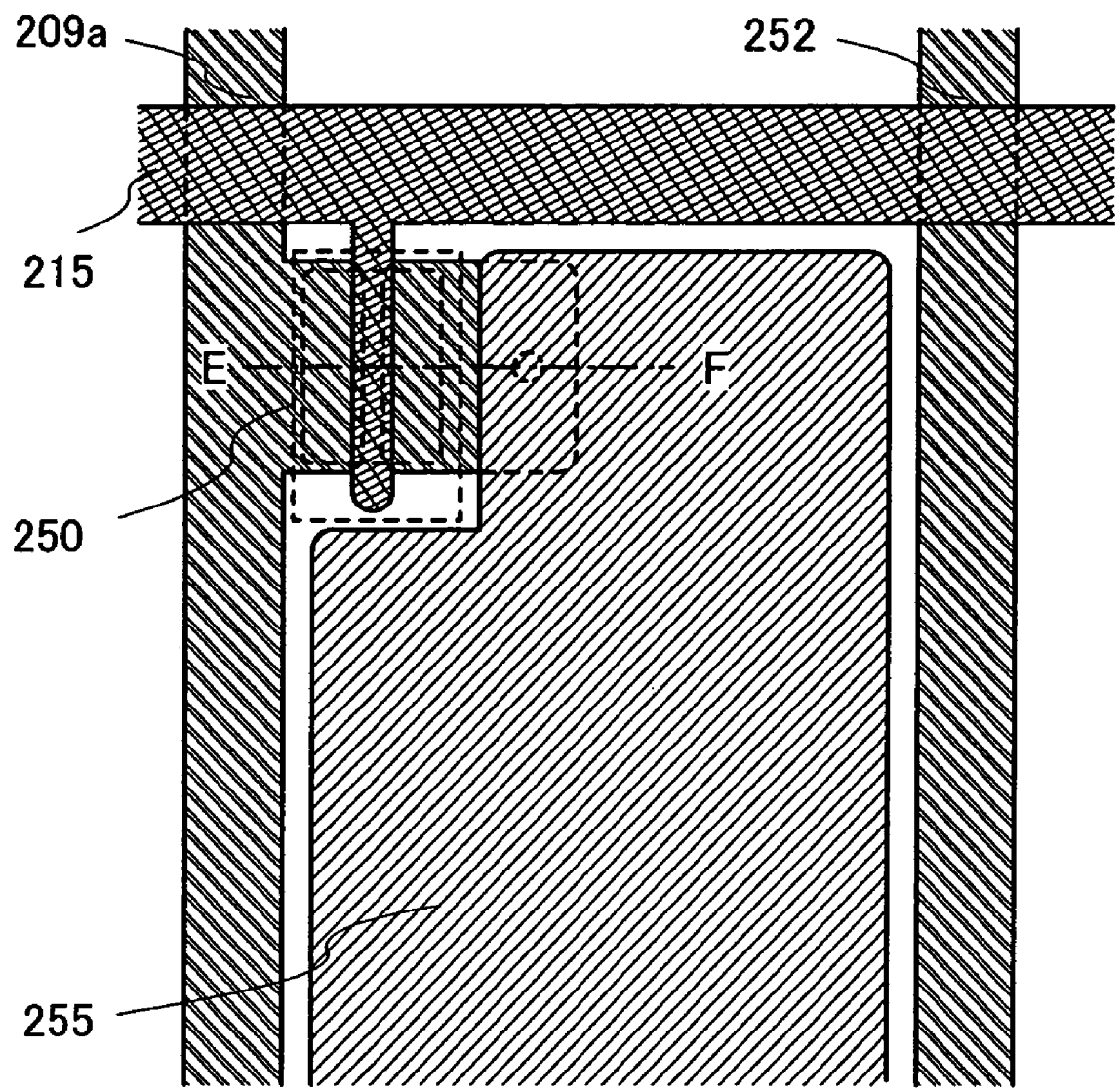
FIG. 17 shows a method for manufacturing a display device of the present invention.
Figure 18A:
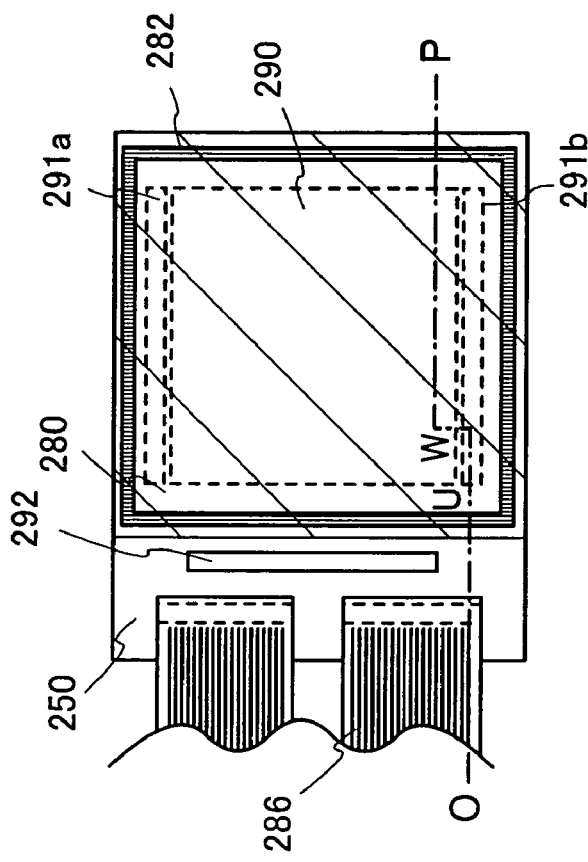
FIGS. 18A and 18B show a display device of the present invention.
Figure 18B:
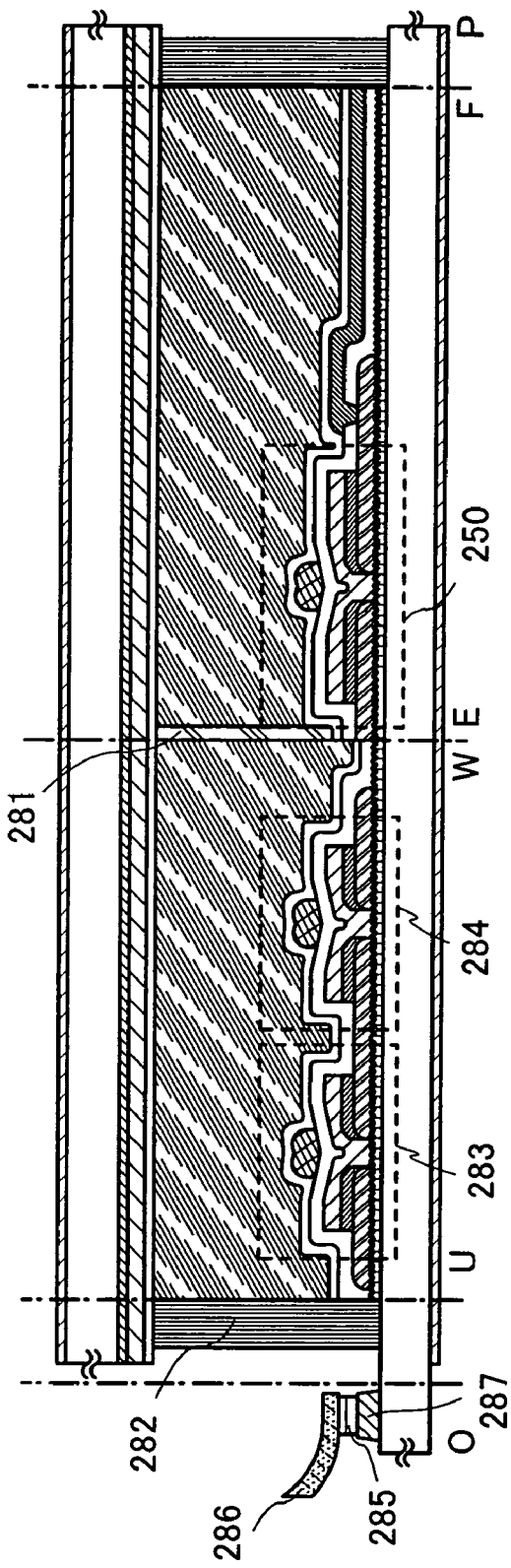

Embodiment 3 of the invention is explained with reference to FIGS. 15A to 18B. In more detail, a method for manufacturing a display device including a top-gate type planar thin film transistor, to which the invention is applied, is explained. FIG. 17 is a top view of a pixel portion of a display device. FIGS. 15A to 16C and 18B are cross-sectional views taken along line E-F in each step. FIG. 18A is also a top view of a display device, and FIG. 18B is a cross-sectional view taken along line O-P (including U-W) in FIG. 18A. Note that an example of a liquid crystal display device using a liquid crystal material as a display device is described. Therefore, repetitive explanation for the same portion or a portion having a similar function is omitted.

A glass substrate made of barium borosilicate glass, alumino borosilicate glass, or the like; a quartz substrate; a metal substrate; or a plastic substrate which can withstand the process temperature of the manufacturing process is used as a substrate 200. Note that an insulating layer may be formed over the substrate 200. The insulating layer is formed of a single layer or a lamination layer using an oxide or nitride material containing silicon by a known method such as a CVD method, a plasma CVD method, a sputtering method, or a spin coating method. Although the insulating layer is not necessarily formed, it has an effect of blocking contaminants or the like from the substrate 200.

A layer 201 having a rough surface is formed over the substrate 200. The layer 201 having a rough surface has a rough surface with an uneven shape. The layer having a rough surface may be formed as a buffer layer over the substrate. A rough surface may be formed by processing a surface of a material serving as a support like a substrate. The layer having a rough surface may not have continuity as a film. For example, a rough surface may be formed by dispersing a particulate material over a substrate to have an uneven shape. A layer surface may be subjected to physical force or impact to have an uneven shape, or may be partially deformed (partially dissolved or the like) by chemical treatment (surface corrosion with a solution having a corrosive effect, or the like) or by heating to have an uneven shape.

The uneven shape of the rough surface is sufficiently smaller than a droplet diameter of a liquid composition discharged to the rough surface, and a surface area of the rough surface is increased by the existence of the sufficiently small uneven shape. A droplet diameter of a liquid composition at the time of attaching to the surface is preferably 1000 or more times larger than the value of surface roughness that is a parameter defining roughness of the surface. In addition, a surface area ratio of the rough surface including the uneven surface to a rough surface region (area excluding an increase in surface area due to the uneven shape) is preferably 1.5 or more. FIGS. 15A to 15D show the uneven shape only schematically. The size or shape thereof is not limited to that shown in FIGS. 15A to 15D.

For the layer having a rough surface, an organic material or an inorganic material may be used, and an insulating material or a conductive material may also be used since the layer may have a function of effectively controlling surface wettability. However, in the case of using a conductive material, after forming a conductive layer, an unnecessary portion needs to be removed using the conductive layer as a mask or insulated by performing oxidation treatment or the like on the unnecessary portion in consideration of its conductivity. For example, in this embodiment, the layer 201 having a rough surface except in formation regions of source or drain electrode layers 209a and 209b in FIG. 15C may be removed by etching or insulated.

The insulating material may be silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant high molecular weight material such as polyimide, aromatic polyamide, or polybenzimidazole; an inorganic siloxane-based insulating material which is formed from a siloxane-based material as a starting material and contains a Si—O—Si bond among compounds including silicon, oxygen, and hydrogen; or an organic siloxane-based insulating material in which an organic group such as methyl or phenyl is substituted for hydrogen bonded with silicon. Alternatively, a resin material such as a vinyl resin of polyvinyl alcohol, polyvinylbutyral, or the like, an epoxy resin, a phenol resin, a novolac resin, an acrylic resin, a melamine resin, or a urethane resin is used. Further, an organic material such as benzocyclobutene, parylene, flare, or polyimide; a compound material made by the polymerization of a siloxane-based polymer or the like; a composition material containing a water-soluble homopolymer and a water-soluble copolymer; or the like may be used. Further alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator may be used. The conductive material may be metal such as Ag, Au, Cu, Ni, Pt, Pd, Ir, Rh, W, or Al, sulfide of metal such as Cd or Zn, oxide of Fe, Ti, Si, Ge, Zr, Ba, or the like, or a mixture of the above conductive materials.

A material 202 having low wettability is formed over the layer 201 having a rough surface (see FIG. 15A). In this embodiment, a method for changing wettability by decomposing a surface material and modifying a region surface with light irradiation energy is used as another method for changing and controlling surface wettability.

As the material having low wettability, a material containing a fluorocarbon chain or a silane coupling agent, or the like can be used. In this embodiment, FAS is used as the material 202 having low wettability and an FAS film is formed by a coating method. This wettability is that by a liquid composition containing a conductive material included in a gate electrode layer to be formed in the following step.

The material 202 having low wettability is irradiated with light 204 from a light source 203 using a mask 205. In this embodiment, an ultraviolet lamp is used as the light source 203, and a photomask which is formed by processing metal into a desired shape over a quartz substrate is used as the mask 205. The light 204 decomposes the material 202 having low wettability with its energy and heightens wettability. By the irradiation with the light 204, high wettability regions 207a and 207b which have relatively high wettability and low wettability regions 206a to 206c which have relatively low wettability are formed over the layer 201 having a rough surface (see FIG. 15B).

Subsequently, the liquid composition containing a conductive material is discharged from a droplet discharge apparatus 208 to the layer having a rough surface in which wettability is controlled. Since the liquid composition containing a conductive material is in the form of a liquid, it is largely affected by a surface state of a formation region. In this embodiment, treatment for controlling wettability of an application region of the liquid composition containing a conductive material is performed. The layer 201 having a rough surface is formed in an attachment region of the liquid composition to enhance the effect of controlling wettability.

Wettability is also affected by a physical surface shape (surface roughness) in addition to chemical properties of the surface. Over a rough surface having a geometrically uneven shape, there is a larger difference in wettability than over a flat surface. In other words, a low wettability region obtained by forming a material having low wettability by a liquid composition over a surface having high surface roughness exhibits higher liquid repellency against a liquid composition than a low wettability region obtained by forming the same material having low wettability over a flat surface. In the same manner, a high wettability region over a rough surface has higher wettability by a liquid composition and exhibits higher lyophilic properties than that over a flat surface. Wettability, by a composition containing a conductive material, of the high wettability regions 207a and 207b which have relatively high wettability is heightened since the regions are formed over the rough surface. In the same manner, wettability, by a composition containing a conductive material, of the low wettability regions 206a to 206c which have low wettability is lowered since the regions are formed over the rough surface. Therefore, the high wettability regions 207a and 207b and the low wettability regions 206a to 206c have a large difference in wettability by the composition containing a conductive material. Contact angles of the liquid composition containing a conductive material on the high wettability regions 207a and 207b are preferably 40° or less. Contact angles of the liquid composition containing a conductive material on the low wettability regions 206a to 206c are preferably 150° or more.

Compositions containing a conductive material stay with good adhesiveness in the high wettability regions 207a and 207b which have high wettability by the composition containing a conductive material. On the other hand, compositions containing a conductive material, which are discharged to the low wettability regions 206a to 206c having extremely high liquid-repellency against the composition containing a conductive material, are repelled and cannot stay in the regions. Therefore, the compositions flow into and stay in the high wettability regions 207a and 207b which have extremely high lyophilic properties. The compositions are solidified by baking, drying, or the like to stably form the source or drain electrode layers 209a and 209b (see FIG. 15C). In this embodiment, extremely effective wettability control is performed on a region to which the composition containing a conductive material is discharged. Therefore, the composition containing a conductive material can be formed in a self-aligned manner only in a formation region even in the case of using a discharging nozzle having a discharge outlet whose diameter is relatively large and discharging a droplet having a relatively large diameter. Accordingly, even a semiconductor device or a display device having a minute circuit design can be manufactured with high yield. In addition, since a large area can be treated, productivity of a large-sized display device or the like can also be improved.

In this embodiment, after forming the source or drain electrode layers 209a and 209b, ultraviolet light irradiation is performed to decompose and remove the material having low wettability remaining over the layer 201 having a rough surface.

An n-type semiconductor layer is formed over the source or drain electrode layers 209a and 209b and etched using a mask formed of a resist or the like. The resist may be formed by a droplet discharge method. A semiconductor layer is formed over the n-type semiconductor layer and processed again using a mask or the like. Accordingly, n-type semiconductor layers 210a and 210b and a semiconductor layer 211 are formed. The n-type semiconductor layer may be formed by laminating a semiconductor layer containing an impurity element which imparts n-type conductivity in higher concentration and a semiconductor layer containing an impurity element which imparts n-type conductivity in lower concentration over the source or drain electrode layer.

Subsequently, a gate insulating layer 212 is formed over the source or drain electrode layers and the semiconductor layer (see FIG. 15D). The gate insulating layer 212 may be formed using a known material such as an oxide or nitride material of silicon, and may have a laminated structure or a single-layer structure. In this embodiment, a laminated layer of three layers, a silicon nitride film, a silicon oxide film, and a silicon nitride film, is used.

Subsequently, a mask formed of a resist or the like is formed over the gate insulating layer 212, and the gate insulating layer 212 is etched to form a through hole 213. In this embodiment, the mask is selectively formed by a droplet discharge method.

A composition containing a conductive material is discharged from a droplet discharge apparatus 214 to the gate insulating layer 212 to form a gate electrode layer 215 (see FIG. 16A). Wettability of a formation region of the gate electrode layer may be controlled at the same time as forming the source or drain electrode layers. In this case, wettability can be effectively controlled by forming a rough surface over the gate insulating layer to be a gate insulating layer having a rough surface and performing wettability control on the rough surface. Accordingly, the gate electrode layer can be further thinly formed in a desired shape. Since a width of the gate electrode layer 215 in a channel direction can be narrowed using the invention, resistance can be lowered and mobility is increased.

A pixel electrode layer 255 is formed by a droplet discharge method. The pixel electrode 255 is electrically connected to the source or drain electrode layer 209b in the previously formed through hole 213. The pixel electrode layer 255 can be formed using a similar material to that of the above-mentioned first electrode layer 117. In the case of manufacturing a light transmitting liquid crystal display panel, the pixel electrode layer may be formed by forming a predetermined pattern with a composition containing indium tin oxide (ITO), indium tin oxide containing silicon oxide (ITSO), zinc oxide (ZnO), tin oxide ($SnO_2$), or the like and by baking the pattern.

FIG. 17 is a top view of a pixel region of a display device. The pixel region is provided with a thin film transistor 250 that is a staggered thin film transistor, the source or drain electrode layer 209a that serves also as a source wiring layer, a capacitor wiring layer 252, the gate electrode layer 215 that serves also as a gate wiring layer, and the pixel electrode layer 255. The thin film transistor 250 may have a multi-gate structure. The source or drain electrode layer of the thin film transistor 250 is electrically connected to the pixel electrode layer 255.

Subsequently, an insulating layer 261 referred to as an orientation film is formed by a dispenser method, a printing method, or a spin coating method to cover the pixel electrode layer 255 and the thin film transistor 250. Note that the insulating layer 261 can be selectively formed by using a screen printing method or an offset printing method. Thereafter, rubbing is performed. Then, a sealant 282 is formed by a droplet discharge method at the periphery of a region where the pixel is formed.

Subsequently, an opposite substrate 266 provided with an insulating layer 263 serving as an orientation film, a colored layer 264 serving as a color filter, a conductive layer 265 serving as an opposite electrode, and a polarizing plate 267 is attached to the substrate 200 having the TFT with a spacer 281 interposed therebetween. By providing a space with a liquid crystal layer 262, a liquid crystal display device can be manufactured (see FIGS. 18A and 18B). A polarizing plate 268 is formed on a side of the substrate 200, not having the TFT. A sealant may be mixed with a filler, and further, the opposite substrate 266 may be provided with a shielding film (black matrix) or the like. Note that a dispenser method (a dropping method) or a dip method (a pumping method) by which a liquid crystal is injected utilizing a capillary phenomenon after attaching the opposite substrate 266 can be used as a method of forming the liquid crystal layer.

Figure 23:
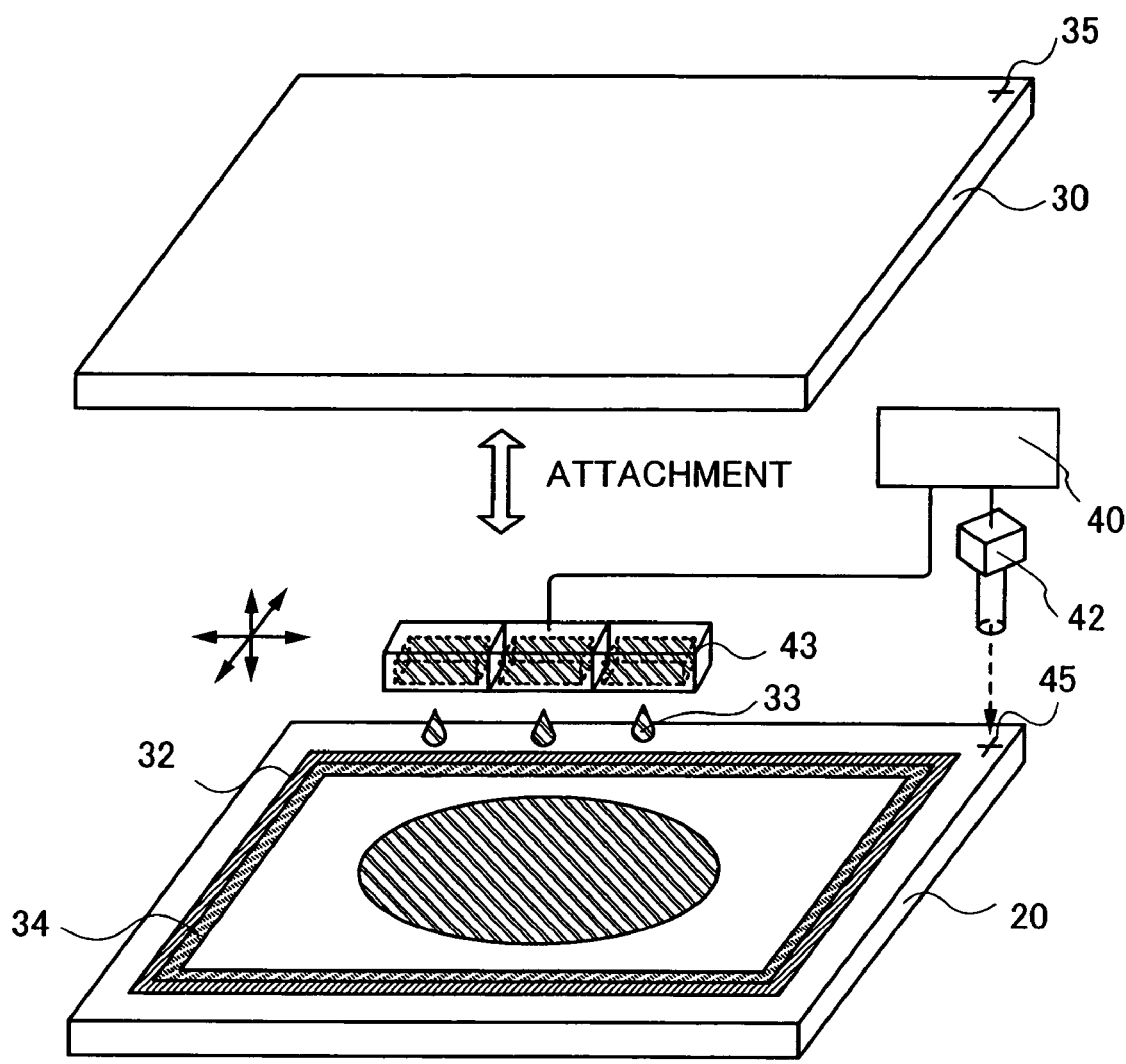
FIG. 23 shows a structure of a droplet dropping apparatus which can be applied to the present invention.

A liquid crystal dropping injection method employing the dispenser method is explained with reference to FIG. 23. In FIG. 23, reference numeral 40 denotes a control device; 42, an imaging means; 43, a head; 33, a liquid crystal; 35 and 45, markers; 34, a barrier layer; 32, a sealant; 30, a TFT substrate; and 20, an opposite substrate. A closed loop is formed with the sealant 32, and the liquid crystal 33 is dropped once or plural times in the closed loop from the head 43. Since the head 43 has a plurality of nozzles, it can drop a large amount of liquid crystal material at one time, which improves throughput. When the liquid crystal material has high viscosity, the liquid crystal material is continuously discharged and attached to a liquid crystal formation region without a break. On the other hand, when the liquid crystal material has low viscosity, the liquid crystal material is intermittently discharged to drop a droplet. At this time, the barrier layer 34 is provided to prevent the sealant 32 and the liquid crystal 33 from reacting with each other. Subsequently, the substrates are attached in vacuum, and then, ultraviolet curing is performed to make the space filled with the liquid crystal. Alternatively, a sealant may be formed on a TFT substrate side, and a liquid crystal may be dropped.

The spacer may be provided by dispersing particles of several micrometers; however, in this embodiment, the spacer is provided by forming a resin film over the entire surface of the substrate and processing it into a desired shape. After coating the substrate with such a spacer material using a spinner, the spacer material is formed into a predetermined pattern by light exposure and developing treatment. Further, the pattern is cured by heating at a temperature of 150° C. to 200° C. with a clean oven. The spacer manufactured in this manner can have different shapes depending on the condition of the light exposure or the developing treatment. It is preferable that the spacer have a pillar shape with a flat top portion since the mechanical strength as a liquid crystal display device can be secured when the opposite substrate is attached to the substrate. The shape of the spacer is not specifically limited, and it may have a shape of a circular cone or a pyramid.

A connection portion is formed to connect the inside of the display device formed through the above steps and an external wiring board. The insulating layer in the connection portion is removed by ashing treatment using an oxygen gas under atmospheric pressure or pressure close to the atmospheric pressure. This treatment is performed by using an oxygen gas and one or more gases of hydrogen, $CF_4$, $NF_3$, $H_2O$, and $CHF_3$. In this step, the ashing treatment is performed after sealing with the opposite substrate to prevent damage or destruction due to static electricity; however, the ashing treatment may be performed at any timing when there are few effects of static electricity.

Subsequently, a terminal electrode layer 287 which is electrically connected to the pixel portion is provided with an FPC 286 which is a wiring board for connection with an anisotropic conductive layer 285 interposed therebetween (see FIG. 18B). The FPC 286 has a function of transmitting a signal or an electric potential from the external. Through the above-mentioned steps, a liquid crystal display device having a display function can be manufactured.

FIG. 18A is a top view of the liquid crystal display device. As shown in FIG. 18A, a pixel region 290 and scanning line driver regions 291*a* and 291*b* are sealed between the substrate 200 and the opposite substrate 280 with the sealant 282, and a signal line driver circuit 292 formed with a driver IC is provided over the substrate 200. A driver circuit having thin film transistors 283 and 284 is provided in a driver region.

Since the thin film transistors 283 and 284 are n-channel thin film transistors, an NMOS circuit including the thin film transistors 283 and 284 is provided as a peripheral driver circuit in this embodiment.

In this embodiment, an NMOS structure is used in a driver circuit region so as to function as an inverter. In the case of thus using only a PMOS structure or an NMOS structure, gate electrode layers of a part of TFTs are connected to a source or drain electrode layer thereof.

In this embodiment, although a switching TFT has a single gate structure, it may have a double gate structure or a multi-gate structure. In the case where a semiconductor is manufactured using a SAS or a crystalline semiconductor, an impurity region can be formed by adding an impurity which imparts one conductivity type. In this case, the semiconductor layer may have impurity regions having different concentrations. For example, the semiconductor layer may have a low concentration impurity region in the vicinity of a channel formation region and a region which is overlapped with a gate electrode layer, and may have a high concentration impurity region outside thereof.

As described above, the process can be simplified in this embodiment. Also, by forming various kinds of components (parts) directly over a substrate using a droplet discharge method, a display panel can be easily manufactured even using a glass substrate of the fifth generation or later having a side of 1000 mm or more.

In accordance with the present invention, a component of a display device can be formed in a desired pattern with good controllability. Further, there is less material loss and cost reduction can be achieved. Hence, a high-performance and high-reliability liquid crystal display device can be manufactured with high yield.

Embodiment 4

A thin film transistor can be formed using the present invention, and a display device can be formed using the thin film transistor. In addition, when a light emitting element is used and an n-channel transistor is used as a transistor which drives the light emitting element, light emitted from the light emitting element performs any one of bottom emission, top emission, and dual emission. Here, a lamination structure of the light emitting element corresponding to each emission type will be described with reference to FIGS. 12A to 12C.

Further, in this embodiment, channel protective thin film transistors 461, 471, and 481 using the present invention are used. The thin film transistor 481 is provided over a layer 482 having a rough surface over a light-transmitting substrate 480 and includes a gate electrode layer 493, a gate insulating film 497, a semiconductor layer 494, n-type semiconductor layers 495a and 495b, source or drain electrode layers 487a and 487b, and a channel protective layer 496. A material having low wettability by a liquid conductive material is selectively formed over the surface of the layer 482 having a rough surface with an uneven shape to control wettability in the vicinity of a formation region of the gate electrode layer 493. The unevenness of the layer 482 having a rough surface can control wettability of a low wettability region and a high wettability region over the surface of the layer 482 having a rough surface to have a large difference. Accordingly, the gate electrode layer 493 can be formed to have a desired shape with good controllability, and a formation defect is not caused even in a precise and thin wiring pattern.

In this embodiment, a crystalline semiconductor layer is used as the semiconductor layer, and an n-type semiconductor layer is used as a semiconductor layer having one conductivity type. Instead of forming the n-type semiconductor layer, the semiconductor layer may be provided with conductivity by plasma treatment using a $PH_3$ gas. The semiconductor layer is not limited to this embodiment, and an amorphous semiconductor layer can be used as in Embodiment 1. In the case of using a crystalline semiconductor layer of polysilicon or the like as in this embodiment, an impurity region having one conductivity type may be formed by introducing (adding) an impurity into the crystalline semiconductor layer without forming the semiconductor layer having one conductivity type. Further, an organic semiconductor of pentacene or the like can be used. When an organic semiconductor is selectively formed by a droplet discharge method or the like, the processing step can be simplified.

In the embodiment, an amorphous semiconductor layer is crystallized to form a crystalline semiconductor layer as the semiconductor layer 494. In the crystallizing step, the amorphous semiconductor layer is doped with an element which promotes crystallization (also referred to as a catalytic element or a metal element), and heat treatment (at a temperature of 550° C. to 750° C. for 3 minutes to 24 hours) is performed to crystallize the amorphous semiconductor layer. As the element which promotes crystallization, one or more elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In this embodiment, nickel is used.

In order to remove the element which promotes crystallization from the crystalline semiconductor layer or reduce the element, a semiconductor layer containing an impurity element is formed in contact with the crystalline semiconductor layer and used as a gettering sink. The impurity element may be an impurity element imparting n-type conductivity, an impurity element imparting p-type conductivity, or a rare gas element. For example, one or more elements of phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment, an n-type semiconductor layer containing phosphorus (P) which is an impurity element imparting n-type conductivity is formed as the semiconductor layer containing the impurity element which functions as a gettering sink. The n-type semiconductor layer is formed over the crystalline semiconductor layer containing the element which promotes crystallization, and a heat treatment (at a temperature of 550° C. to 750° C. for 3 minutes to 24 hours) is performed. The element which promotes crystallization in the crystalline semiconductor layer moves into the n-type semiconductor layer, and the element which promotes crystallization in the crystalline semiconductor layer is removed or reduced to form the semiconductor layer 494. On the other hand, the n-type semiconductor layer becomes an n-type semiconductor layer containing the metal element that is the element which promotes crystallization and is then processed into a desired shape to form n-type semiconductor layers 495a and 495b. The n-type semiconductor layers 495a and 495b function as gettering sinks of the semiconductor layer 494 and also function as source or drain regions directly.

In this embodiment, a crystallizing step and a gettering step for the semiconductor layer are performed by a plurality of heat treatments; however, the crystallizing step and gettering step can be performed by one heat treatment. In this case, the heat treatment may be performed after forming an amorphous semiconductor layer, adding an element which promotes crystallization, and forming a semiconductor layer functioning as a gettering sink.

In the embodiment, a gate insulating layer is formed by laminating a plurality of layers, and the gate insulating film 497 has a two-layered structure formed by sequentially laminating a silicon nitride oxide film and a silicon oxynitride film over the gate electrode layer 493. The insulating layers to be formed are preferably formed continuously at the same temperature in the same chamber by changing reaction gases while maintaining a vacuum state. When the layers are continuously laminated while maintaining the vacuum state, an interface between the laminated films can be prevented from being contaminated.

The channel protective layer 496 may be formed by dropping polyimide, polyvinyl alcohol, or the like by a droplet discharge method. As a result, a light exposure step can be omitted. The channel protective layer may be formed from a film of one or a plurality of an inorganic material (silicon oxide, silicon nitride, silicon oxynitride, silicon nitride oxide, or the like), a photosensitive or non-photosensitive organic material (an organic resin material) (polyimide, acrylic, polyamide, polyimide amide, a resist, benzocyclobutene, or the like), a low dielectric constant material, and the like; a laminated layer of such films; or the like. Alternatively, a siloxane material may be used. As a manufacturing method, a vapor phase growth method such as a plasma CVD method or a thermal CVD method, or a sputtering method can be used. A droplet discharge method, a dispenser method, or a printing method (a method for forming a pattern, such as screen printing or offset printing) can also be used. An SOG film obtained by a coating method can also be used.

First, the case of emitting light to a substrate 480 side, in other words, the case of bottom emission, is explained with reference to FIG. 12A. In this case, a first electrode layer 484 in contact with the source or drain electrode layer 487b to be electrically connected to the thin film transistor 481, an electroluminescent layer 485, and a second electrode layer 486 are sequentially laminated. The substrate 480 through which light passes is required to transmit at least visible light. Next, the case of emitting light to the side opposite to a substrate 460, in other words, the case of top emission, is explained with reference to FIG. 12B. The thin film transistor 461 can be formed in a similar manner to the above described thin film transistor.

A source or drain electrode layer 462 electrically in contact with the thin film transistor 461 is in contact with a first electrode layer 463 to electrically connect the thin film transistor 461 to the first electrode layer 463. The first electrode layer 463, an electroluminescent layer 464, and a second electrode layer 465 are sequentially laminated. The source or drain electrode layer 462 is a reflective metal layer and reflects light, which is emitted from a light emitting element, upward as indicated by an arrow. The source or drain electrode layer 462 and the first electrode layer 463 are laminated, and therefore, when the first electrode layer 463 is formed using a light-transmitting material and transmits light therethrough, the light is reflected by the source or drain electrode layer 462 and is then emitted to the opposite side of the substrate 460. Naturally, the first electrode layer 463 may be formed using a reflective metal layer. Since light generated in the light emitting element is emitted through the second electrode layer 465, the second electrode layer 465 is formed using a material which transmits at least visible light. Lastly, the case of emitting light through both a substrate 470 side and an opposite side, in other words, the case of dual emission, is explained with reference to FIG. 12C. The thin film transistor 471 is also a channel protective thin film transistor. A source or drain electrode layer 475 electrically connected to a semiconductor layer of the thin film transistor 471 is electrically connected to a first electrode layer 472. The first electrode layer 472, an electroluminescent layer 473, and a second electrode layer 474 are sequentially laminated. When both the first electrode layer 472 and the second electrode layer 474 are formed using a material which transmits at least light in the visible region or formed to have such thicknesses that can transmit light, the dual emission is realized. In this case, an insulating layer and the substrate 470 through which light passes are also required to transmit at least light in the visible region.

Modes of light emitting elements that can be applied to this embodiment are shown in FIGS. 14A to 14D. Each light emitting element has a structure in which an electroluminescent layer 860 is interposed between a first electrode layer 870 and a second electrode layer 850. It is necessary to select materials for the first and second electrode layers in consideration of a work function. Each of the first and second electrode layers can serve as either an anode or a cathode depending on a pixel structure. In this embodiment, it is preferable that the first electrode layer serve as a cathode and the second electrode layer serve as an anode, since polarity of a driver TFT is an n-channel type. When the polarity of the driver TFT is a p-channel type, it is preferable that the first electrode layer serve as an anode and the second electrode layer serve as a cathode.

FIGS. 14A and 14B show the case where the first electrode layer 870 is an anode and the second electrode layer 850 is a cathode, and therefore, the electroluminescent layer 860 is preferably formed by sequentially laminating a buffer layer 804 formed of a lamination of an HIL (hole injection layer) and an HTL (hole transport layer), an EML (emission layer) 803, a buffer layer 802 formed of a lamination of an ETL (electron transport layer) and an EIL (electron injection layer), and a second electrode layer 850 over the first electrode layer 870. FIG. 14A shows a structure in which light is emitted through the first electrode layer 870, in which the first electrode layer 870 is formed using an electrode layer 805 that is made from a light-transmitting conductive oxide material, and in which the second electrode layer is formed by sequentially laminating an electrode layer 801 containing alkali metal or alkaline earth metal such as LiF or MgAg and an electrode layer 800 made from a metal material such as aluminum over the electroluminescent layer 860. FIG. 14B shows a structure in which light is emitted through the second electrode layer 850, in which the first electrode layer includes an electrode layer 807 made from metal such as aluminum or titanium or a metal material containing the metal and nitrogen at a concentration in stoichiometric proportion or less; and an electrode layer 806 made from a conductive oxide material that contains 1 atomic % to 15 atomic % silicon oxide. The second electrode layer is formed by sequentially laminating the electrode layer 801 containing the alkali metal or the alkaline earth metal such as LiF or MgAg and the electrode layer 800 made from the metal material such as aluminum over the electroluminescent layer 860. The thicknesses of the electrode layers are set to be 100 nm or less so as to transmit light; therefore, light can be emitted through the second electrode layer 850.

FIGS. 14C and 14D show the case where the first electrode layer 870 is a cathode and the second electrode layer 850 is an anode. The electroluminescent layer 860 is preferably formed by sequentially laminating a buffer layer 802 formed of a lamination of an EIL (electron injection layer) and an ETL (electron transport layer), an EML (emission layer) 803, a buffer layer 804 formed of a lamination of an HTL (hole transport layer) and an HIL (hole injection layer), and a second electrode layer 850 which is an anode over the cathode. FIG. 14C shows the case where light is emitted through the first electrode layer 870, in which the first electrode layer 870 is formed by sequentially laminating the electrode layer 801 containing alkali metal or alkaline earth metal such as LiF or MgAg and the electrode layer 800 made from a metal material such as aluminum over the electroluminescent layer 860. The thicknesses of the electrode layers are set to be 100 nm or less to transmit light; accordingly, light can be emitted through the first electrode layer 870. The second electrode layer is formed by sequentially laminating an electrode layer 806 made from a conductive oxide material containing 1 atomic % to 15 atomic % silicon oxide and an electrode layer 807 made from metal such as aluminum or titanium or a metal material containing the metal and nitrogen at a concentration in stoichiometric proportion or less over the electroluminescent layer 860. FIG. 14D shows the case where light is emitted through the second electrode layer 850, in which the first electrode layer 870 is formed by sequentially laminating the electrode layer 801 containing alkali metal or alkaline earth metal such as LiF or MgAg and the electrode layer 800 formed using a metal material such as aluminum over the electroluminescent layer 860. The thicknesses of the electrode layers are set to be thick so that light generated in the electroluminescent layer 860 can be reflected by the first electrode layer 870. The second electrode layer 850 is formed using the electrode layer 805 that is made from a conductive oxide material which transmits at least visible light. Further, the electroluminescent layer can be formed with a single layer structure or a mixed structure, in addition to the above laminated structure.

As the electroluminescent layer, materials exhibiting light emission of red (R), green (G), and blue (B) are selectively formed by an evaporation method using respective evaporation masks, or the like. The materials exhibiting light emission of red (R), green (G), and blue (B) (low molecular weight materials, high molecular weight materials, and the like) can be formed by a droplet discharge method as in the case of a color filter. The droplet discharge method is preferable since the materials exhibiting R, G, and B light can be separately applied without using a mask.

In the case of the top emission using light-transmitting ITO or ITSO for the second electrode layer, BzOs—Li in which a benzoxazole derivative (BzOs) is doped with Li, or the like can be used. Also, for instance, as the EML, $Alq_3$ doped with a dopant corresponding to respective light emission colors of R, G, and B (DCM or the like in the case of R, and DMQD or the like in the case of G) may be used.

Note that a material of the electroluminescent layer are not limited to the above materials. For example, hole injecting properties can be enhanced by co-evaporation of oxide such as molybdenum oxide ($MoO_x$: x=2 to 3) with α-NPD or rubrene as substitute for CuPc or PEDOT. In addition, an organic material (including a low molecular weight material or a high molecular weight material) or a composite material of an organic material and an inorganic material can be used as a material for the electroluminescent layer. Materials for forming the light emitting element are described in detail below.

As a particularly highly electron transport material among charge injection transport materials, for example, metal complexes having a quinoline skeleton or a benzoquinoline skeleton, such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), and bis(2-methyl-8-quinolinolato)-4-phenylphenolato-aluminum (abbr.: BAlq) can be given. As a highly hole transporting material, for example, aromatic amine based compounds (i.e., one having a benzene ring-nitrogen bond), such as 4,4'-bis[N-(1-naphthyl)-N-phenylamino]biphenyl (abbr.: α-NPD), 4,4'-bis[N-(3-methylphenyl)-N-phenylamino]biphenyl (abbr.: TPD), 4,4',4"-tris(N,N-diphenylamino)triphenylamine (abbr.: TDATA); and 4,4',4"-tris[N-(3-methylphenyl)-N-phenylamino]triphenylamine (abbr.: MTDATA) can be given.

As a particularly highly electron injecting material among charge injection transport materials, compounds of alkali metal or alkaline earth metal such as lithium fluoride (LiF), cesium fluoride (CsF), and calcium fluoride ($CaF_2$) can be given. In addition, a mixture of a highly electron transporting material such as $Alq_3$ and alkaline earth metal such as magnesium (Mg) may be used.

As a highly hole injecting material among charge injection transport materials, for example, metal oxide such as molybdenum oxide ($MoO_x$), vanadium oxide ($VO_x$), ruthenium oxide ($RuO_x$), tungsten oxide ($WO_x$), or manganese oxide ($MnO_x$) can be given. Besides these, phthalocyanine based compounds such as phthalocyanine ($H_2Pc$) and copper phthalocyanine (CuPc) can be given.

Light emitting layers having different light emission wavelength bands may be each formed in pixels so as to perform color display. Typically, light emitting layers corresponding to respective luminescent colors of R (red), G (green), and B (blue) are formed. In this case, color purity can be improved and specular reflection (glare) of a pixel portion can be prevented by providing a filter that transmits light of a certain light emission wavelength band on a light emission side of the pixels. By providing the filter, a circular polarizing plate or the like, which has been conventionally thought to be required, can be omitted, thereby reducing loss of light emitted from the light emitting layers. In addition, a change in hue, which is caused in the case where a pixel portion (a display screen) is seen obliquely, can be reduced.

There are various kinds of light emitting materials. With respect to a low molecular weight organic light emitting material, 4-dicyanomethylene-2-methyl-6-[2-(1,1,7,7-tetramethyljulolidine-9-yl)ethenyl]-4H-pyran (abbr.: DCJT), 4-dicyanomethylene-2-t-butyl-6-[2-(1,1,7,7-tetramethyljulolidine-9-yl)ethenyl]-4H-pyran (abbr.: DCJTB), periflanthene; 2,5-dicyano-1,4-bis[2-(10-methoxy-1,1,7,7-tetramethyljulolidine-9-yl)ethenyl]benzene, N,N'-dimethylquinacridone (abbr.: DMQd), coumarin 6, coumarin 545T, tris(8-quinolinolato)aluminum (abbr.: $Alq_3$), 9,9'-bianthryl, 9,10-diphenylanthracene (abbr.: DPA), 9,10-bis(2-naphthyl)anthracene (abbr.: DNA), or the like can be used. Alternatively, another substance may be used.

On the other hand, as compared with the low molecular weight organic light emitting material, a high molecular weight organic light emitting material has higher physical strength, which means an element is more durable. In addition, since the high molecular weight organic light emitting material can be formed by coating, an element can be manufactured relatively easily. A structure of a light emitting element formed using the high molecular weight organic light emitting material is basically similar to that using the low molecular weight organic light emitting material, and is formed by sequentially laminating a cathode, an organic light emitting layer, and an anode. However, when the light emitting layer is made of the high molecular weight organic light emitting material, it is difficult to form a laminated structure like the case of using the low molecular weight organic light emitting material. In many cases, such the light emitting element as made from the high molecular weight organic light emitting material has a two-layer structure. Specifically, it is a laminated structure formed by sequentially laminating a cathode, a light emitting layer, a hole transport layer, and an anode.

Since the luminescent color is determined by a material of the light emitting layer, a light emitting element that emits light of a desired color can be formed by selecting the material. As the high molecular weight electroluminescent material that can be used to form the light emitting layer, a polyparaphenylene vinylene based material, a polyparaphenylene based material, a polythiophene based material, or a polyfluorene based material can be given.

As the polyparaphenylene vinylene based material, a derivative of poly(paraphenylenevinylene) [PPV]: poly(2,5-dialkoxy-1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV]; or the like can be given. As the polyparaphenylene based material, a derivative of polyparaphenylene [PPP]: poly(2,5-dialkoxy-1,4-phenylene) [RO-PPP]; poly(2,5-dihexoxy-1,4-phenylene); or the like can be given. As the polythiophene based material, a derivative of polythiophene [PT]: poly(3-alkylthiophene) [PAT]; poly(3-hexylthiophene) [PHT]; poly(3-cyclohexylthiophene) [PCHT]; poly(3-cyclohexyl-4-methylthiophene) [PCHMT]; poly(3,4-dicyclohexylthiophene) [PDCHT]; poly[3-(4-octylphenyl)-thiophene] [POPT]; poly[3-(4-octylphenyl)-2,2 bithiophene] [PTOPT]; or the like can be given. As the polyfluorene based material, a derivative of polyfluorene [PF]: poly(9,9-dialkylfluorene) [PDAF]; poly(9,9-dioctylfluorene) [PDOF]; or the like can be given.

When a high molecular weight organic light emitting material having hole transporting properties is interposed between an anode and a high molecular weight organic light emitting material having light emitting properties, hole injecting properties from the anode can be enhanced. Typically, a solution, in which the high molecular weight organic light emitting material having hole transporting properties is dissolved in water with an acceptor material, is applied by a spin coating method or the like. Since the high molecular weight organic light emitting material having hole transporting properties is insoluble in an organic solvent, it can be laminated with the above-mentioned organic light emitting material having light emitting properties. As the high molecular weight organic light emitting material having hole transporting properties, a mixture of PEDOT and camphor sulfonic acid (CSA) as an acceptor material; a mixture of polyaniline (PANI) and polystyrenesulfonic acid (PSS) as an acceptor material; or the like can be given.

A light emitting layer can emit monochromatic light or white light. In the case of using a white light emitting material, color display can be achieved by providing a filter (a colored layer) which transmits light of a specific wavelength on a light emitting side of a pixel.

In order to form a light emitting layer that emits white light, for example, Alq$_3$, Alq$_3$ partially doped with Nile red which is a red light emitting pigment, Alq$_3$, p-EtTAZ, and TPD (aromatic diamine) are sequentially laminated by an evaporation method. Also, when a light emitting layer is formed by a coating method using spin coating, baking is preferably performed by vacuum heating after coating. For example, an aqueous solution of poly(ethylene dioxythiophene)/poly(styrenesulfonic acid) (PEDOT/PSS), which functions as a hole injection layer, may be applied over an entire surface of a substrate and baked. Thereafter, a solution of polyvinyl carbazole (PVK) doped with a light emitting center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6), which serves as a light emitting layer, may be applied over the entire surface and baked.

The light emitting layer can be formed to have a single layer. In this case, 1,3,4-oxadiazole derivative (PBD) having electron transporting properties may be dispersed in polyvinyl carbazole (PVK) having hole transporting properties. In addition, white light emission can be obtained by dispersing 30 wt % PBD as an electron transporting agent and dispersing a suitable amount of four kinds of pigments (TPB, coumarin 6, DCM1, and Nile red). As well as the above-mentioned light emitting elements that can emit white light, a light emitting element that can emit red light, green light, or blue light can be manufactured by properly selecting materials of the light emitting layer.

Further, a triplet excited light emitting material including a metal complex or the like may be used for the light emitting layer as well as a singlet excited light emitting material. For example, a pixel emitting red light, whose luminance is reduce by half in a relatively short time, is formed of the triplet excited light emitting material, and the pixels emitting green and blue light are formed of the singlet excited light emitting material. Since the triplet excited light emitting material has an excellent light emitting efficiency, it has a feature of requiring lower power to obtain the same level of luminance as compared with the singlet excited light emitting material. In other words, when the pixel emitting red light is formed of the triplet excited light emitting material, only a small amount of current flowing through the light emitting element is required, thereby improving reliability. To reduce power consumption, the pixels emitting red and green light may be formed of the triplet excited light emitting material, while the pixel emitting blue light may be formed of the singlet excited light emitting material. In the case where a light emitting element that emits green light, which has high visibility, is also formed of the triplet excited light emitting material, power consumption can be further reduced.

As an example of the triplet excited light emitting material, there is one that uses a metal complex as a dopant. In particular, a metal complex with platinum, which is a third transition element, as its central metal; a metal complex with iridium as its central metal; and the like are known. The triplet excited light emitting material is not limited to these compounds, and it is possible to use a compound having the above mentioned structure and including an element that belongs to Group 8 to 10 of the periodic table as its central metal.

The above mentioned materials for forming the light emitting layer are examples, and a light emitting element can be formed by properly laminating respective layers with various properties such as a hole injection transport layer, a hole transport layer, an electron injection transport layer, an electron transport layer, a light emitting layer, an electron blocking layer, or a hole blocking layer. In addition, a mixed layer or a mixed junction of these layers may be formed. The layer structure of the light emitting layer can be varied. Instead of providing a specific electron injection region or light emitting region, modification such as providing an electrode layer for the purpose or providing a dispersed light emitting material is acceptable as long as it does not deviate from the scope of the invention.

A light emitting element formed using the above-described material emits light when biased in a forward direction. A pixel of a display device formed with the light emitting element can be driven by a simple matrix mode or an active matrix mode. In either mode, each pixel is made to emit light by applying a forward bias thereto in specific timing, and the pixel is in a non-light-emitting state for a certain period. By applying a backward bias at this non-light-emitting time, reliability of the light emitting element can be improved. In the light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving. Thus, reliability of the light emitting device can be improved. The alternating driving can be applied to both digital drive and analog drive.

Figure 12A:
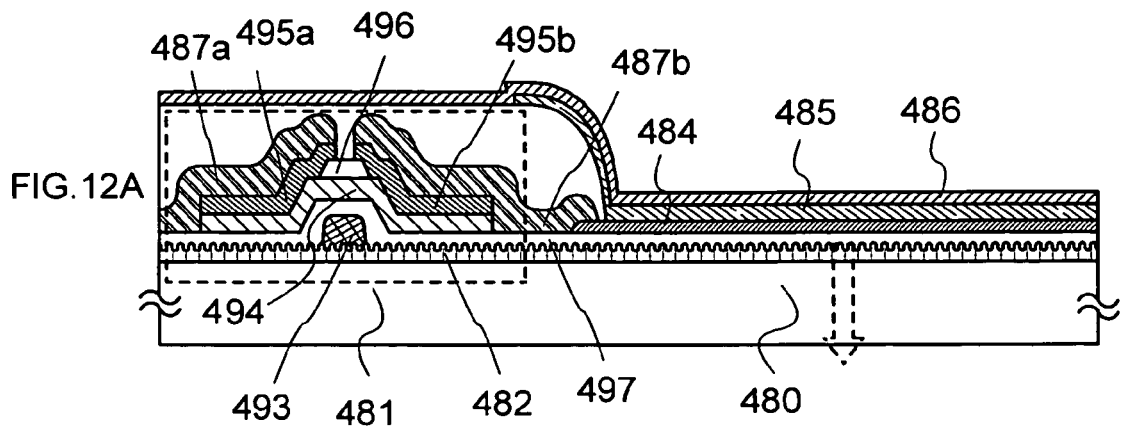
FIGS. 12A to 12C show a method for manufacturing a display device of the present invention.
Figure 12B:
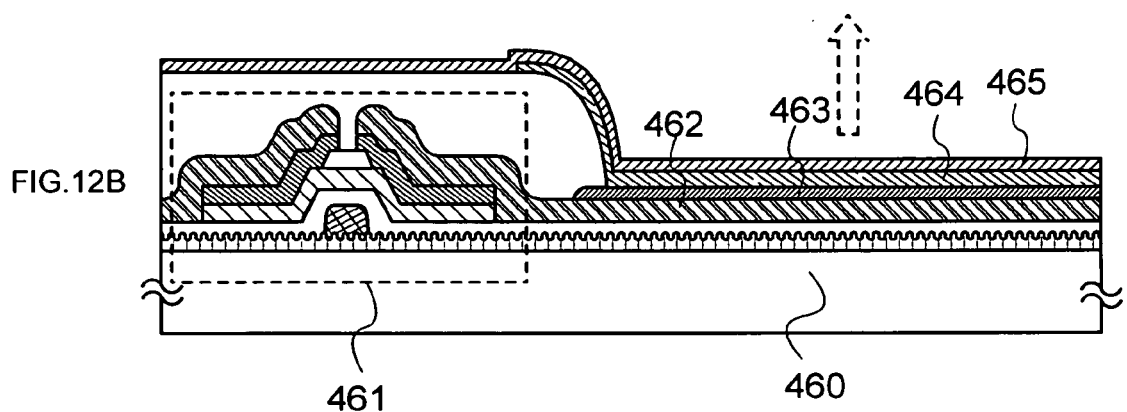
Figure 12C:
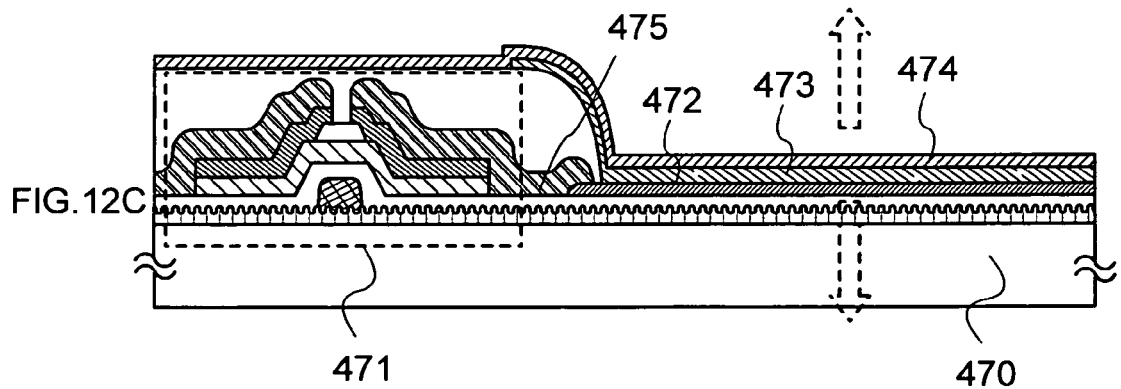

Although not shown in FIGS. 12A to 12C, a color filter (colored layer) may be formed over a sealing substrate opposed to a substrate including elements. The color filter (colored layer) can be selectively formed by a droplet discharge method. Since broad peaks of the emission spectra of R, G, and B can be adjusted sharply by the color filter (colored layer), a high-definition image can be displayed by using this color filter (colored layer).

Although the case of forming the materials exhibiting light emission of respective R, G, and B is described above, full color display can be achieved by forming a material exhibiting monochromatic light in combination with a color filter or a color conversion layer. For example, the color filter (colored layer) or the color conversion layer may be formed over the sealing substrate and then attached to the substrate. As above described, the material exhibiting monochromatic light, the color filter (colored layer), and the color conversion layer can be formed by a droplet discharge method.

Naturally, monochromatic light emitting display may be performed. For instance, an area color display device using the monochromatic light may be formed. A passive matrix display portion is suitable for the area color display device, and characters and symbols can be mainly displayed thereon.

In the above-mentioned structures, the cathode can be formed of a material having a low work function. For example, the cathode is preferably formed of Ca, Al, CaF$_2$, MgAg, AlLi, or the like. The electroluminescent layer may have any one of a single-layer structure, a laminated structure, and a mixed structure having no interface between layers. Further, the electroluminescent layer may be formed of a singlet material, a triplet material, a combination thereof, or a charge injection transport material and a light emitting material containing an organic compound or an inorganic compound. Alternatively, the electroluminescent layer may include one or plural kinds of layers of a low molecular weight organic compound, an intermediate molecular weight organic compound (referring to an organic compound which does not sublime and in which the number of molecules is 20 or less or a molecular chain length is 10 μm or less), and a high molecular weight organic compound depending on the number of molecules. The electroluminescent layer may be combined with an electron injection transport or hole injection transport inorganic compound. The first electrode layers 484 and 472 and the second electrode layers 465 and 474 are formed of a transparent conductive film which transmits light. For example, a transparent conductive film, which is formed using a target in which indium oxide is mixed with zinc oxide (ZnO) of 2 wt % to 20 wt %, is used besides ITO and ITSO. Plasma treatment in oxygen atmosphere or heat treatment in vacuum is preferably performed before forming the first electrode layers 484, 463, and 472. A partition wall is formed of a material including silicon, an organic material, or a compound material. Also, a porous film may be used. It is preferable that the partition wall is formed of a photosensitive or nonphotosensitive material such as acrylic or polyimide, since a curvature radius of each side surface is continuously varied; and accordingly, a thin film formed over each partition wall is not disconnected. This embodiment can be freely combined with Embodiment 1 or 2.

Embodiment 5

Next, a mode of mounting a driver circuit for driving on a display panel manufactured in accordance with Embodiments 2 to 4 is explained.

First, a display device employing a COG method is explained with reference to FIG. 27A. A pixel portion 2701 for displaying information of characters, images or the like is provided over a substrate 2700. A substrate provided with a plurality of driver circuits is divided into rectangles, and a driver circuit 2751 after division (also referred to as a driver IC) is mounted on the substrate 2700. FIG. 27A shows a mode of mounting a plurality of driver ICs 2751 and FPCs 2750 on the end of the driver ICs 2751. In addition, the divided size may be made almost the same as the length of a side of the pixel portion on a signal line side, and a tape may be mounted on the end of the single driver IC.

A TAB method may be adopted. In that case, a plurality of tapes may be attached and driver ICs may be mounted on the tapes as shown in FIG. 27B. Similarly to the case of a COG method, a single driver IC may be mounted on a single tape. In this case, a metal piece or the like for fixing the driver IC may be attached together in terms of intensity.

A plurality of driver ICs to be mounted on a display panel is preferably formed over a rectangular substrate having a side of 300 mm to 1000 mm or more in terms of improving productivity.

In other words, a plurality of circuit patterns each including a driver circuit portion and an input-output terminal as a unit is formed over the substrate, and may be lastly divided to be used. In consideration of a side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel portion, or that of adding a side length of the pixel portion to a side length of each driver circuit.

An advantage of the external dimension of the driver IC over an IC chip is the length of the long side. When the driver IC having a long side length of 15 mm to 80 mm is used, the number of the driver ICs necessary for mounting in accordance with the pixel portion is less than that in the case of using an IC chip. Therefore, yield in manufacturing can be improved. When a driver IC is formed over a glass substrate, productivity is not decreased, since there is no limitation by the shape of a substrate used as a mother body. This is a great advantage compared with the case of taking the IC chip out of a circular silicon wafer.

When a scanning line driver circuit 3702 is integrated with a substrate as shown in FIG. 26B, a driver IC provided with a signal line driver circuit is mounted on a region outside a pixel portion 3701. The driver IC is a signal line driver circuit. In order to form a pixel portion corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitches of output terminals of the driver ICs.

The driver IC is preferably made of a crystalline semiconductor formed over the substrate. The crystalline semiconductor is preferably formed by being irradiated with continuous wave laser light. Therefore, a continuous wave solid-state or gas laser is used for an oscillator for generating the laser light. There are few crystal defects when a continuous wave laser is used, and as a result, a transistor can be manufactured by using a polycrystalline semiconductor layer having a large grain size. In addition, high-speed driving is possible since mobility or response speed is favorable, and it is possible to further improve an operating frequency of a element than that of the conventional element. Therefore, high reliability can be obtained since there are few characteristics variations. The channel-length direction of the transistor and a moving direction of laser light over the substrate may be directed in the same direction to further improve the operating frequency. This is because the highest mobility can be obtained when a channel length direction of a transistor and a moving direction of laser light over a substrate are almost parallel (preferably, $-30°$ to $30°$) in a step of laser crystallization by a continuous wave laser. Note that the channel length direction corresponds to a current flowing direction, in other words, a direction in which an electric charge moves in a channel formation region. The thus manufactured transistor has an active layer including a polycrystalline semiconductor layer in which a crystal grain extended in the channel direction, and this means that a crystal grain boundary is formed almost along the channel direction.

In order to perform laser crystallization, it is preferable to extensively narrow the laser light, and a shape of the laser light (beam spot) preferably has the same width as that of a short side of the driver ICs, approximately 1 mm to 3 mm. In addition, in order to secure an enough and effective energy density for an object to be irradiated, an irradiated region with the laser light preferably has a linear shape. The term "linear" used herein refers to not a line in a strict sense but a rectangle or an oblong with a large aspect ratio. For example, the linear shape refers to a rectangle or an oblong with an aspect ratio of 2 or more (preferably 10 to 10000). Thus, by making a width of the laser light shape (beam spot) the same length as a short side of the driver ICs, a method for manufacturing a display device in which productivity is improved can be provided.

As shown in FIGS. 27A and 27B, driver ICs may be mounted as both the scanning line driver circuit and the signal line driver circuit. In this case, it is preferable to use the driver ICs having different specifications for the scanning line driver circuit and the signal line driver circuit.

In the pixel portion, the signal line and the scanning line intersect to form a matrix, and transistors are arranged in accordance with each intersection. One feature of the present invention is that a TFT having an amorphous semiconductor or a semiamorphous semiconductor as a channel portion is used as the transistor arranged in the pixel portion. The amorphous semiconductor is formed by a method such as a plasma CVD method or a sputtering method. The semiamorphous semiconductor can be formed at a temperature of 300° C. or less by a plasma CVD method. A film thickness necessary to form the transistor is formed in a short time even in the case of, for example, a non-alkaline glass substrate having an external size of 550 mm×650 mm. The feature of such a manufacturing technique is effective in manufacturing a large-sized display device. In addition, a semiamorphous TFT can obtain field effect mobility of 2 cm$^2$/V·sec to 10 cm$^2$/V·sec by forming a channel formation region using a SAS. When the present invention is applied, a minute wiring having a short channel width can be stably formed without a defect such as a short circuit since a pattern having a desired shape can be formed with good controllability. Accordingly, a TFT having electric characteristics required to operate pixels sufficiently can be formed. Therefore, this TFT can be used as a switching element of the pixel or as an element included in the scanning line driver circuit. Thus, a display panel in which system-on-panel is realized can be manufactured.

The scanning line driver circuit is also integrated with the substrate by using a TFT having a semiconductor layer formed of a SAS. In the case of using a TFT having a semiconductor layer formed of an AS, the driver ICs may be mounted for both the scanning line driver circuit and the signal line driver circuit.

In that case, it is preferable to use the driver ICs having different specifications for the scanning line driver circuit and the signal line driver circuit. For example, a transistor included in the scanning line driver IC is required to withstand a voltage of approximately 30 V; however, a drive frequency is 100 kHz or less, and high-speed operation is not comparatively required. Therefore, it is preferable to set a channel length (L) of the transistor included in the scanning line driver sufficiently long. On the other hand, a transistor of the signal line driver IC is required to withstand a voltage of only approximately 12 V; however, a drive frequency is around 65 MHz at 3 V, and high-speed operation is required. Therefore, it is preferable to set a channel length or the like of the transistor included in a driver with a micron rule. By using the present invention, a minute pattern can be formed with good controllability. Therefore, the present invention can handle such a micron rule sufficiently.

A method for mounting the driver IC is not particularly limited, and a known method such as a COG method, a wire bonding method, or a TAB method can be employed.

The thicknesses of the driver IC and the opposite substrate are set to have the same thickness, a distance therebetween is almost constant, which contributes to thinning of a display device as a whole. When both substrates are formed of the same material, thermal stress is not generated and characteristics of a circuit formed of a TFT are not damaged even when a temperature change is generated in the display device. Furthermore, the number of the driver ICs to be mounted on one pixel portion can be reduced by mounting driver circuits with longer driver ICs than IC chips as described in this embodiment.

As the above described, a driver circuit can be incorporated in a display panel.

Embodiment 6

An example of a protective circuit included in a display device of the present invention is explained.

Figure 24A:
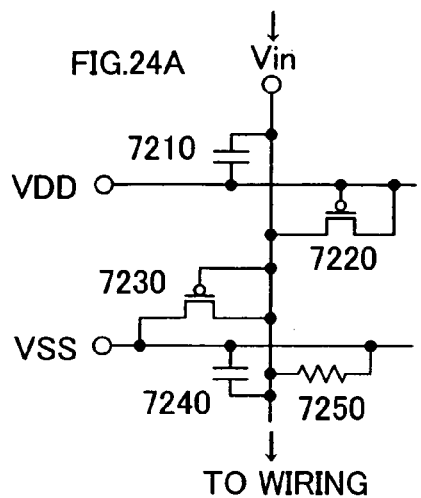
FIGS. 24A to 24E show a protective circuit to which the present invention is applied.

As shown in FIGS. 27A and 27B, a protective circuit 2703 can be formed between an external circuit and an internal circuit. The protective circuit includes one or plural elements of a TFT, a diode, a resistor element, a capacitor element, and the like. Explained below are several structures of the protective circuit and the operation thereof. First, the structure of an equivalent circuit of a protective circuit which is disposed between an external circuit and an internal circuit and which corresponds to one input terminal is explained with reference to FIGS. 24A to 24E. The protective circuit shown in FIG. 24A includes p-channel thin film transistors 7220 and 7230, capacitor elements 7210 and 7240, and a resistor element 7250. The resistor element 7250 has two terminals; one of which is supplied with an input voltage Vin (hereinafter referred to as Vin), and the other of which is supplied with a low-potential voltage VSS (hereinafter referred to as VSS).

Figure 24D:
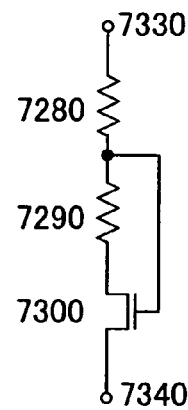
Figure 24B:
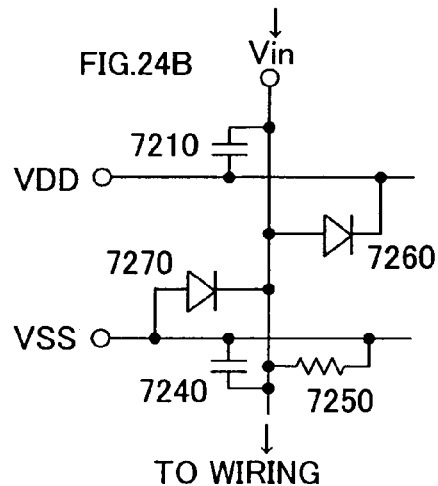
Figure 24E:
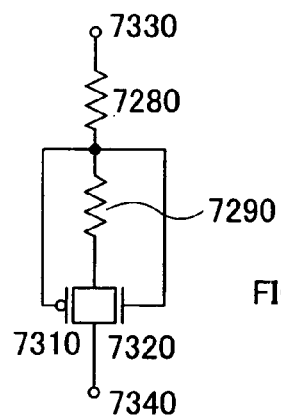
Figure 24C:
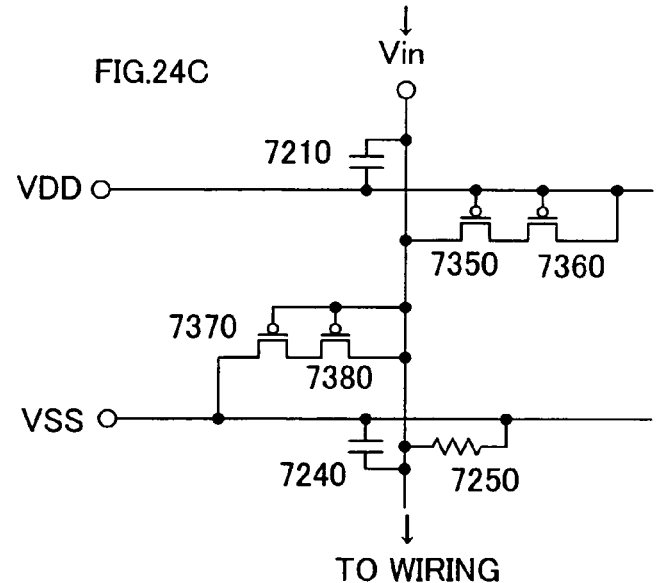

FIG. 24B is an equivalent circuit diagram showing a protective circuit in which rectifying diodes 7260 and 7270 are substituted for the p-channel thin film transistors 7220 and 7230. FIG. 24C is an equivalent circuit diagram showing a protective circuit in which TFTs 7350, 7360, 7370, and 7380 are substituted for the p-channel thin film transistors 7220 and 7230. In addition, as a protective circuit having a different structure from the above structure, FIG. 24D shows a protective circuit which includes resistors 7280 and 7290 and an n-channel thin film transistor 7300. A protective circuit shown in FIG. 24E includes resistors 7280 and 7290, a p-channel thin film transistor 7310, and an n-channel thin film transistor 7320. By providing the protective circuit, a sudden surge in potential can be prevented, and element breakdown or damage can be prevented, which improves reliability. Note that an element having the aforementioned protective circuit is preferably formed using an amorphous semiconductor that can withstand high voltage. This embodiment can be freely combined with the aforementioned embodiment.

This embodiment can be combined with any one of Embodiments 1 to 5.

Embodiment 7

A structure of a pixel of a display panel shown in this embodiment is explained with reference to equivalent circuit diagrams shown in FIGS. 13A to 13F. In this embodiment, an example in which a light emitting element (EL element) is used as a display element of the pixel is described.

In a pixel shown in FIG. 13A, a signal line 710 and power supply lines 711, 712, and 713 are arranged in a column direction, and a scanning line 714 is arranged in a row direction. The pixel also includes a TFT 701 that is a switching TFT, a TFT 703 that is a driver TFT, a TFT 704 that is a current control TFT, a capacitor element 702, and a light emitting element 705.

A pixel shown in FIG. 13C has the same structure as that shown in FIG. 13A, except that a gate electrode of the TFT 703 is connected to the power supply line 712 arranged in a row direction. In other words, both pixels shown in FIGS. 13A and 13C show the same equivalent circuit diagrams. However, each power supply line is formed of conductive layers in different layers between the cases where the power supply line 712 is arranged in a column direction (FIG. 13A) and where the power supply line 712 is arranged in a row direction (FIG. 13C). Here, a wiring to which the gate electrode of the TFT 703 is connected is focused and the figures are separately shown in FIGS. 13A and 13C to show that the wirings are formed in different layers.

In the pixels shown in FIGS. 13A and 13C, the TFTs 703 and 704 are connected to each other in series, and a channel length $L_3$ and a channel width $W_3$ of the TFT 703 and a channel length $L_4$ and a channel width $W_4$ of the TFT 704 are preferably set to satisfy $L_3/W_3:L_4/W_4=5$ to 6000:1. For example, when $L_3$, $W_3$, $L_4$, and $W_4$ are respectively 500 μm, 3 μm, 3 μm, and 100 μm, the ratio 6000:1 can be obtained.

When the present invention is used, minute processing can be performed. Therefore, a minute wiring having a short channel width can be stably formed without a defect such as a short circuit. Hence, a TFT having electric characteristics required for sufficiently operating such pixels as shown in FIGS. 13A and 13C can be formed. As a result, a highly reliable display panel superior in display capability can be manufactured.

The TFT 703 is operated in a saturation region and controls the amount of current flowing into the light emitting element 705, whereas the TFT 704 is operated in a linear region and controls a current supplied to the light emitting element 705. The TFTs 703 and 704 preferably have the same conductivity in view of the manufacturing step. For the TFT 703, a depletion mode TFT may be used instead of an enhancement mode TFT. In the present invention having the above structure, slight variations in $V_{GS}$ of the TFT 704 does not affect the amount of current flowing into the light emitting element 705, since the TFT 704 is operated in a linear region. In other words, the amount of current flowing into the light emitting element 705 is determined by the TFT 703 operated in the saturation region. Accordingly, it is possible to provide a display device in which image quality is improved by reducing variations in luminance of the light emitting element due to the variation in the TFT properties.

The TFT 701 of pixels shown in FIGS. 13A to 13D controls a video signal input to the pixel. When the TFT 701 is turned on and a video signal is input to the pixel, the video signal is held at the capacitor element 702. Although the pixels in FIGS. 13A and 13C include the capacitor element 702, the present invention is not limited thereto. When a gate capacitor or the like can serve as a capacitor holding a video signal, the capacitor element 702 is not necessarily provided.

The light emitting element 705 has a structure in which an electroluminescent layer is interposed between a pair of electrodes. A pixel electrode and an opposite electrode (an anode and a cathode) have a potential difference therebetween so that a forward bias voltage is applied. The electroluminescent layer is formed of a wide range of materials such as an organic material and an inorganic material. The luminescence in the electroluminescent layer includes luminescence that is generated in returning from a singlet excited state to a ground state (fluorescence) and luminescence that is generated in returning from a triplet exited state to a ground state (phosphorescence).

A pixel shown in FIG. 13B has the same structure as that shown in FIG. 13A, except that a TFT 706 and a scanning line 716 are added. Similarly, a pixel shown in FIG. 13D has the same structure as that shown in FIG. 13C, except that a TFT 706 and a scanning line 716 are added.

The TFT 706 is controlled to be on or off by the newly arranged scanning line 716. When the TFT 706 is turned on, charges held at the capacitor element 702 are discharged, thereby turning off the TF 704. In other words, supply of a current to the light emitting element 705 can be forcibly stopped by providing the TFT 706. Therefore, a lighting period can start simultaneously with or shortly after a start of a writing period without waiting until signals are written into all the pixels by adopting the structures shown in FIGS. 13B and 13D; thus, a duty ratio can be improved.

In a pixel shown in FIG. 13E, a signal line 750 and power supply lines 751 and 752 are arranged in a column direction, and a scanning line 753 is arranged in a row direction. The pixel further includes a TFT 741 that is a switching TFT, a TFT 743 that is a driver TFT, a capacitor element 742, and a light emitting element 744. A pixel shown in FIG. 13F has the same structure as that shown in FIG. 13E, except that a TFT 745 and a scanning line 754 are added. The structure of FIG. 13F can also improve a duty ratio by providing the TFT 745.

As described above, in accordance with the present invention, a pattern of a wiring or the like can be precisely and stably formed without a formation defect. Therefore, a TFT can be provided with high electric characteristics and reliability, and the present invention can be satisfactorily used for an applied technique for improving display capability of a pixel in accordance with the intended use.

This embodiment can be combined with any one of Embodiments 1, 2, and 4 to 6.

Embodiment 8

Figure 11:
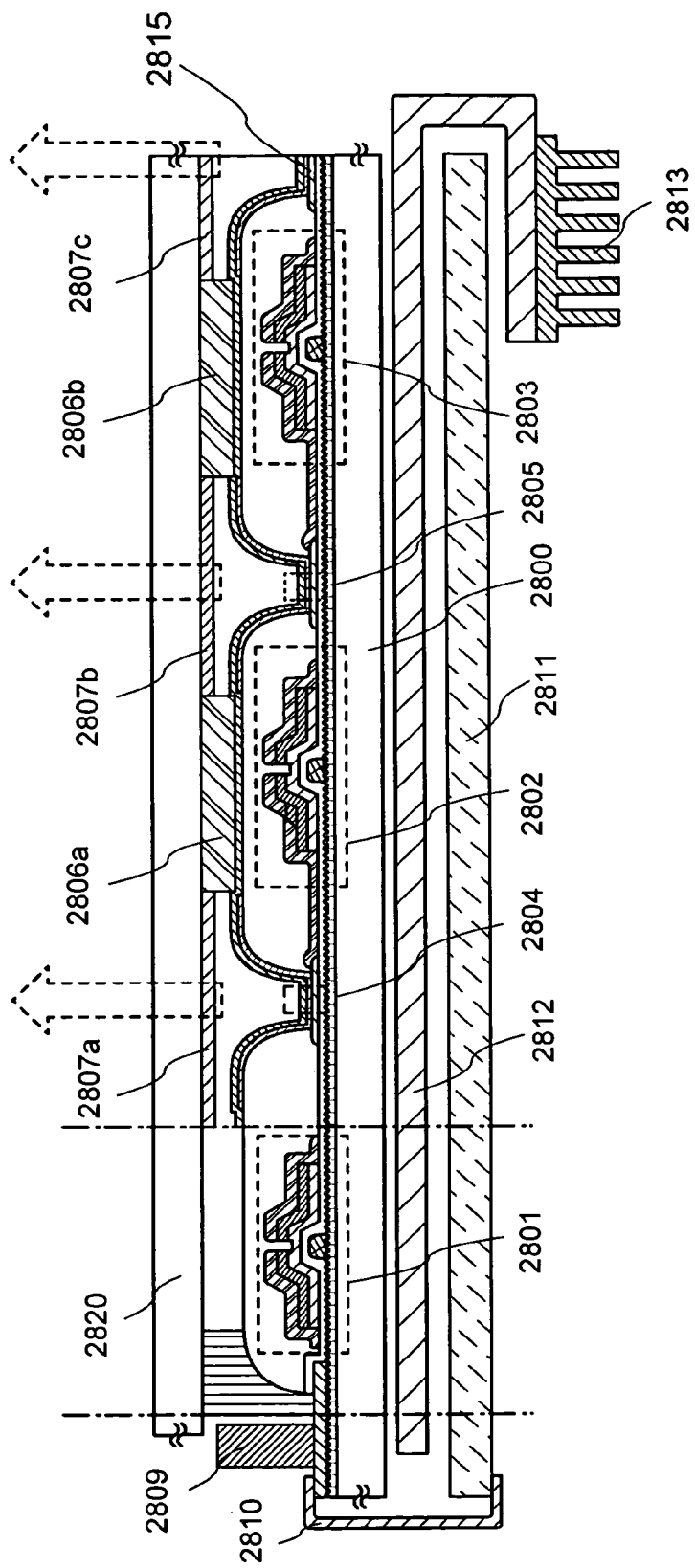
FIG. 11 is a cross-sectional view showing a structure example of an EL display module of the present invention.

Embodiment 8 is explained with reference to FIG. 11. FIG. 11 shows an example of forming an EL display module using a TFT substrate 2800 manufactured in accordance with the present invention. In FIG. 11, a pixel portion including pixels is formed over the TFT substrate 2800.

In FIG. 11, a TFT which has the same structure as that formed in the pixel, or a protective circuit portion 2801 operated in the same manner as a diode by connecting a gate to either a source or a drain of the TFT is provided between a driver circuit and the pixel and outside the pixel portion. A driver IC formed of a single crystalline semiconductor, a stick driver IC formed of a polycrystalline semiconductor film over a glass substrate, or a driver circuit formed of a SAS is applied to a driver circuit 2809.

The TFT substrate 2800 is fixed to a sealing substrate 2820 with spacers 2806a and 2806b formed by a droplet discharge method therebetween. The spacer is preferably provided to keep a space between two substrates constant even when the substrate is thin or an area of the pixel portion is enlarged. A space between the TFT substrate 2800 and the sealing substrate 2820 over light emitting elements 2804 and 2805 connected to TFTs 2802 and 2803 respectively may be filled with a resin material which transmits at least light in the visible region and the resin material may be solidified, or may be filled with anhydrous nitrogen or an inert gas.

FIG. 11 shows the case where the light emitting elements 2804 and 2805 and a light emitting element 2815 have a structure of top emission, which emit light in the direction of an arrow shown in the drawing. Multicolor display can be performed by making the pixels to emit light of different of red, green, and blue. At this time, color purity of the light emitted outside can be improved by forming colored layers 2807a to 2807c corresponding to respective colors on a sealing substrate 2820 side. Moreover, pixels which emit white light may be used and may be combined with the colored layers 2807a to 2807c.

The driver circuit 2809 which is an external circuit is connected to a scanning line or a signal line connection terminal which is provided at one end of an external circuit substrate 2811 with a wiring substrate 2810. In addition, a heat pipe 2813 which is a high-efficiency heat conducting device in a pipe shape and a heat sink 2812, which are used to conduct heat to outside the device, may be provided in contact with or adjacent to the TFT substrate 2800 to increase a heat dissipation effect.

FIG. 11 shows the top emission EL module; however, it may be a bottom emission structure by changing the structure of the light emitting element or the disposition of the external circuit substrate. Naturally, a dual emission structure in which light is emitted from both sides of the top and bottom surfaces may be used. In the case of the top emission structure, the insulating layer which is to be a partition wall may be colored to be used as a black matrix. This partition wall can be formed by a droplet discharge method and it may be formed by mixing a black resin of a pigment material, carbon black, or the like into a resin material such as polyimide. A lamination thereof may also be used.

In addition, reflected light of light entering from outside may be shielded by using a retardation film or a polarizing plate in the EL display module. In the case of a top emission type display device, an insulating layer to be a partition wall may be colored and used as a black matrix. The partition wall can be formed by a droplet discharge method or the like. Carbon black or the like may be mixed into a black resin of a pigment material or a resin material such as polyimide, and a lamination thereof may also be used. By a droplet discharge method, different materials may be discharged to the same region plural times to form the partition wall. A quarter wave plate and a half wave plate may be used as the retardation films and may be designed to be able to control light. As the structure, the light emitting element, the sealing substrate (sealant), the retardation film (quarter wave plate), the retardation film (half wave plate), and the polarizing plate are sequentially laminated over a TFT element substrate, in which light emitted from the light emitting element is transmitted therethrough and emitted outside from a polarizing plate side. The retardation films or polarizing plate may be provided on a side where light is emitted outside or may be provided on both sides in the case of a dual emission type display device in which light is emitted from the both surfaces. In addition, an anti-reflective film may be provided on the outer side of the polarizing plate. Accordingly, a higher-definition and more accurate image can be displayed.

In the TFT substrate 2800, a sealing structure may be formed by attaching a resin film to the side where the pixel portion is formed with the use of a sealant or an adhesive resin. In this embodiment, glass sealing using a glass substrate is described; however, various sealing methods such as resin sealing using a resin, plastic sealing using plastic, and film sealing using a film can be used. A gas barrier film which prevents moisture from penetrating into the resin film is preferably provided over the surface of the resin film. By applying a film sealing structure, a further thinner and lighter EL display module can be obtained.

This embodiment can be combined with any one of Embodiments 1, 2, and 4 to 7.

Embodiment 9

Figure 19A:
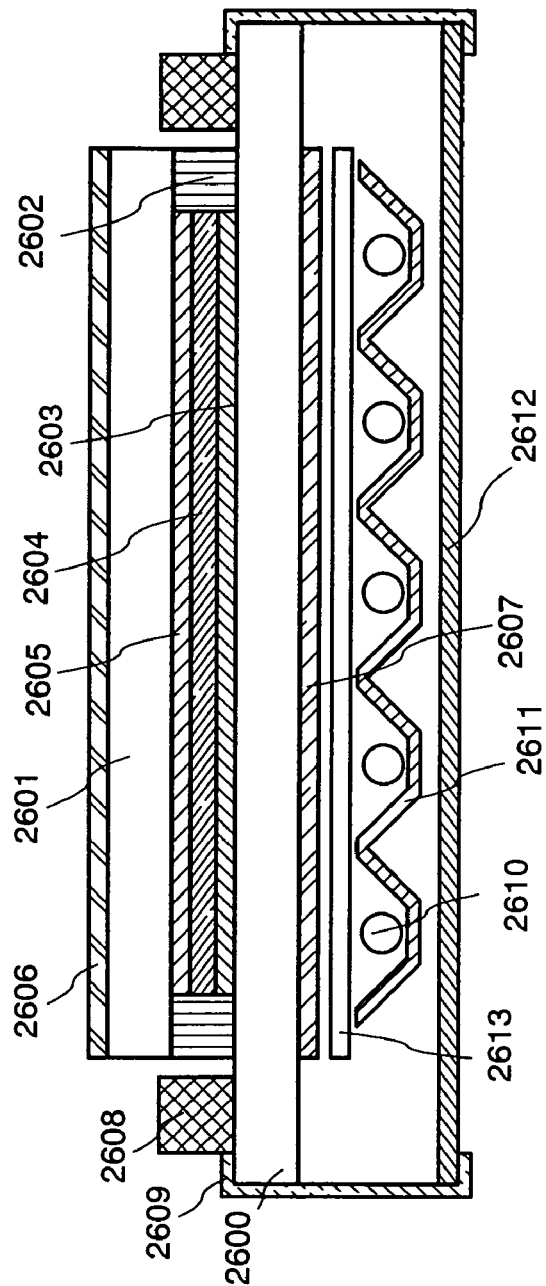
FIGS. 19A and 19B are cross-sectional views showing a structure example of a liquid crystal display module of the present invention.
Figure 19B:
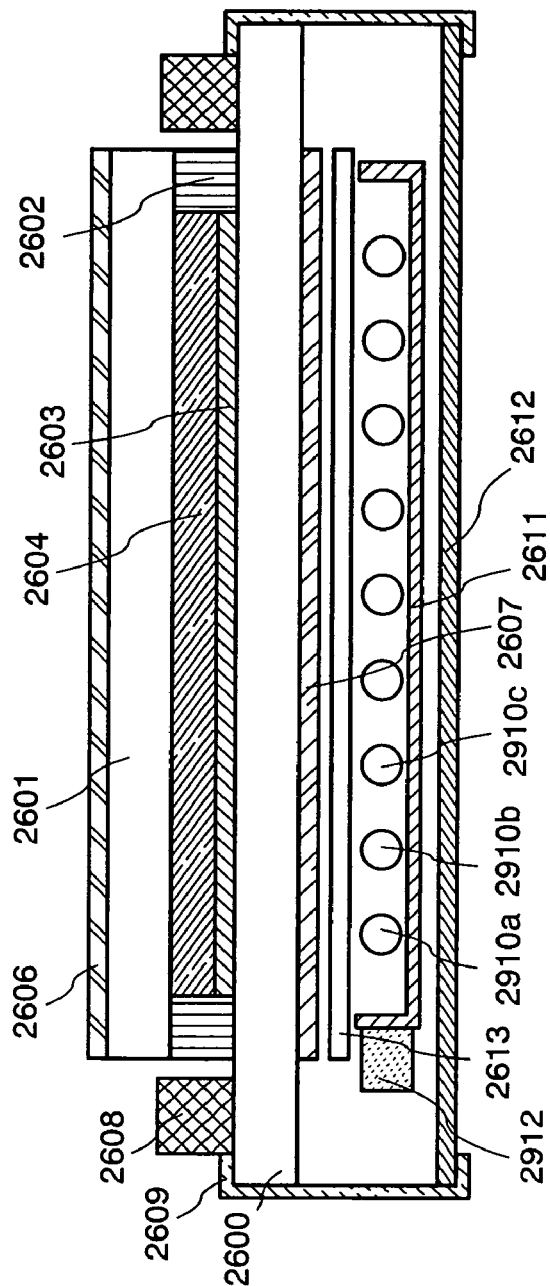

Embodiment 9 is explained with reference to FIGS. 19A and 19B. FIGS. 19A and 19B show examples of forming a liquid crystal display module by using a TFT substrate 2600 manufactured in accordance with the present invention.

FIG. 19A shows an example of a liquid crystal display module, in which the TFT substrate 2600 and an opposite substrate 2601 are firmly attached to each other with a sealant 2602, and a pixel portion 2603 and a liquid crystal layer 2604 are provided between the substrates to form a display region. A colored layer 2605 is necessary to perform color display. In the case of the RGB system, colored layers corresponding to respective colors of red, green, and blue are provided for respective pixels. The outsides of the TFT substrate 2600 and the opposite substrate 2601 are provided with polarizing plates 2606 and 2607, and a lens film 2613. A light source includes a cold-cathode tube 2610 and a reflecting plate 2611. A circuit substrate 2612 is connected to the TFT substrate 2600 by a flexible wiring board 2609. External circuits such as a control circuit and a power supply circuit are incorporated in the circuit substrate 2612. The liquid crystal display module can employ a TN (Twisted Nematic) mode, an IPS (In-Plane-Switching) mode, an MVA (Multi-domain Vertical Alignment) mode, an ASM (Axially Symmetric aligned Micro-cell) mode, an OCB mode, or the like.

Performance of a display device manufactured in accordance with the present invention can be improved by using the OCB mode in particular that can respond at high speed. FIG. 19B shows an example in which the OCB mode is applied to the liquid crystal display module of FIG. 19A, so that this liquid crystal display module becomes an FS-LCD (Field Sequential-LCD). The FS-LCD performs red, green, and blue light emissions in one frame period. An image is produced using time division so that color display can be performed. Also, emission of respective colors is performed using a light emitting diode, a cold-cathode tube, or the like; hence, a color filter is not required. Therefore, since the arrangement of color filters of three primary colors is not required, nine times as many pixels as those in the case of using the color filters can be provided in the same area. On the other hand, light emission of three colors is performed in one frame period; therefore, a high speed response of liquid crystal is required. When an FS system or the OCB mode is applied to the display device of the present invention, a display device or a liquid crystal television device having higher performance and higher definition can be completed.

A liquid crystal layer of the OCB mode has, what is called, a π cell structure. In the π cell structure, liquid crystal molecules are oriented such that pretilt angles of the molecules are symmetrical with respect to the center plane between the active matrix substrate and the opposite substrate. The orientation in the π cell structure is a splay orientation when a voltage is not applied to the substrates, and shifts into a bend orientation when the voltage is applied. Further application of the voltage makes the liquid crystal molecules in the bend orientation orientated perpendicular to the substrates, which allows light to pass therethrough. Note that approximately ten times as high response speed as a conventional TN mode can be achieved by using the OCB mode.

Further, as a mode corresponding to the FS system, an HV-FLC, an SS-FLC, or the like using a ferroelectric liquid crystal (FLC) that can be operated at high speed can also be used. A nematic liquid crystal that has relatively low viscosity is used for the OCB mode. A smectic liquid crystal is used for the HV-FLC or the SS-FLC. As a liquid crystal material, an FLC, a nematic liquid crystal, a smectic liquid crystal, or the like can be used.

An optical response speed of the liquid crystal display module is increased by narrowing a cell gap of the liquid crystal display module. Alternatively, the optical response speed can be increased by lowering the viscosity of the liquid crystal material. The above method of increasing the optical response speed is more effective in the case where a pixel pitch of a pixel region of a TN mode liquid crystal display module or a dot pitch is 30 μm or less.

The liquid crystal display module of FIG. 19B is a transmissive type, in which a red light source 2910*a*, a green light source 2910*b*, and a blue light source 2910*c* are provided as light sources. A control portion 2912 is provided in the liquid crystal display module to separately control switch-on or switch-off of the red light source 2910*a*, the green light source 2910*b*, and the blue light source 2910*c*. The light emission of respective colors is controlled by the control portion 2912, and light enters the liquid crystal to produce a composite image using the time division, thereby performing color display.

As the above described, a high-definition and high-reliability liquid crystal display module can be manufactured by using the present invention.

This embodiment can be combined with any one of Embodiments 1, 3, 5, and 6.

Embodiment 10

Figure 21:
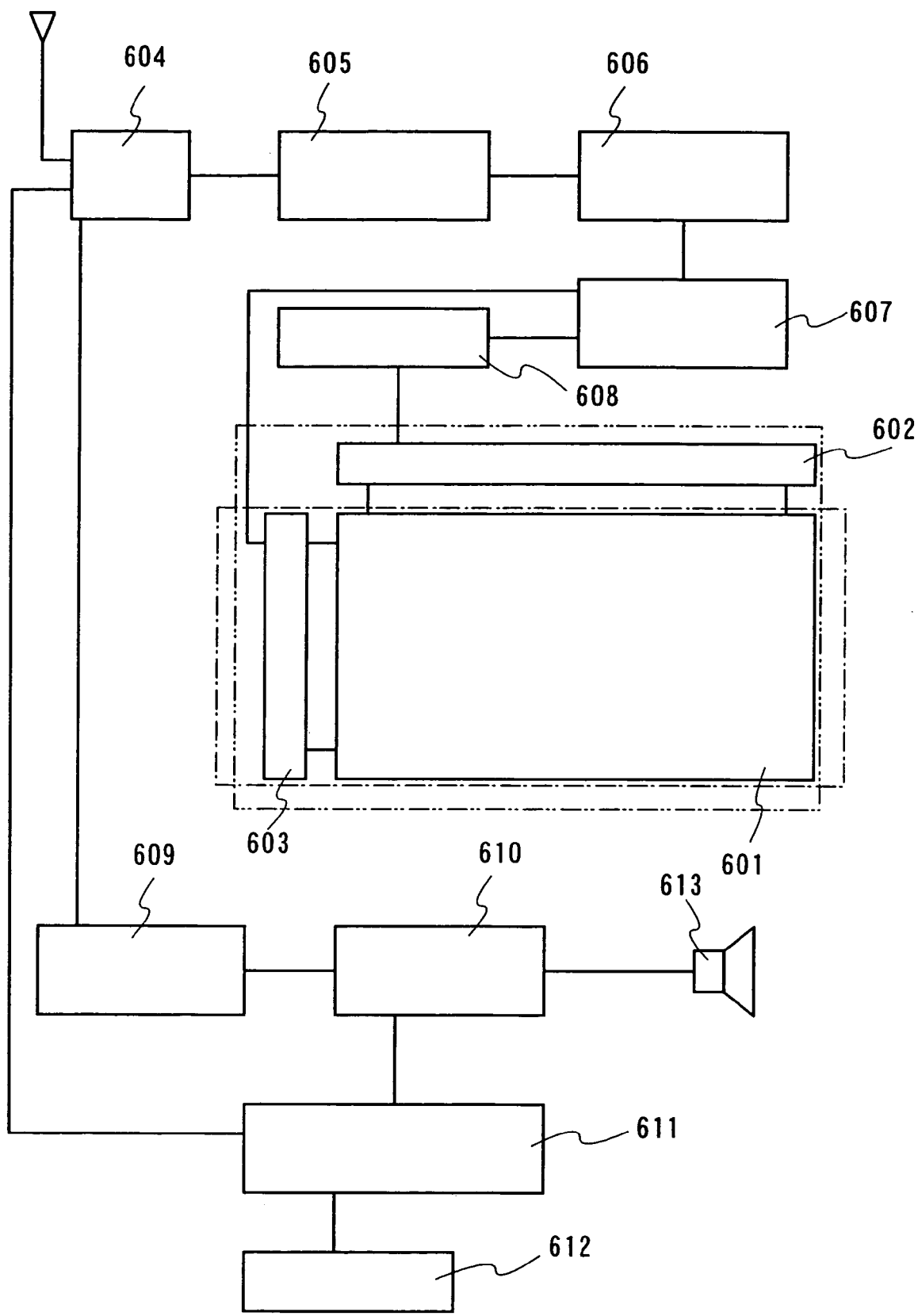
FIG. 21 is a block diagram showing a major structure of an electronic device to which the present invention is applied.

A television device can be completed by using a display device manufactured in accordance with the invention. FIG. 21 is a block diagram showing a main structure of the television device. As for the display panel, there are a case in which only a pixel portion 601 is formed as shown in FIG. 26A and a scanning line driver circuit 603 and a signal line driver circuit 602 are mounted by a TAB method as shown in FIG. 27B; a case in which the scanning line driver circuit 603 and the signal line driver circuit 602 are mounted by a COG method as shown in FIG. 27A; a case in which a TFT is formed as shown in FIG. 26B, the pixel portion 601 and the scanning line driver circuit 603 are integrated with a substrate, and the signal line driver circuit 602 is independently mounted as a driver IC; and a case in which the pixel portion 601, the signal line driver circuit 602, and the scanning line driver circuit 603 are integrated with a substrate as shown in FIG. 26C; and the like. The display panel may have any one of the structures.

As another external circuit, a video signal amplifier circuit 605 which amplifies a video signal among signals received by a tuner 604, a video signal processing circuit 606 which converts the signals output from the video signal amplifier circuit 605 into chrominance signals corresponding to respective colors of red, green, and blue, a control circuit 607 which converts the video signal into an input specification of the driver IC, or the like are provided on an input side of the video signal. The control circuit 607 outputs signals to both a scanning line side and a signal line side. In the case of digital driving, a signal dividing circuit 608 may be provided on the signal line side and an input digital signal may be divided into m pieces and supplied.

An audio signal among signals received by the tuner 604 is sent to an audio signal amplifier circuit 609 and is supplied to a speaker 613 through an audio signal processing circuit 610. A control circuit 611 receives control information of a receiving station (reception frequency) or sound volume from an input portion 612 and transmits signals to the tuner 604 or the audio signal processing circuit 610.

Figure 20A:
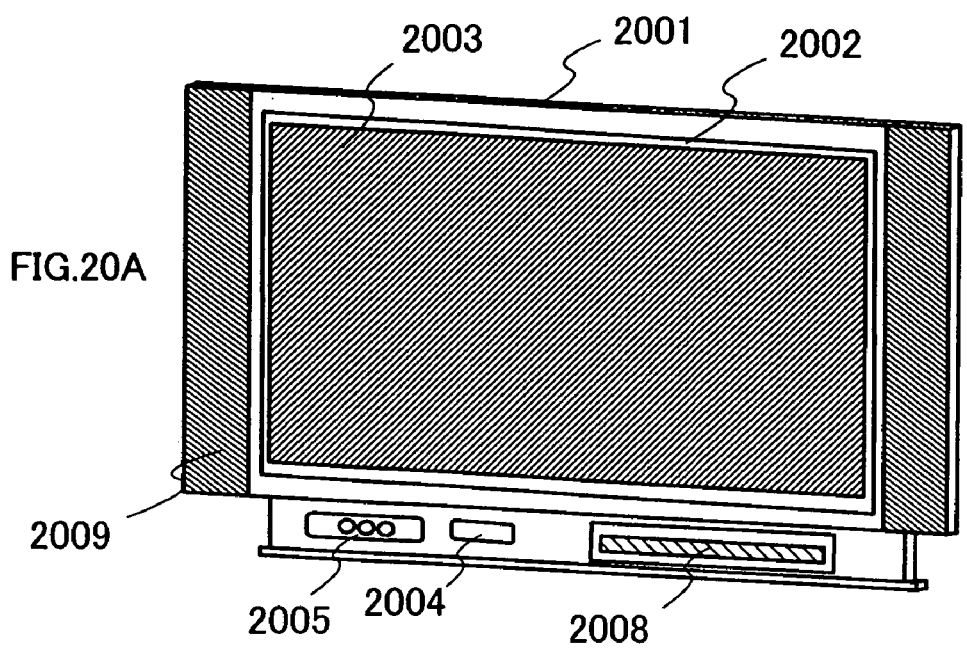
FIGS. 20A and 20B show electronic devices to which the present invention is applied.
Figure 20B:
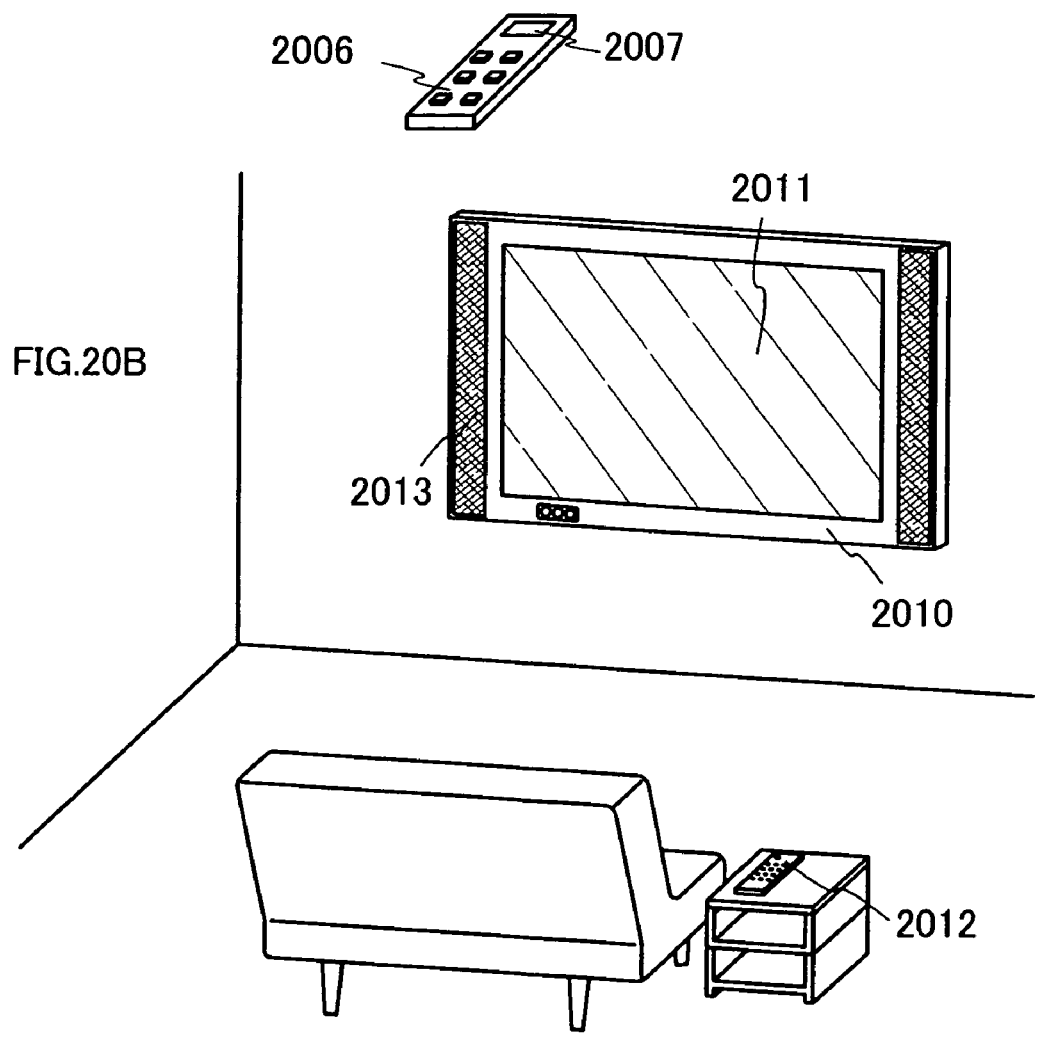

A television device can be completed by incorporating such a liquid crystal display module or an EL display module into a chassis as shown in FIGS. 20A and 20B. When an EL display module as shown in FIG. 11 is used, an EL television device can be obtained. When a liquid crystal display module as shown in FIG. 19A or FIG. 19B is used, a liquid crystal television device can be obtained. A main screen 2003 is formed by using the display module, and a speaker portion 2009, an operation switch, and the like are provided as its accessory equipment. Thus, a television device can be completed in accordance with the present invention.

A display panel 2002 is incorporated in a chassis 2001, and general TV broadcast can be received by a receiver 2005. When the display device is connected to a communication network by wired or wireless connections via a modem 2004, one-way (from a sender to a receiver) or two-way (between a sender and a receiver or between receivers) information communication can be perform. The television device can be operated by using a switch built in the chassis 2001 or a remote control unit 2006. A display portion 2007 for displaying output information may also be provided in the remote control unit 2006.

Further, the television device may also include a sub screen 2008 formed using a second display panel so as to display channels, volume, or the like, in addition to the main screen 2003. In this structure, the main screen 2003 may be formed using an EL display panel having a wide viewing angle, and the sub screen 2008 may be formed using a liquid crystal display panel capable of displaying images with lower power consumption. In order to reduce the power consumption preferentially, the main screen 2003 may be formed using a liquid crystal display panel, and the sub screen may be formed using an EL display panel, which can be switched on and off. In accordance with the present invention, a highly reliable display device can be formed even when a large-sized substrate is used and a large number of TFTs or electronic components are used.

FIG. 20B shows a television device having a large-sized display portion, for example, a 20-inch to 80-inch display portion. The television device includes a chassis 2010, a display portion 2011, a remote control device 2012 that is an operation portion, a speaker portion 2013, and the like. The present invention is applied to manufacturing of the display portion 2011. Since the television device in FIG. 20B is a wall-hanging type, it does not require a large installation space.

Naturally, the invention is not limited to the television device, and can be applied to various use applications; e.g., a large-area display medium such as an information display board in a train station, an airport, or the like, or an advertisement display board on the street, as well as a monitor of a personal computer.

Embodiment 11

Following the invention, various kinds of display devices can be manufactured. In other words, the invention can be applied to various kinds of electronic devices in which such display devices are incorporated in display portions.

Examples of such electronic devices can be as follows: a video camera, a digital camera, a projector, a head-mounted display (a goggle type display), a car navigation system, a mobile stereo, a personal computer, a game machine, a portable information terminal (such as a mobile computer, a cellular phone, or an electronic book), an image reproducing device provided with a recording medium (specifically, a device which can reproduce the recording medium such as a digital versatile disc (DVD) and includes a display portion capable of displaying images thereof), and the like. Specific examples thereof are shown in FIGS. 22A to 22D.

Figure 22A:
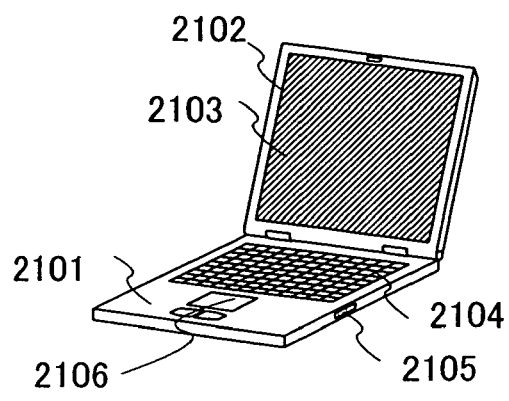
FIGS. 22A to 22D show electronic devices to which the present invention is applied.

FIG. 22A shows a personal computer, which includes a main body 2101, a chassis 2102, a display portion 2103, a keyboard 2104, an external connection port 2105, a pointing mouse 2106, or the like. The invention is applied to manufacturing of the display portion 2103. In accordance with the invention, a highly reliable personal computer which can display a high-quality image can be manufactured even if the personal computer is miniaturized and a wiring or the like is formed precisely.

Figure 22B:
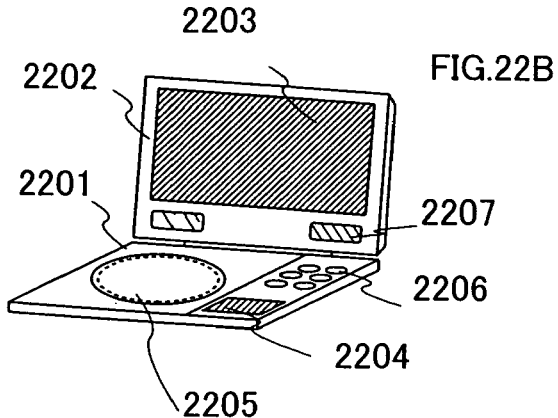

FIG. 22B shows an image reproducing device (specifically, a DVD reproducing device) including a recording medium, which includes a main body 2201, a chassis 2202, a display portion A 2203, a display portion B 2204, a recording medium (a DVD or the like) reading portion 2205, an operation key 2206, a speaker portion 2207, or the like. The display portion A 2203 mainly displays image information, and the display portion B 2204 mainly displays character information. The invention is applied to manufacturing of these display portion A 2203 and display portion B 2204. In accordance with the invention, a highly reliable image reproducing device which can display a high-quality image can be manufactured even if the image reproducing device is miniaturized and a wiring or the like is formed precisely.

Figure 22C:
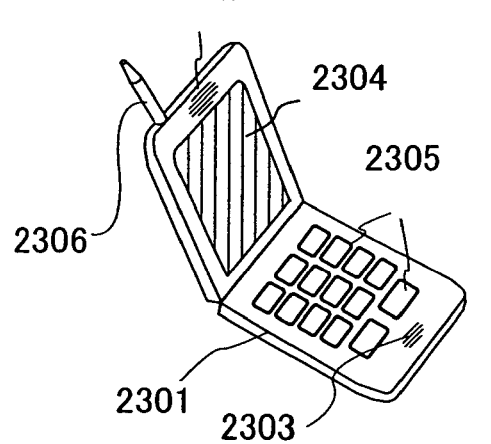

FIG. 22C shows a cellular phone, which includes a main body 2301, an audio output portion 2302, an audio input portion 2303, a display portion 2304, an operation switch 2305, an antenna 2306, or the like. By applying the display device manufactured using the present invention to the display portion 2304, a highly reliable cellular phone which can display a high-quality image can be manufactured even if the cellular phone is miniaturized and a wiring or the like is formed precisely.

Figure 22D:
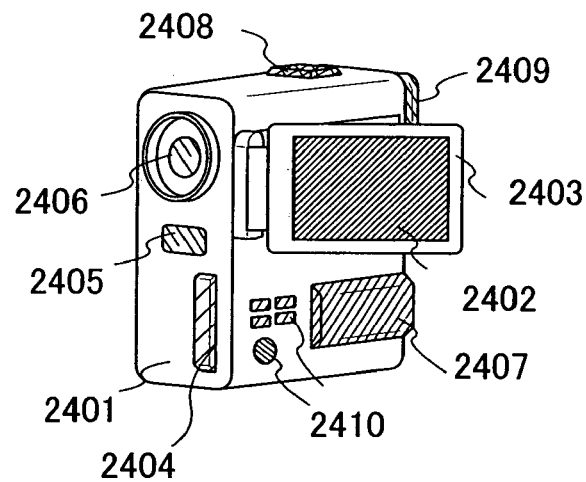

FIG. 22D shows a video camera, which includes a main body 2401, a display portion 2402, a chassis 2403, an external connection port 2404, a remote control receiver 2405, an image receiving portion 2406, a battery 2407, an audio input portion 2408, an eye piece portion 2409, operation keys 2410, or the like. The invention can be applied to manufacturing of the display portion 2402. By applying the display device manufactured using the invention to the display portion 2402, a highly reliable video camera which can display a high-quality image can be manufactured even if the video camera is miniaturized and a wiring or the like is formed precisely. This embodiment can be freely combined with the above described embodiment.

Embodiment 12

In accordance with the present invention, a semiconductor device functioning as a chip including a processor circuit (also referred to as a wireless chip, a wireless processor, a wireless memory, and a wireless tag) can be formed. The usage of the semiconductor device of the invention is wide-ranging. For example, the semiconductor device of the invention can be used when provided in paper money, coins, securities, certificates, bearer bonds, packing containers, books, recording media, personal belongings, vehicles, food, clothing, health products, commodities, medicine, electronic devices, and the like.

Figure 28A:
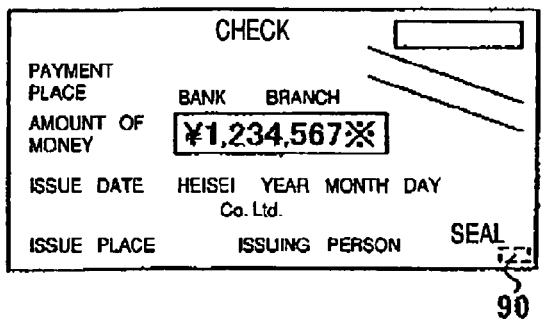
FIGS. 28A to 28G show a semiconductor device to which the present invention is applied.
Figure 28B:
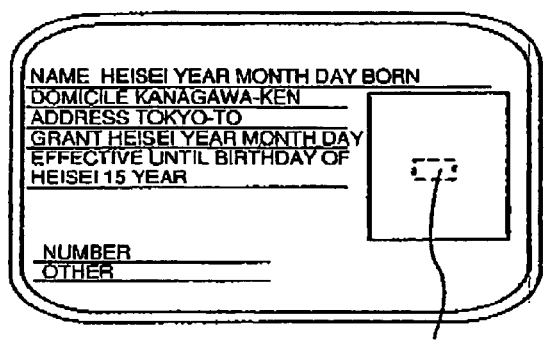
Figure 28C:
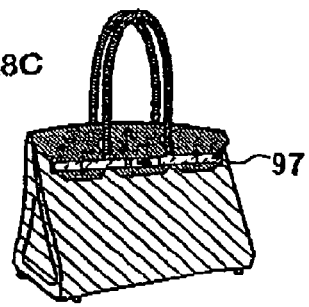
Figure 28D:
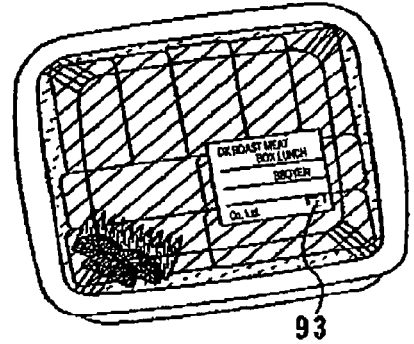
Figure 28E:
Figure 28F:
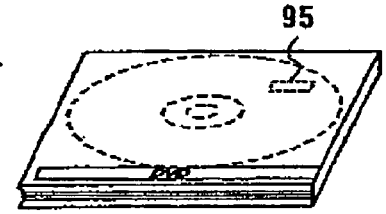
Figure 28G:
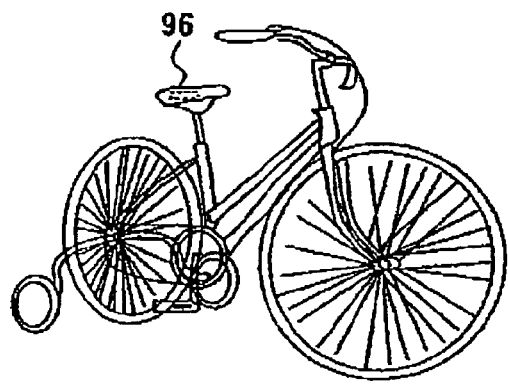

Paper money and coins are money distributed to the market and include ones valid in a certain area (cash voucher), memorial coins, and the like. Securities include checks, certificates, promissory notes, and the like, and can be provided with a chip 90 including a processor circuit (see FIG. 28A). Certificates include driver's licenses, certificates of residence, and the like, and can be provided with a chip 91 including a processor circuit (see FIG. 28B). Personal belongings include bags, glasses, and the like, and can be provided with a chip 97 including a processor circuit (see FIG. 28C). Bearer bonds include stamps, rice coupons, various gift certificates, and the like. Packing containers include wrapping paper for food containers and the like, plastic bottles, and the like, and can be provided with a chip 93 including a processor circuit (see FIG. 28D). Books include hardbacks, paperbacks, and the like, and can be provided with a chip 94 including a processor circuit (see FIG. 28E). Recording media include DVD software, video tapes, and the like, and can be provided with a chip 95 including a processor circuit (see FIG. 28F). Vehicles include wheeled vehicles such as bicycles, ships, and the like, and can be provided with a chip 96 including a processor circuit (see FIG. 28G). Food includes food articles, drink, and the like. Clothing include clothes, footwear, and the like. Health products include medical instruments, health instruments, and the like. Commodities include furniture, lighting equipment, and the like. Medicine includes medical products, pesticides, and the like. Electronic devices include liquid crystal display devices, EL display devices, television devices (TV sets and flat-screen TV sets), cellular phones, and the like.

Forgery can be prevented by providing a chip including a processor circuit in paper money, coins, securities, certificates, bearer bonds, or the like. The efficiency of an inspection system or a system used in a rental shop can be improved by providing a chip including a processor circuit in packing containers, books, recording media, personal belonging, food, commodities, electronic devices, or the like. By providing a chip including a processor circuit in vehicles, health products, medicines, or the like, forgery or theft can be prevented; further, medicine can be prevented from being taken mistakenly. The chip including a processor circuit is provided in the foregoing article by attaching it to the surface or embedding it therein. For example, in the case of a book, the chip including a processor circuit may be embedded in a piece of paper; in the case of a package made from an organic resin, the chip including a processor circuit may be embedded in the organic resin.

The system can have high functionality by applying the chip including a processor circuit formed in accordance with the present invention to a management system or a distribution system of articles. For example, information that is recorded in a chip including a processor circuit provided in a tag is read by a reader/writer provided beside a conveyor belt, information about a distribution process or a delivery destination is then read out, and inspection of merchandise or distribution of goods can be easily performed.

Figure 29:
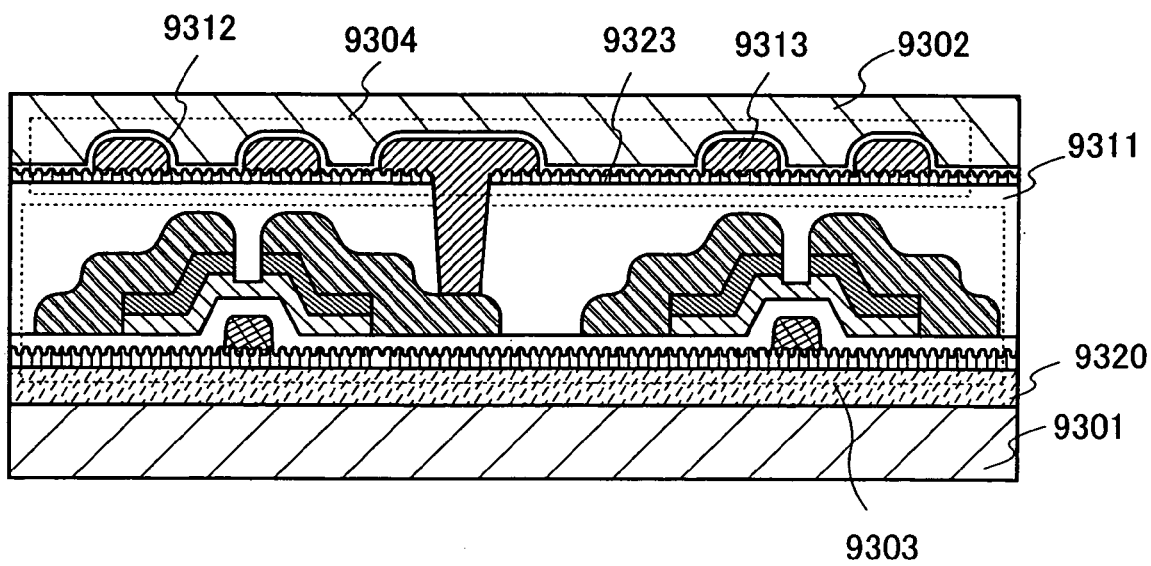
FIG. 29 shows a semiconductor device to which the present invention is applied.

A structure of a chip including a processor circuit which can be formed in accordance with the present invention is explained with reference to FIG. 29. The chip including a processor circuit is formed with a thin film integrated circuit 9303 and an antenna 9304 connected to the thin film integrated circuit 9303. The thin film integrated circuit 9303 and the antenna 9304 are interposed between cover materials 9301 and 9302. The thin film integrated circuit 9303 may be attached to the cover material 9301 using an adhesive. In FIG. 29, one side of the thin film integrated circuit 9303 is attached to the cover material 9301 with an adhesive 9320 interposed therebetween.

The thin film integrated circuit 9303 is formed in the same manner as the TFT described in any one of the above embodiments, peeled in a known peeling step, and then provided over a cover material. A layer having a rough surface is formed below a TFT of the thin film integrated circuit 9303 to more effectively control wettability of a formation region at the time of forming a gate electrode layer by a droplet discharge method. The antenna 9304 is also provided over a layer 9323 having a rough surface to more effectively control wettability of a formation region at the time of forming a wiring layer 9313. A semiconductor element used in the thin film integrated circuit 9303 is not limited to the above-described element. For example, a memory element, a diode, a photoelectric conversion element, a resistor element, a coil, a capacitor element, an inductor, or the like can be used as well as the TFT.

As shown in FIG. 29, an interlayer insulating layer 9311 is formed over the TFT of the thin film integrated circuit 9303, and an antenna 9304 connecting to the TFT is formed with the interlayer insulating layer 9311 interposed therebetween. Further, a barrier film 9312 made of a silicon nitride film or the like is formed over the interlayer insulating film 9311 and the antenna 9304.

The antenna 9304 is formed by discharging a droplet including a conductor such as gold, silver, or copper by a droplet discharge method, and drying and baking the droplet.

By forming the antenna by a droplet discharge method, the number of steps can be reduced, and accordingly, cost can also be reduced.

For the cover materials 9301 and 9302, it is preferable to use a film (made of polypropylene, polyester, vinyl, polyvinyl fluoride, vinyl chloride, or the like), paper made of a fibrous material, a laminated film of a base material film (polyester, polyamide, an inorganic evaporation film, a variety of paper, or the like) and an adhesive synthetic resin film (an acrylic-based synthetic resin, an epoxy-based synthetic resin, or the like), or the like. The film is subjected to treatment for attachment to an object to be treated by thermocompression. When the film is subjected to the treatment, the film is attached to the object by melting an adhesion layer provided on a top surface of the film or a layer provided in an outmost layer (not the adhesion layer) through heat treatment and by applying pressure.

By using an incinerable pollution-free material such as paper, a fiber, carbon graphite, or the like for the cover material, a used chip including a processor circuit can be incinerated or cut out. The chip including a processor circuit using the above material is pollution-free since it does not generate a poisonous gas when incinerated.

In FIG. 29, the chip including a processor circuit is provided over the cover material 9301 with the adhesive 9320; however, the chip including a processor circuit may be attached to an article instead of to the cover material 9301.

EXAMPLE 1

In this example, a layer having a rough surface is formed, and results of measuring contact angles of water on the surface.

A sample of a layer having two kinds of rough surfaces having different uneven surface shapes was manufactured. In addition, a sample (Sample 1) in which an FAS film is directly formed over a glass substrate without forming a layer having a rough surface was also manufactured as a comparative example. A glass substrate is coated with a solution containing nanoparticles of titanium oxide to disperse the nanoparticles of titanium oxide over the substrate. A solvent is dried by baking to fix the nanoparticles of titanium oxide over the substrate. Since the nanoparticles of titanium oxide exist over the substrate in a dispersed state, the substrate has a rough surface having unevenness caused by the nanoparticles of titanium oxide. FAS is formed over the rough surface caused by this nanoparticles of titanium oxide to manufacture Sample 2. Like Sample 2, the layer having a rough surface may be dispersed particulate materials and may not have continuity as a film to form a rough surface.

As Sample 3, a layer having a rough surface is formed using aluminum oxide ($Al_2O_3$) (also referred to as alumina). An $Al_2O_3$ sol-gel solution is prepared. As to the $Al_2O_3$ sol-gel solution, 10 g of isopropyl alcohol (IPA) and 2.46 g of aluminum-sec-butoxide are mixed and stirred for one hour. Ethyl acetate is added to the mixture and they are further stirred for three hours, and mixed with 2 g of IPA and 0.72 g of water to prepare the $Al_2O_3$ sol-gel solution. A glass substrate is coated with the $Al_2O_3$ sol-gel solution by a spin-coating method and soaked in hot water at 60° C. for 20 minutes. With the above steps, the surface of $Al_2O_3$ becomes an uneven shape to be roughened. FAS is formed over the layer having a rough surface using $Al_2O_3$ to manufacture Sample 3.

Figure 31:
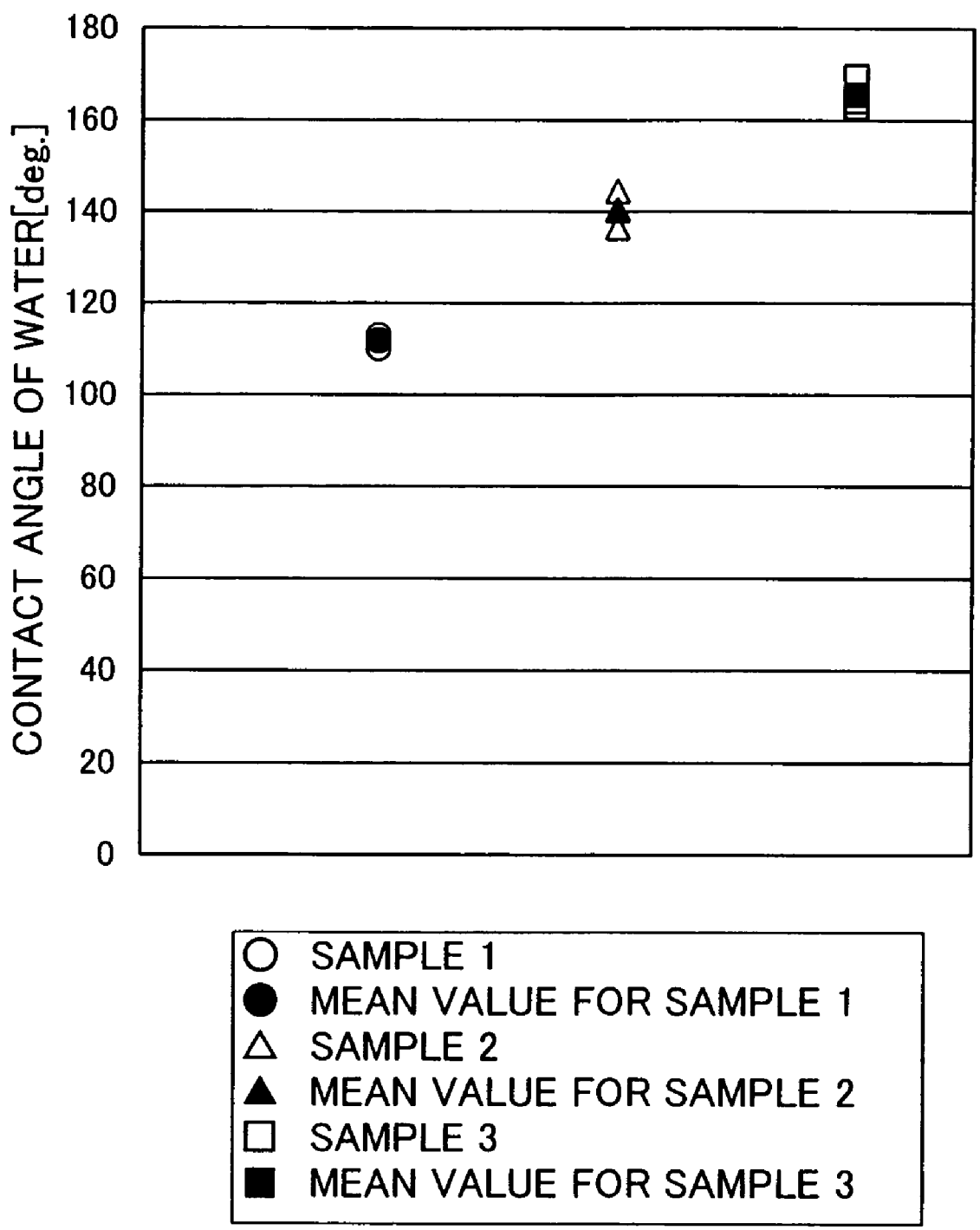
FIG. 31 shows experimental data of a sample manufactured in Example 1.

Contact angles of water on the surfaces of the prepared Samples 1 to 3 were measured at three spots of each sample. Table 1 and FIG. 31 show contact angles of water in Regions 1 to 3 and mean values of Regions 1 to 3 in each sample. In FIG. 31, white circles represent contact angles in Regions 1 to 3 of Sample 1 and a black circle represents a mean value of the contact angles. Similarly, white triangles represent contact angles in Regions 1 to 3 of Sample 2 and a black triangle represents a mean value of the contact angles of Sample 2. Further, white squares represent contact angles in Regions 1 to 3 of Sample 3 and a black square represents a mean value of the contact angles of Sample 3.

TABLE 1

| CONTACT ANGLE | SAMPLE 1 (deg.) | SAMPLE 2 (deg.) | SAMPLE 3 (deg.) |
|---|---|---|---|
| ① | 110 | 136.5 | 163 |
| ② | 113 | 144.5 | 169.5 |
| ③ | 112 | 140.3 | 164.19 |
| MEAN VALUE | 111.7 | 140.4 | 165.6 |

It can be confirmed that contact angles of water on the surfaces of Samples 2 and 3, in which FAS is formed over the layer having a rough surface, are larger than that on Sample 1, in which FAS is formed over the glass substrate having high planarity without unevenness. In particular, Sample 3, in which FAS is formed over the layer having a rough surface using $Al_2O_3$, has a markedly uneven surface shape and a rougher surface (also referred to as a flowerlike film). Therefore, a contact angle of water on Sample 3 is 160° or more, and Sample 3 has extremely low wettability by water (it has a so-called superhydrophobic surface).

The above results show that, by forming a material having low wettability over a roughened surface having an uneven shape, surface wettability can be lowered by a surface-area increasing effect due to the uneven shape. In a non-formation region of the material having low wettability, the uneven shape and the surface-area increasing effect of the rough surface serve to further heighten wettability. Therefore, two kinds of regions having a large difference in wettability can be formed by selectively forming a material having low wettability. The difference in wettability can be used to form a conductive layer or an insulating layer in a desired shape with good precision using a liquid conductive or insulating material. Thus, a high-performance and high-reliability semiconductor device or display device can be manufactured with high yield.

EXAMPLE 2

In this example, a layer having a rough surface was formed and surface roughness thereof was evaluated.

Three kinds of samples, each including a layer having a rough surface which is manufactured similarly as Sample 3 in Example 1 by coating a glass substrate with an $Al_2O_3$ sol-gel solution by a spin-coating method and soaking in hot water, were manufactured by changing soaking time in hot water. Samples 4 to 6 were manufactured by being not soaked in hot water (hot water soaking time: 0 minute), being soaked for four minutes, and being soaked for twenty minutes, respectively. Surface states of these samples were evaluated.

Measurement was performed using an atomic force microscope (AFM) in the range of 5 μm×5 μm. Measurement results are shown in Table 2 and FIGS. 32A to 32D. FIGS. 32A to 32D show relationships between sample soaking time in hot water, and average surface roughness (which is extended to three dimensions so that center line average roughness defined by JIS B0601 can be applied to a plane: see FIG. 32A), a maximum height difference of unevenness on the surfaces (see FIG. 32B), root mean square roughness (which is root-mean-square surface unevenness: see FIG. 32C), and a surface area ratio (a ratio, to an area of a given region, of a total surface area including a surface area of an uneven shape in a given region: see FIG. 32D) on the surfaces of the samples, respectively. In Table 2 and FIGS. 32A to 32D, measurement results of samples whose soaking time in hot water is 0 minute, 4 minutes, and 20 minutes correspond to those of Samples 4 to 6, respectively.

TABLE 2

| HOT WATER SOAKING TIME (min) | AVERAGE SURFACE ROUGH-NESS (nm) | MAXIMUM HEIGHT DIFFERENCE (nm) | ROOT MEAN SQUARE ROUGH-NESS (nm) | SURFACE AREA RATIO |
|---|---|---|---|---|
| 0 | 4.791E−01 | 4.861E+00 | 6.017E−01 | 1.002E+00 |
| 4 | 2.054E+01 | 1.978E+02 | 2.558E+01 | 1.329E+00 |
| 20 | 3.200E+01 | 3.302E+02 | 4.011E+01 | 1.506E+00 |

Figure 32A:
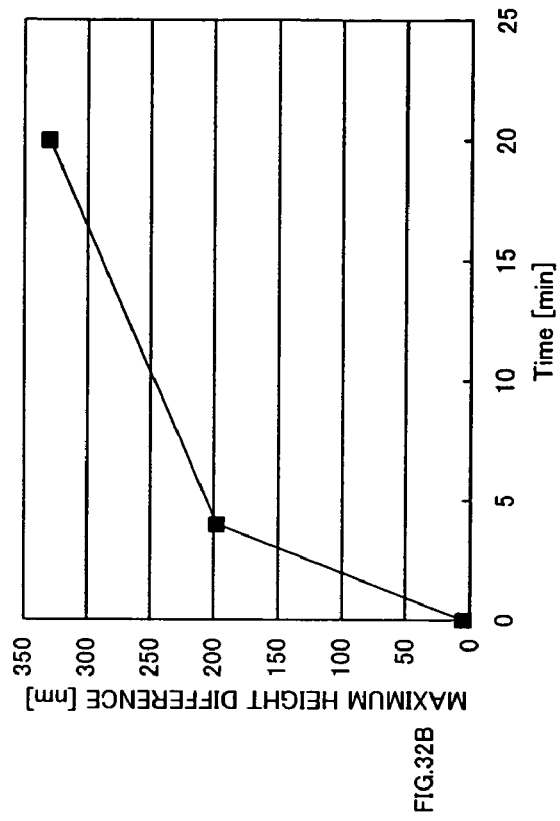
FIGS. 32A to 32D show experimental data of a sample manufactured in Example 2.
Figure 32B:
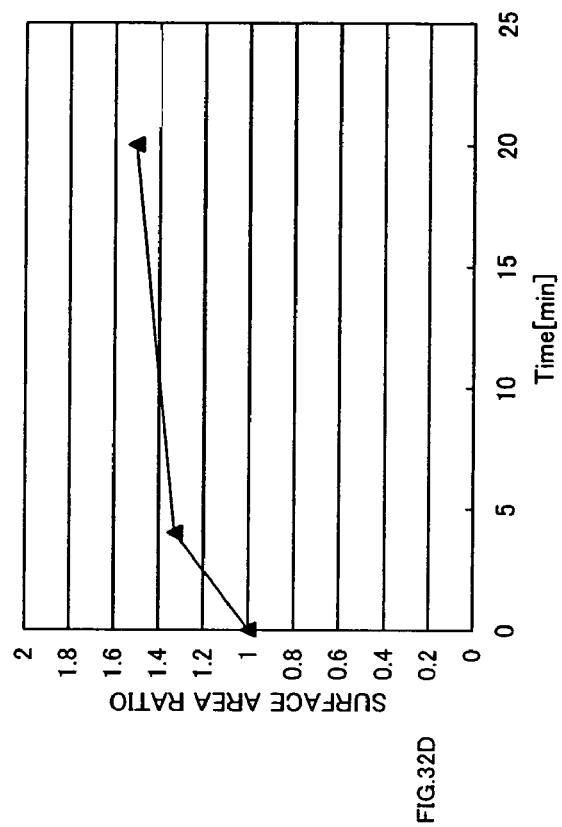
Figure 32C:
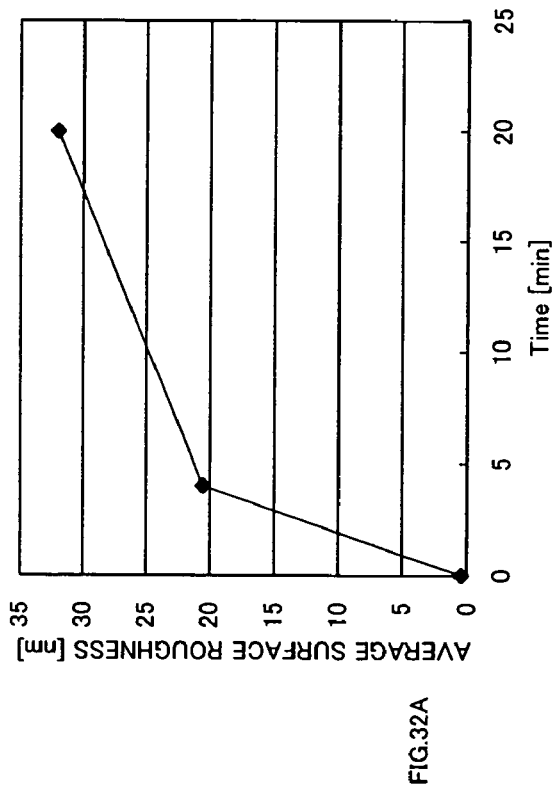
Figure 32D:
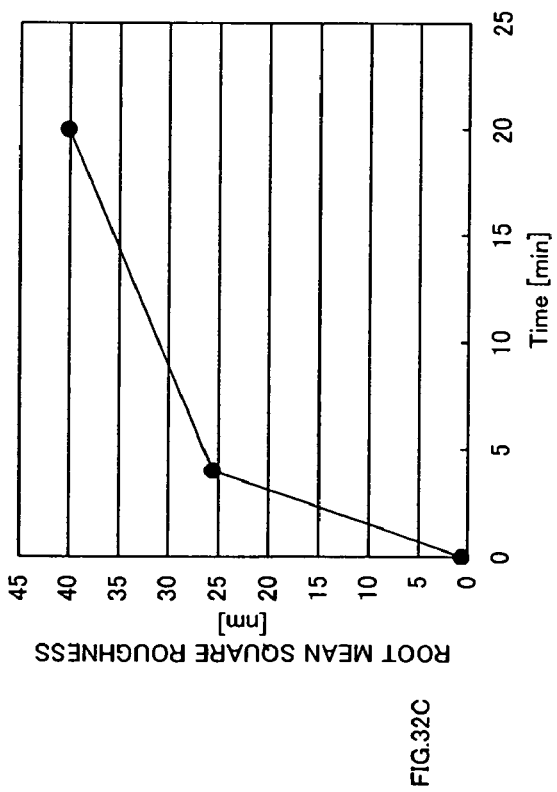

As shown in FIGS. 32A to 32C, mean surface roughness, a maximum height difference, and root-mean-square surface roughness are all increased as the soaking time in hot water is extended. Accordingly, it can be confirmed that, with an extension of soaking time in hot water, roughening of the sample surface proceeds and the surface is in a more roughened state. This can also be confirmed by a change in the surface area ratio shown in FIG. 32D, and the surface area ratio is increased with an extension of soaking time in hot water. It is thought that this is because surface roughness becomes high and a surface area is increased by an uneven shape.

Figure 34:
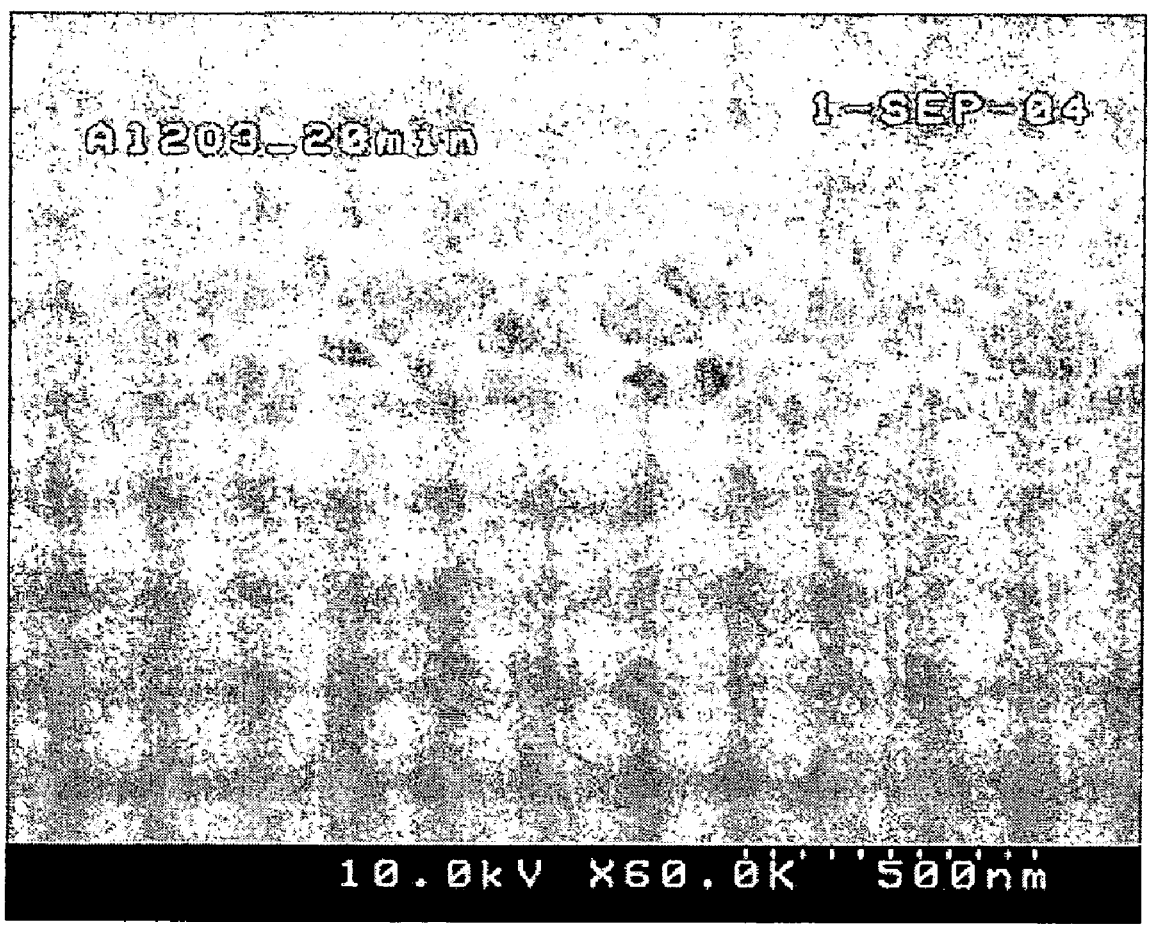
FIG. 34 shows experimental data of a sample manufactured in Example 2.

FIG. 34 shows a STEM photograph of the surface of the $Al_2O_3$ film in Sample 6, which is observed by a scanning transmission electron microscopy (STEM) method. As shown in FIG. 34, the surface of the $Al_2O_3$ film in Sample 6 has a flowerlike uneven shape.

Figure 33:
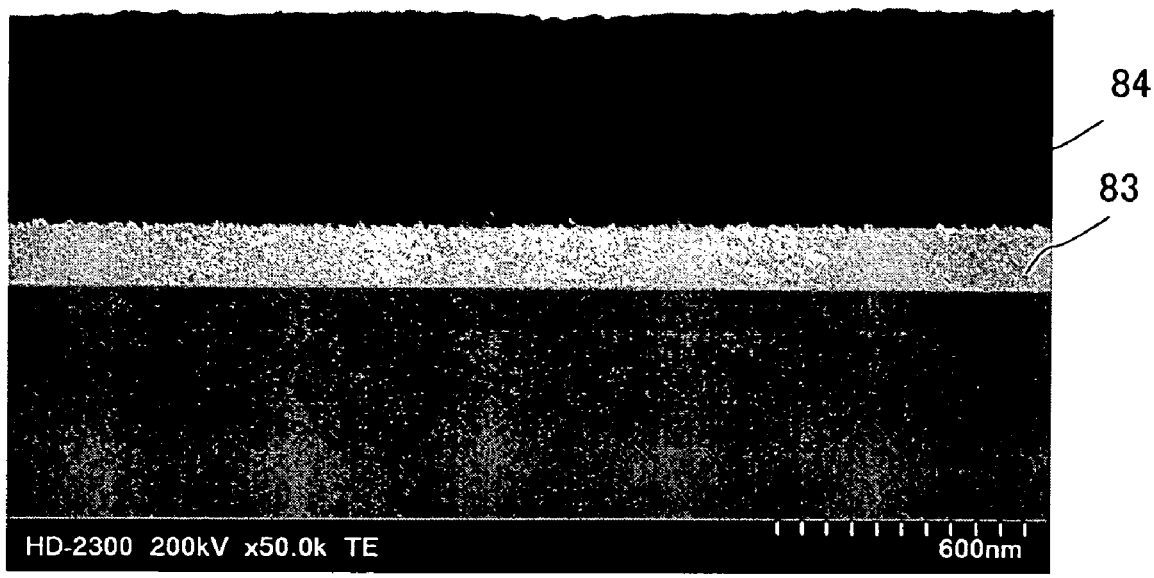
FIG. 33 shows experimental data of a sample manufactured in Example 2.

A liquid composition containing a conductive material, in which silver is used as a conductive material, is discharged to an $Al_2O_3$ film whose soaking time in hot water is 20 minutes like Sample 6 and baked at 230° C. for one hour to manufacture Sample 7. A cross section of Sample 7 was observed by a STEM method. A STEM photograph thereof is shown in FIG. 33. A layer which looks white is a layer 83 having a flowerlike uneven shape and a rough surface ($Al_2O_3$ layer), and a black layer thereabove is a conductive layer 84 (Ag layer).

The thusly manufactured layer having a rough surface can significantly change wettability of a material formed over the layer as described in Example 1. Accordingly, a material having low wettability becomes a further low wettability region and a material having high wettability becomes a further high wettability region. Thus, regions having a large difference in wettability can be selectively formed. The difference in wettability can be utilized to form a conductive layer or an insulating layer in a desired shape with good precision using a liquid conductive or insulating material. Thus, a high-performance and high-reliability semiconductor device or display device can be manufactured with high yield.

What is claimed is:

1. A method for manufacturing a semiconductor device, comprising:
    forming a layer having a rough surface;
    forming a first region and a second region over the rough surface wherein the second region has higher wettability with respect to a composition containing a conductive material than the first region; and
    forming a conductive layer using a droplet of the composition in the second region
    wherein a ratio between the rough surface including an uneven shape to a rough surface region excluding an increase in surface area due to an uneven shape is 1.5 or more.

2. A method for manufacturing a semiconductor device, comprising:
    forming a layer having a rough surface;
    forming a material having a fluorocarbon group over the layer having the rough surface;
    selectively irradiating the material having a fluorocarbon group with light to form a first region and a second region which has higher wettability with respect to a composition containing a conductive material than the first region; and
    forming a conductive layer using a droplet of the composition in the second region,
    wherein a ratio between the rough surface including an uneven shape to a rough surface region excluding an increase in surface area due to an uneven shape is 1.5 or more.

3. The method according to claim 2 further comprising:
    coating a glass substrate with an $Al_2O_3$ sol-gel solution by a spin-coating method; and
    soaking the substrate with the $Al_2O_3$ in water to form the layer having the rough surface.

4. A method for manufacturing a semiconductor device, comprising:
    forming a layer having a rough surface;
    selectively forming a mask layer over the layer having a rough surface;
    forming a material having a fluorocarbon group over the layer having a rough surface and the mask layer;
    removing the mask layer and the material having a fluorocarbon group over the mask layer to form a first region and a second region which has higher wettability with respect to a composition containing a conductive material than the first region; and
    forming a conductive layer using a droplet of the composition in the second region,
    wherein a ratio between the rough surface including an uneven shape to a rough surface region excluding an increase in surface area due to an uneven shape is 1.5 or more.

5. The method according to claim 4 further comprising:
    coating a glass substrate with an $Al_2O_3$ sol-gel solution by a spin-coating method; and
    soaking the substrate with the $Al_2O_3$ in water to form the layer having the rough surface.

6. A method for manufacturing a semiconductor device, comprising:
    forming a layer having a rough surface;
    forming a material containing a silane coupling agent over the layer having a rough surface;
    selectively irradiating the material containing a silane coupling agent with light to form a first region and a second region which has higher wettability with respect to a composition containing a conductive material than the first region; and
    forming a conductive layer using a droplet of the composition in the second region,
    wherein a ratio between the rough surface including an uneven shape to a rough surface region excluding an increase in surface area due to an uneven shape is 1.5 or more.

7. A method according to claim 6, wherein the silane coupling agent has an alkyl group.

8. The method according to claim 6, wherein the material containing a silane coupling agent further has a fluorocarbon group.

9. The method according to claim 6 further comprising:
coating a glass substrate with an $Al_2O_3$ sol-gel solution by a spin-coating method; and
soaking the substrate with the $Al_2O_3$ in water to form the layer having the rough surface.

10. A method for manufacturing a semiconductor device, comprising:
forming a layer having a rough surface;
selectively forming a mask layer over the layer having a rough surface;
forming a material containing a silane coupling agent over the layer having a rough surface and the mask layer;
removing the mask layer and the material containing a silane coupling agent over the mask layer to form a first region and a second region which has higher wettability with respect to a composition containing a conductive material than the first region; and
forming a conductive layer using a droplet of the composition in the second region,
wherein a ratio between the rough surface including an uneven shape to a rough surface region excluding an increase in surface area due to an uneven shape is 1.5 or more.

11. A method according to claim 10, wherein the silane coupling agent has an alkyl group.

12. The method according to claim 10 further comprising:
coating a glass substrate with an $Al_2O_3$ sol-gel solution by a spin-coating method; and
soaking the substrate with the $Al_2O_3$ in water to form the layer having the rough surface.

* * * * *